US007209593B2

(12) United States Patent
Kimura et al.

(10) Patent No.: US 7,209,593 B2
(45) Date of Patent: Apr. 24, 2007

(54) APPARATUS, METHOD, AND PROGRAMS FOR ARITHMETIC ENCODING AND DECODING

(75) Inventors: Tomohiro Kimura, Tokyo (JP); Masayuki Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 756 days.

(21) Appl. No.: 10/320,610

(22) Filed: Dec. 17, 2002

(65) Prior Publication Data

US 2003/0113030 A1   Jun. 19, 2003

(30) Foreign Application Priority Data

Dec. 18, 2001 (JP) ............................. 2001-384809

(51) Int. Cl.
*G06K 9/36* (2006.01)
*G06K 9/46* (2006.01)

(52) U.S. Cl. ..................................... 382/247
(58) Field of Classification Search ................. 382/247
See application file for complete search history.

(56) References Cited

U.S. PATENT DOCUMENTS

| 4,891,643 | A | * | 1/1990 | Mitchell et al. | ............ 341/107 |
| 4,905,297 | A | * | 2/1990 | Langdon et al. | ............ 382/247 |
| 5,059,976 | A | | 10/1991 | Ono et al. | |
| 5,307,062 | A | | 4/1994 | Ono et al. | |
| 5,404,140 | A | | 4/1995 | Ono et al. | |

| RE35,781 | E | 5/1998 | Ono et al. |

(Continued)

FOREIGN PATENT DOCUMENTS

JP          06-85687         3/1994

(Continued)

OTHER PUBLICATIONS

Linh Huynh and Alistair Moffat, "A Probability-Ratio Approach to Approximate Binary Arithmetic Coding", IEEE Trans. Information Theory, vol. 43, No. 5, Sep. 1997, pp. 1658-1662.*

(Continued)

*Primary Examiner*—Wenpeng Chen
*Assistant Examiner*—Yuzhen Ge
(74) *Attorney, Agent, or Firm*—Birch, Stewart, Kolasch & Birch, LLP

(57) ABSTRACT

The present invention aims to increase an encoding efficiency when the occurrence probability of LPS (less probable symbol) is low. An encoding apparatus has a interval size (A), a interval limit value (C), divides a set interval which is set on a number line, selects a sub-interval corresponding to an occurring symbol, updates the interval size (A) and the interval limit value (C) with a limited precision based on the selected sub-interval size, and encodes a coordinate within the interval. Based on the probability (the occurrence probability of symbol) output from a learning memory, the sub-interval size (LSZ, dLSZ) and the sub-interval limit value are obtained. A correction value calculator computes the correction value based on the dLSZ, reflects the computed correction value (dA, dC) to the renormalized subinterval size (rA) and the renormalized sub-interval limit value (rC), updates the interval size (A7) to the sub-interval size, updates the interval limit value (C8) to the sub-interval limit value, and outputs a code.

12 Claims, 31 Drawing Sheets

U.S. PATENT DOCUMENTS

| | | | |
|---|---|---|---|
| 5,991,449 A * | 11/1999 | Kimura et al. | 382/238 |
| 6,058,216 A | 5/2000 | Endo et al. | |
| 6,075,471 A * | 6/2000 | Kimura et al. | 341/107 |
| 6,188,334 B1 * | 2/2001 | Bengio et al. | 341/51 |
| 6,188,793 B1 * | 2/2001 | Kimura et al. | 382/238 |
| 6,225,925 B1 * | 5/2001 | Bengio et al. | 341/107 |
| 6,327,383 B2 * | 12/2001 | Todoroki | 382/166 |
| 6,489,903 B2 * | 12/2002 | Kimura et al. | 341/107 |
| 6,760,129 B1 * | 7/2004 | Krishnamachari | 358/474 |
| 2002/0076113 A1 * | 6/2002 | Kondo | 382/247 |

FOREIGN PATENT DOCUMENTS

| | | |
|---|---|---|
| JP | 08-034432 B2 | 3/1996 |
| JP | 08-034434 B2 | 3/1996 |
| JP | 08242175 | 9/1996 |

OTHER PUBLICATIONS

Bell, Timothy C., "Text Compression", Chapter 5, Prentice Hall, pp. 100-121, (1990).

"Terminal Equipment and Protocols for Telematic Services", ITU-T Recommendation T.82, pp. 26-45, (1993).

CCITT "Terminal Equipment and Protocols for Telematic Services", ITU-T Recommendation T.81, Annex D—Arithmetic Coding, Sep. 1992.

Fumitaka Ono and Tomohiro Kimura, "A Carry Propagation Control Method with Less Loss Bit for the Arithmetic Coders" The Transactions of the Institute of Electronics, Information and Communication Engineers, vol. J84-A No. 3, pp. 414-446 (2001).

* cited by examiner

APPARATUS, METHOD, AND PROGRAMS FOR ARITHMETIC ENCODING AND DECODING

BACKGROUND OF THE INVENTION

1. Field of the Invention

The present invention relates to an encoding method, a decoding method, an encoding/decoding method, and an apparatus installing these methods for implementing an efficient encoding/decoding of information source data and generated code data.

2. Description of the Related Art

Related Art 1.

As a known technique for effectively encoding (compress) information source data, an arithmetic coding has been recently adopted by International Standard Encoding System (JBIG (Joint Bi-level ImageExperts Group) and JPEG (Joint Photographic Experts Group)). An example of the International Standard Arithmetic Coding System is a QM-Coder which is discussed in ITU-T Recommendation T.82 (JBIG) and T.81 (JPEG).

The principle of the arithmetic coding is that a range of equal or greater than 0.0 . . . 0 and less than 1.0 . . . 0 is reflexively divided into subintervals with regularity based on occurrence probability of individual data and a value of a fraction within the sub-interval corresponding to a sequence of occurring data to be encoded is output as a code. In the arithmetic decoding, a reflexive division of the interval is performed with the same regularity as the coding, and a sequence corresponding to the sub-interval including the code value is output as decoded data. Hereinafter, the data to be encoded is assumed to be binary (0 and 1).

In an encoding method adopting prediction, the data to be encoded is not a data value itself, but is binary symbol which shows a match/mismatch of the prediction value. Hereinafter, a symbol showing a match is referred to as an MPS (More Probable Symbol) (value 0), and a symbol showing a mismatch is referred to as an LPS (Less Probable Symbol) (value 1). The data value which is more probable to occur is learned and held as a prediction value. Accordingly, the MPS occurs with a probability of equal to or greater than 0.5, and the LPS occurs with a probability of equal to or less than 0.5.

A concept of interval division of the arithmetic coding is shown in FIG. 23.

A procedure for the arithmetic coding of a certain symbol to be encoded can be shown as FIG. 24, where a size of a current interval is A, a lower limit value of the current interval is C, occurrence probability of a symbol value 1 is P, sub-interval sizes for the symbol values 0, 1 are A0, A1, and a symbol value which actually occurs is X. Initial values for A and C are 1.0 and 0.0, respectively.

For the sub-intervals A0 and A1, the encoding operation become different according to which sub-interval is placed at upper/lower part of the interval. At S1003 through S1005 in the figure, the operation to the upper sub-interval Ah, the lower sub-interval Al, and the symbol Sl corresponding to the lower sub-interval are separately shown for two cases; the left side shows in case of placing the symbol value 0 at the lower part; and the right side shows in case of placing the symbol value 1 at the lower part. At S1006, if the symbol X is the symbol 1 corresponding to the lower sub-interval, the interval A is updated to the lower sub-interval Al at S1007. On the other hand, if the symbol X is not the symbol 1, the interval A is updated to the upper sub-interval Ah at S1008, and at the same time the lower sub-interval size Al is added to the code C which shows the lower interval limit at S1009.

Similarly, in the arithmetic decoding procedure, the code C is updated to the displacement from the lower limit value of the current interval, and if X is the decoding symbol value, the operation can be shown as FIG. 25. The initial value of A is set to 1.0, and the initial value of C is set to the code value obtained by the encoding process.

For the sub-intervals A0 and A1, the decoding operation become different according to which sub-interval is placed at upper/lower part of the interval. At S1103 through S1106 in the figure, the operation to the upper sub-interval Ah, the lower sub-interval Al, the symbol Sh corresponding to the upper sub-interval, and the symbol Sl corresponding to the lower subinterval are separately shown for two cases; the left side shows in case of placing the symbol value 0 at the lower part; and the right side shows in case of placing the symbol value 1 at the lower part. At S1107, if the code value C is less than the lower sub-interval Al, the interval A is updated to the lower sub-interval Al at S1108, and the decoding symbol X is updated to the symbol Sl corresponding to the lower sub-interval at S1109. On the other hand, if the code value C is not less than the lower sub-interval Al, the interval A is updated to the upper sub-interval Ah at S1110, and at the same time the lower sub-interval size Al is subtracted from the code C which shows the lower interval limit at S1111, and the decoding symbol X is updated to the symbol Sh corresponding to the upper sub-interval at S1112.

The decoded data value becomes the same value as the prediction if the decoded symbol value is 0, and becomes a different value (1-prediction value) from the prediction if the decoded symbol value is 1.

In the above interval divisional rule, the information theory can prove that it is the most efficient encoding to divide the interval in proportion with the occurrence probability. The procedure described above is called as multiplication-based arithmetic coding, and the precision for fractional representation is said to be infinite.

The arithmetic coding is performed by binary fraction operation, and the precision for fractional representation, namely, the effective digits of the interval limit value is increased during the process, which makes the implementation of the arithmetic coding difficult. However, the subtraction-based arithmetic coding enables the arithmetic coding to be practiced, in which the high order digits of the fraction whose value does not change during the operation and which is located close to the binary point is truncated from the operation, and a fixed number of effective digits is guaranteed in the operation. According to the subtraction-based arithmetic coding, the multiplication value Al, which is obtained by the multiplication of the interval size A of the multiplication-based arithmetic coding and the occurrence probability value P of LPS, is replaced by an approximate value LSZ of the probability P, the updated interval size A is renormalized, that is, extended by multiplying power of 2 so as to be always equal to or greater than 0.5, and the coding is implemented by shift operation. As for the approximate value LSZ, a suitable value is selected and adopted according to the probability value P from some candidates, and the approximate value LSZ is assigned without referring to the whole interval size A (equal to or greater than 0.5 and equal to or less than 1.0).

FIG. 26 shows a concept of the interval division according to the subtraction-based arithmetic coding.

FIGS. 27 and 28 show the procedure of the subtraction-based arithmetic coding and the subtraction-based arithmetic decoding. At S1201 of the encoding process and S1301 of the decoding process, the approximate value LSZ is assigned to the sub-interval A1 of the symbol value 1.

After the interval size is updated, the interval size A is renormalized, that is, extended by multiplying power of 2 at S1208 and S1211 of the encoding process and S1310 and S1314 of the decoding process, so that the interval size A is always kept equal to or greater than 0.5. If the interval size A which is updated by processing the MPS is equal to or greater than 0.5, the extension for the renormalization is not necessary to be implemented.

While the interval size A is kept equal to or greater than 0.5 and less than 1.0 by the renormalization, since the approximate value LSZ is adopted, the divisional ratio of the sub-intervals A0 and A1 has an error compared with the actual ratio of the probability. For example, when the approximate value LSZ=0.3, in case of the maximum interval size A=1.0 (only initial value) and the minimum value A=0.5, a larger interval than the MPS may be assigned to the LPS of the occurrence probability being equal to or less than 0.5 so that the divisional ratio of the sub-interval Al becomes 0.3, 0.6 as shown in FIG. 29. "Conditional MPS/LPS exchange," in which the MPS is assigned to the LSZ when the LSZ becomes larger than (A-LSZ) such as the above described case, disclosed in the Japanese Patent No. 2128115 (corresponding to the Japanese Examined Patent Publication JP1996-34434) is adopted to ITU-T Recommendation T.82 (JBIG) and T.81 (JPEG), and so on.

When "conditional MPS/LPS exchange" is adopted, the procedure of the subtraction-based arithmetic coding and the subtraction-based arithmetic decoding can be shown as FIGS. 30 and 31. In this case, the subinterval size Al of the symbol value 0 is assumed to be an approximate value LSZ, however, according to the relationship of the size with the sub-interval size A0, finally the sub-interval A0 can be corresponded to the symbol 1, and also the sub-interval A1 can be corresponded to the symbol 0.

In the coding procedure of FIG. 30, from S1406 through S1411 are processes for X=0 (MPS) to update the interval A into a larger sub-interval between the sub-intervals Al and Ah. S1412 through S1417 are processes for X=1 (LPS) to update the interval A into a smaller sub-interval between the sub-intervals Al and Ah.

In the decoding procedure of FIG. 31, S1506 through S1412 are processes for updating the interval A to the lower sub-interval Al, and S1513 through S1521 are processes for updating the interval A to the upper subinterval Ah. If the updated sub-interval is the larger sub-interval, the decoding symbol becomes X=0 (MPS), and if the updated sub-interval is the smaller sub-interval, the decoding symbol becomes X=1 (LPS).

Further, according to the subtraction-based arithmetic coding and the subtraction-based arithmetic decoding, as an example of a method other than the above "conditional MPS/LPS exchange," the Japanese Patent No. JP-2128110 (corresponding to the Japanese Examined Patent Publication No. JP1996-34432) describes a correction method of the sub-interval, in which if the sub-interval size A0 becomes less than 0.5, the sub-interval is corrected to an average value of A0 and 0.5, and the sub-interval size Al should be also corrected.

These correction methods are applied when the interval A is divided into two sub-intervals A0 and A1.

Related Art 2.

In the arithmetic coding, the final code value can be treated as an arbitrary coordinate within the final interval. This is based on a rule to continue decoding by supplying a specific bit pattern of end bits which is deleted to shorten the code length when a code lacks on decoding. The deleted specific bit pattern of end bits is treated by, for example, byte unit, and usually one of byte 0x00 and 0xFF. In the above-mentioned International Standard Encoding Recommendation T.82, a repetition of byte 0x00 is applied.

Here, it is impossible to detect the end of decoding based on the code length as discussed above, and it is necessary to previously notify the number of symbols or lines to be decoded as long as the data to be decoded has not a fixed length. If a previous notification cannot be done, the notification should be made by inserting a marker segment, etc. into the code before the end of decoding.

The marker segment includes an escape byte (0xFF), an identification byte, and its additional information, if it is required. Here, in order that the same value as the marker segment should not occur within the code on encoding, it is prevented to generated the identification byte by inserting a bit or a byte for control directly after the escape byte when the escape byte occurs within the code. The bit or byte for control is deleted on decoding to obtain the original code value.

According to "Text compression" (Text compression/ Timothy C. Bell, John G. Cleary, Ian H. Witten., 1990), another symbol is employed to show an end exclusively to always keep a sub-interval of the minimum interval size, and the symbol is encoded on completion of encoding, and a coordinate within the sub-interval is selected as a code to notify the end of decoding.

To encode the end symbol means to encode the final symbol, and symbols prior to the final symbol, the sub-interval for the end symbol for each encoding of the symbol is always truncated.

SUMMARY OF THE INVENTION

According to the conventional arithmetic coding implementing with a limited precision, renormalization should be performed to keep a predetermined level of operational precision. However, an effective number of digits are temporarily reduced at the point of renormalization, and there is a problem that the precision cannot be effectively used.

Further, according to the conventional arithmetic coding, the decoding cannot be ended without notifying additional information, etc. if the total number of symbols of the processed sequences cannot be shared previously. This increases the code length by appending the additional information to be notified.

Further, in order to set the exclusive symbol to show the end of encoding, it is necessary to always assign a interval which cannot be assigned to any sub-interval, which decreases performance of the encoding.

The present invention aims to improve an encoding efficiency by sufficiently exploiting the precision when the interval is updated to the subinterval which is obtained based on the occurrence probability of the symbol when the occurrence probability of the LPS is low.

Further, the present invention aims to improve an encoding efficiency by sufficiently exploiting the precision when the interval is updated to the sub-interval which is obtained based on the occurrence probability of the symbol and has a smaller size than the other sub-intervals.

Yet further, the invention aims to provide encoding/ decoding applicable to multiple synchronous encoding/decoding procedure by setting a minute sub-interval which does not belong to any sub-interval, setting a code value inside the minute sub-interval, making the size of the truncated interval smaller than the one in case of setting the exclusive end symbol, and enabling to notify the end of the encoding without increasing the code length.

According to the present invention, in an encoding apparatus for storing a interval size and a interval limit value, dividing a set interval set on a number line, selecting a sub-interval corresponding to an occurring symbol, updating the set interval to the sub-interval selected, and based on the sub-interval selected, updating the interval size and the interval limit value with a limited precision, and encoding a coordinate within the interval, the interval size and the interval limit value are corrected whenever the symbol is encoded.

The encoding apparatus of the invention includes:

a probability learning unit for learning occurrence probability of the symbol and storing the occurrence probability of the symbol learned in a storage area;

a sub-interval computing unit for obtaining a sub-interval size using the occurrence probability of the symbol stored at the probability learning unit, and for computing a sub-interval limit value corresponding to the subinterval size;

a first renormalizing unit for renormalizing the sub-interval size so that the sub-interval size obtained at the sub-interval computing unit should keep equal to or greater than a predetermined value;

a second renormalizing unit for renormalizing the sub-interval limit value with a same multiplication rate as one used at the first renormalizing unit;

a correction value computing unit for computing a size correction value which corrects the sub-interval size and a limit correction value which corrects the sub-interval limit value;

a interval correcting unit for correcting the sub-interval size renormalized at the first renormalizing unit using the size correction value computed at the correction value computing unit and outputting the subinterval size corrected as the interval size; and a interval limit value correcting unit for correcting the sub-interval limit value using the limit correction value computed at the correction value computing unit and outputting the sub-interval limit value corrected as the interval limit value.

In the encoding apparatus of the invention, the limited precision used for computing the interval size of the set interval is defined as a previous managing precision and the limited precision used for computing the sub-interval size is defined as a current managing precision, the sub-interval computing unit sets the current managing precision higher than the previous managing precision and obtains the sub-interval size by computing a product of the interval size of the set interval and the occurrence probability of the symbol based on the current managing precision set, and the correction value computing unit computes a difference between the previous managing precision and the current managing precision as an additional precision and computes the size correction value and the limit correction value based on the additional precision computed.

In the encoding apparatus of the invention, the limited precision used for computing the interval size of the set interval is defined as a previous managing precision and the limited precision used for computing the sub-interval size is defined as a current managing precision, the encoding apparatus further comprising a sub-interval table for holding plural sub-interval sizes computed with the current managing precision which is set higher than the previous managing precision with relating to plural occurrence probabilities of the symbol, the sub-interval computing unit selects the sub-interval size from the sub-interval size table based on the occurrence probability of the symbol, and the correction value computing unit computes a difference between the current managing precision and the previous managing precision as an additional precision and computes the size correction value and the limit correction value using the additional precision computed.

In the encoding apparatus of the invention, the sub-interval computing unit divides the interval size into at least two sub-interval sizes and computes the sub-interval size using a smaller occurrence probability of the symbol between the occurrence probabilities of the symbol corresponding to the at least two sub-interval sizes, and the correction value computing unit computes the size correction value and the limit correction value using the sub-interval size output from the sub-interval computing unit.

In the encoding apparatus of the invention, the sub-interval computing unit defines the sub-interval size as a first sub-interval size, computes a difference between the interval size of the set interval and the first sub-interval size as a second sub-interval size, and notifies of the sub-interval size which is smaller between the first subinterval size and the second sub-interval size, and the correction value computing unit inputs the sub-interval size notified by the sub-interval computing unit and a value of the symbol, and computes the size correction value and the limit correction value to correct the sub-interval limit value using the sub-interval size and the value of the symbol.

In the encoding apparatus of the invention, the sub-interval computing unit divides the interval size into at least two sub-interval sizes, and the correction value computing unit secures a minute interval which is not assigned to any of the at least two sub-intervals, and truncates the minute interval secured.

In the encoding apparatus of the invention, the minute interval is assigned a code value and used for notifying of a synchronous timing for an interrupt processing.

In the encoding apparatus of the invention, the minute interval is assigned a code value forcibly, used for notifying of a synchronous timing for an interrupt processing, and used for identifying plural interrupt processing by an offset of the code value.

According to the present invention, in a decoding apparatus for storing a interval size and a interval limit value, dividing a set interval set on a number line, selecting a sub-interval including a code value, updating the interval size and the interval limit value with a limited precision, and decoding the code value into a symbol, the interval size and the interval limit value are corrected whenever the code value is decoded.

The decoding apparatus of the invention includes:

a probability learning unit for learning occurrence probability of the symbol and storing the occurrence probability of the symbol learned in a storage area;

a sub-interval computing unit for obtaining a sub-interval size using the occurrence probability of the symbol stored at the probability learning unit, and for computing a sub-interval limit value corresponding to the subinterval size;

a first renormalizing unit for renormalizing the sub-interval size so that the sub-interval size obtained at the sub-interval computing unit should keep equal to or greater than a predetermined value;

a second renormalizing unit for renormalizing the sub-interval limit value with a same multiplication rate as one used at the first renormalizing unit;

a correction value computing unit for computing a size correction value which corrects the sub-interval size and a limit correction value which corrects the sub-interval limit value;

a interval correcting unit for correcting the sub-interval size renormalized at the first renormalizing unit using the size correction value computed at the correction value computing unit and outputting the subinterval size corrected as the interval size; and a interval limit value correcting unit for correcting the sub-interval limit value using the limit correction value computed at the correction value computing unit and outputting the sub-interval limit value corrected as the interval limit value.

In the decoding apparatus of the invention, the limited precision used for computing the interval size of the set interval is defined as a previous managing precision and the limited precision used for computing the sub-interval size is defined as a current managing precision, the sub-interval computing unit sets the current managing precision higher than the previous managing precision and obtains the sub-interval size by computing a product of the interval size of the set interval and the occurrence probability of the symbol based on the current managing precision set, and the correction value computing unit computes a difference between the previous managing precision and the current managing precision as an additional precision and computes the size correction value and the limit correction value based on the additional precision computed.

In the decoding apparatus of the invention, the limited precision used for computing the interval size of the set interval is defined as a previous managing precision and the limited precision used for computing the sub-interval size is defined as a current managing precision, the decoding apparatus further comprising a sub-interval table for holding plural sub-interval sizes computed with the current managing precision which is set higher than the previous managing precision with relating to plural occurrence probabilities of the symbol, the sub-interval computing unit selects the sub-interval size from the sub-interval size table based on the occurrence probability of the symbol, and the correction value computing unit computes a difference between the current managing precision and the previous managing precision as an additional precision and computes the size correction value and the limit correction value using the additional precision computed.

In the decoding apparatus of the invention, the sub-interval computing unit divides the interval size into at least two sub-interval sizes and computes the sub-interval size using a smaller occurrence probability of the symbol between the occurrence probabilities of the symbol corresponding to the at least two sub-interval sizes, and the correction value computing unit computes the size correction value and the limit correction value using the sub-interval size output from the sub-interval computing unit.

In the decoding apparatus of the invention, the sub-interval computing unit defines the sub-interval size as a first sub-interval size, computes a difference between the interval size of the set interval and the first sub-interval size as a second sub-interval size, and notifies of the sub-interval size which is smaller between the first subinterval size and the second sub-interval size, and the correction value computing unit inputs the sub-interval size notified by the sub-interval computing unit and a value of the symbol, and computes the size correction value and the limit correction value to correct the sub-interval limit value using the sub-interval size and the value of the symbol.

In the decoding apparatus of the invention, the sub-interval computing unit divides the interval size into at least two sub-interval sizes, and the correction value computing unit secures a minute interval which is not assigned to any of the at least two sub-intervals and truncates the minute interval secured.

In the decoding apparatus of the invention, the minute interval is assigned a code value and used for notifying of a synchronous timing for an interrupt processing.

In the decoding apparatus of the invention, the minute interval is assigned a code value forcibly, used for notifying of a synchronous timing for an interrupt processing, and used for identifying plural interrupt processing by an offset of the code value.

According to the present invention, in an encoding/decoding apparatus having:

an encoding apparatus including a interval size and a interval limit value, dividing a set interval set on a number line, selecting a sub-interval corresponding to an occurring symbol, updating the interval size with the sub-interval selected, updating the interval size and the interval limit value with a limited precision, and encoding a coordinate within the interval; and a decoding apparatus dividing the set interval including the coordinate encoded, selecting the sub-interval including the code value, updating the interval size and the interval limit value with the limited precision, and decoding the code value into a symbol, the encoding apparatus corrects the interval size and the interval limit value whenever the symbol is encoded, and the decoding apparatus corrects the interval size and the interval limit value whenever the code value is decoded.

According to another aspect of the present invention, in an encoding method having a interval size and a interval limit value, dividing a set interval set on a number line, selecting a sub-interval corresponding to an occurring symbol, updating the set interval to the sub-interval selected, updating the interval size and the interval limit value with a limited precision, and encoding a coordinate within the interval;

the interval size and the interval limit value are corrected whenever the symbol is encoded.

According to another aspect of the invention, in a decoding method having a interval size and a interval limit value, dividing a set interval set on a number line, selecting a sub-interval including a code value, updating the interval size with the sub-interval selected, updating the interval size and the interval limit value with a limited precision, and decoding the code value into the symbol, the interval size and the interval limit value are corrected whenever the code value is decoded.

According to another aspect of the invention, in encoding/decoding method having:

an encoding methods including a interval size and a interval limit value, dividing a set interval set on a number line, selecting a sub-interval corresponding to an occurring symbol, updating the set interval to the subinterval selected, updating the interval size and the interval limit value with a limited precision, and encoding a coordinate within the interval; and a decoding method dividing the set interval including the coordinate encoded, selecting the sub-interval including the code value, updating the interval size and the interval limit value, and decoding the code value into a symbol, the encoding method corrects the interval size and the interval limit value whenever the symbol is encoded, and the decoding method corrects the interval size and the interval limit value whenever the code value is decoded.

According to another aspect of the invention, in a program having a computer perform an encoding process including a interval size and a interval limit value, dividing a set interval set on a number line, selecting a sub-interval corresponding to an occurring symbol, updating the set interval to the sub-interval selected, updating the interval size and the interval limit value with a limited precision, and encoding a coordinate within the interval, the program has the computer perform a correction process to correct the interval size and the interval limit value whenever the symbol is encoded.

BRIEF EXPLANATION OF THE DRAWINGS

A complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Embodiment 1.

According to the International Standard ITU-T RecommendationT.82 (JBIG), an operation performed in the process of encoding/decoding should be kept within a predetermined effective precision; N bits of fractional bits. Therefore, encoding/decoding is implemented so as to handle a probability P by integers multiplied by Nth power of 2. Accordingly, a interval size is always extended to keep equal to or greater than (N−1)th power of 2, which is assumed to be 0.5 by renormalization when Nth power of 2 is assumed to be 1 as a interval for maximum probability. By performing renormalization, the virtual floating point is updated.

Usually, the probability P is an ideal division ratio when the interval size is 1.0. Therefore, when the renormalization is applied to keep the interval size equal to or greater than 0.5 and also less than 1.0, an approximate value LSZ may be used as a modified probability value, considering distribution of its extended size as shown in the above Recommendation T.82. In the present invention, without specifying the modified operation method, it is assumed that the modified probability value LSZ is a value which is obtained by truncating bits of the occurrence probability of LPS at the effective precision.

Assuming that a value obtained by applying renormalization on the approximate probability P is rP, and a number of extended shifts is S, the relationship can be expressed by the following:

$$1.0 > rP = P \times 2^S \geq 0.5$$

Figure 1:
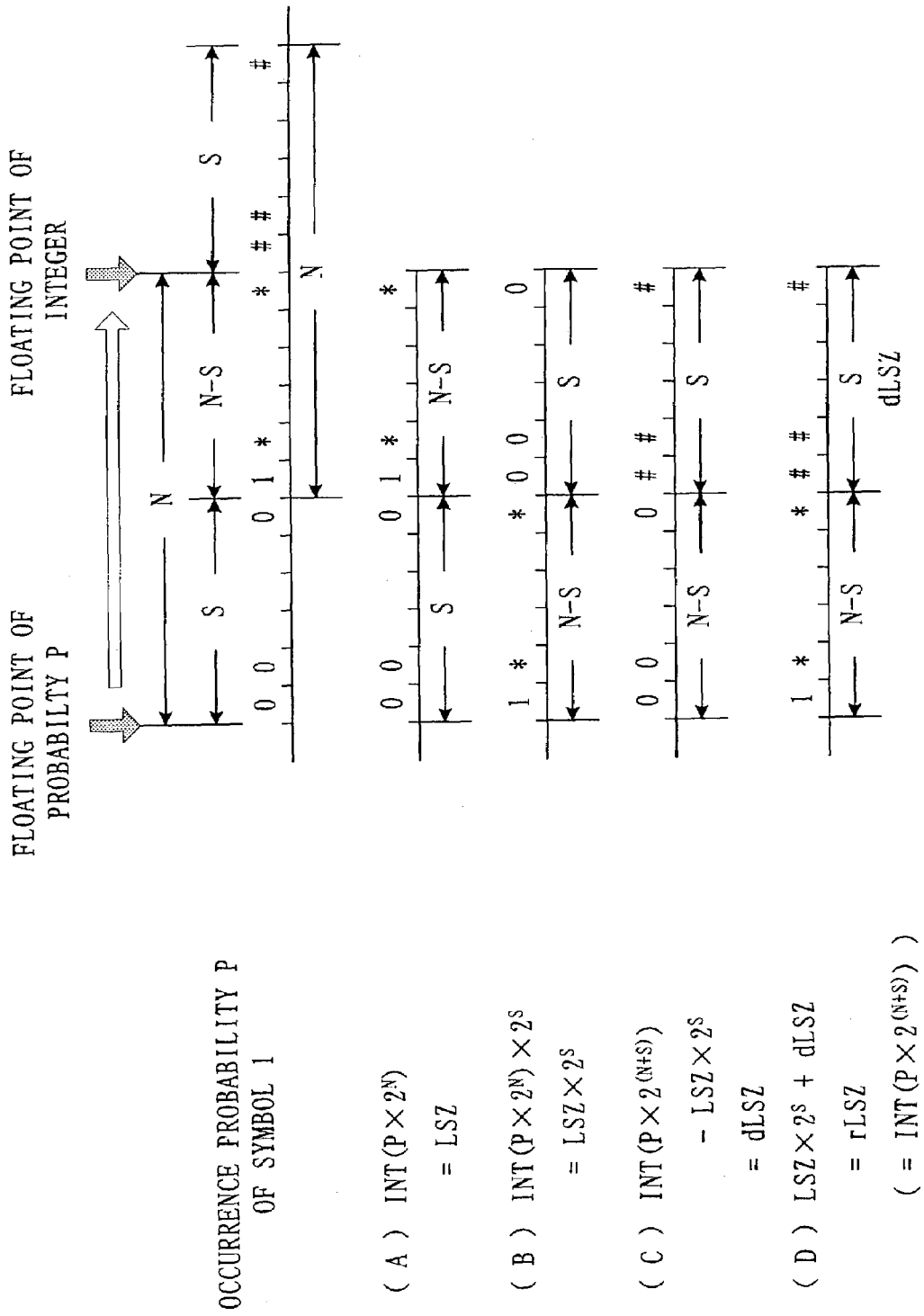
FIG. 1 shows a diagram showing definitions of P, LSZ, dLSZ, and rLSZ.

In the conventional method, a table for LSZ can be constructed by using P as the approximate probability and integerizing all candidates for the approximate probabilities, and truncating the fractional bits from them. In FIG. 1, N bits of fractional bits of (A) is treated as an integer part.

$$LSZ = INT(P \times 2^N)$$

where INT is an integerizing function

In FIG. 1, "*" and "#" show arbitrary values, which can be one of "0 (zero)" and "1".

Assuming that the probability 0.5 on integerizing is "HALF" and the probability 1.0 is "FULL", the above relationship of the integerized rP can be represented by the following: This corresponds to (B) in FIG. 1.

$$FULL > LSZ \times 2^S \geq HALF$$

In (A) of FIG. 1, for LSZ, S bits from the virtual floating point assumed at FULL condition have bit value 0, and in (B), for the value obtained by renormalizing LSZ, the lower S bits within the effective precision N become bit value 0. Therefore, only (N–S) bits can be actually used as the effective precision.

The present invention secures the effective precision of N bits for rLSZ which is obtained by renormalizing LSZ, and the invention enables to reduce the conventional truncation error to be modified. The LSZ renormalized in (B) of FIG. 1 is corrected by the dLSZ obtained in (C) to obtain the renormalization value rLSZ having the effective precision of N bits in (D).

$$FULL > rLSZ = INT(P \times 2^{(N+S)}) \geq HALF$$

The difference dLSZ used for correcting rLSZ obtained conventionally can be represented by the following:

$$dLSZ = rLSZ - (LSZ \times 2^S)$$

dLSZ=rLSZ and ($2^S$–1) ("and" means logical product function)

The learning of the occurrence probability and the prediction value can be performed in the conventional way, which have no direct connection with the present invention. Constant parameters which directly relates to an operation of the interval size and the code value except parameters related to these learning are LSZ, S, rLSZ, and dLSZ as shown in the above equations of relationship. Among these parameters, some can have a structure without a table if such parameters can be obtained from other parameter values. For example, if rLSZ and S are provided as constant tables, LSZ can be obtained by multiplying rLSZ with $(\frac{1}{2})^S$, and dLSZ can be obtained from three constant values rLSZ, LSZ, and S, or can be obtained by masking from two constant values rLSZ and S using a logical product (AND) of rLSZ and a value "$2^S$–1". For example, in FIG. 1, the values of (A), (B), (C), and (D) can be computed sequentially.

Figure 2:
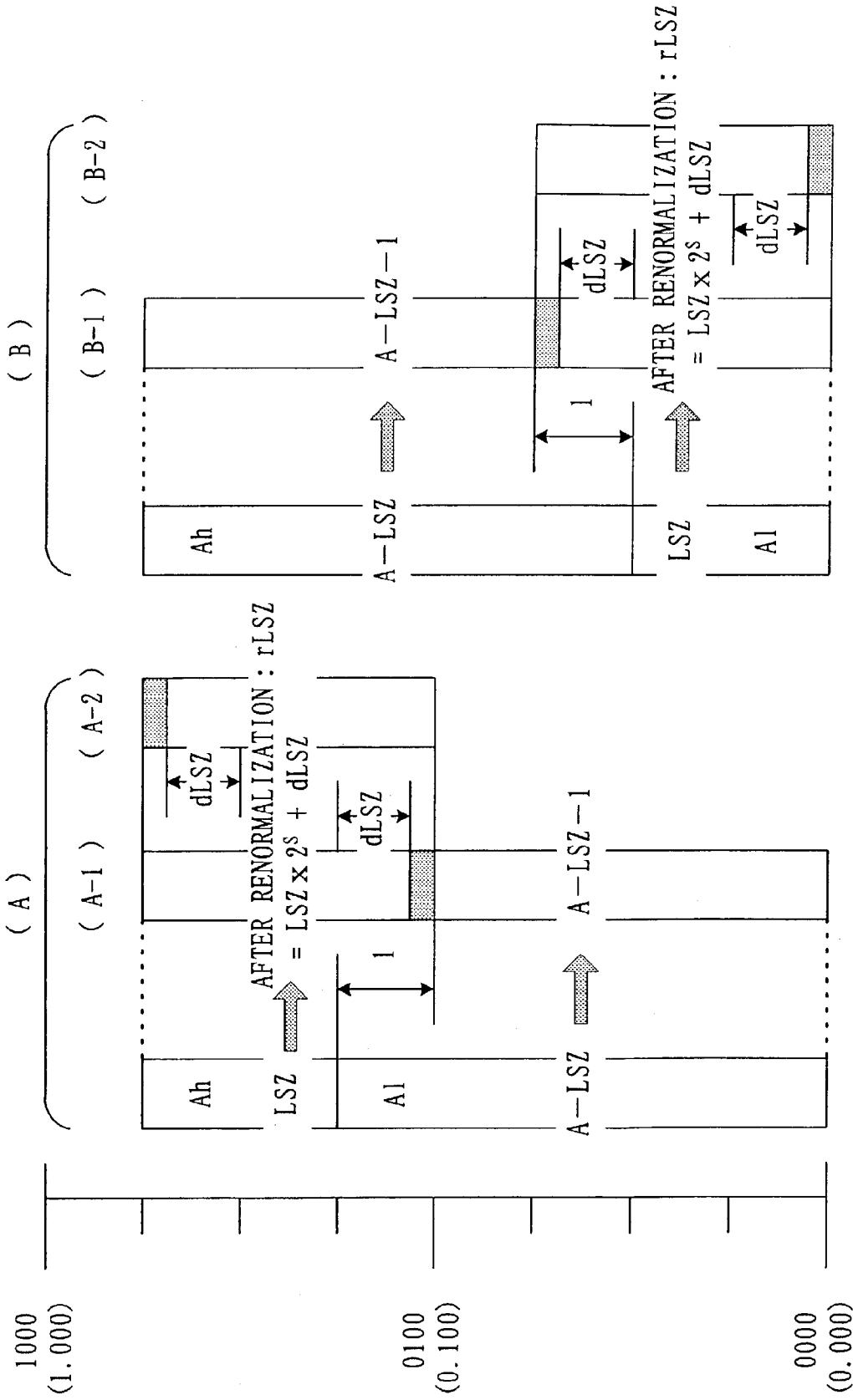
FIG. 2 shows an encoding concept in which dLSZ is introduced.

A concept of the encoding using the correction value dLSZ is shown in FIG. 2.

In the figure, (A) shows a case of placing the LSZ interval which is accompanied by modifying the sub-interval size at the upper sub-interval, and (B) shows a case of placing the LSZ interval at the lower sub-interval. These show correction of the sub-interval size Ah or Al which is placed at the upper part or the lower part, and the code C must be corrected according to a lower limit value of the sub-interval which is updated as a interval A accompanied with the correction of Ah or Al.

In order to modify the sub-interval Al to which LSZ is assigned by extending the sub-interval Al with an amount of dLSZ, the sub-interval A0 should be reduced with the amount of dLSZ on the contrary. This reduction cannot be performed with the operational precision available at that time, the sub-interval A0 is decremented by a minimum unit 1. The minimum unit 1 can take an arbitrary value and also have different weight according to the operational precision of the encoding apparatus. In case of FIG. 2, one unit of the scale at the left side represents the minimum unit. The above scale takes values from 0 (0000) through 8 (1000), and its minimum unit is 1. The minimum unit 1 is larger than the correction value dLSZ. Accordingly, this decremented amount 1 is larger than the dLSZ, so that another interval (a gray part, which is shaded part in FIG. 2) is generated. This gray part is small enough to be ignored even if the gray part should be truncated, which does not cause to seriously lower the encoding efficiency. Here, the interval to be truncated becomes "$2_S$ (Sth power of 2)–dLSZ," considering the value (integer) after the renormalization. In FIG. 2, the interval dLSZ (an area indicated by a bi-directional arrow) is 1>dLSZ, which is treated as a fraction, however, dLSZ after "renormalization" is treated as an integer, on the other hand.

It is possible to accumulate the amount to be truncated and wait for a proper timing to correct the interval until sufficient number of the codes are output instead of generating the small interval to be truncated. However, such a correction operation is complex, and as a result, the operation precision will be decreased and the processing load will be increased. Further, since the sub-interval A0 is essentially larger than the sub-interval Al in size, the encoding efficiency is not influenced lot even if the sub-interval 0 is reduced by the minimum unit 1. The dLSZ can be 0, and at that time, the reduction of the sub-interval A0 becomes also unnecessary.

For example, in case of LSZ having 16 bits as explained in the above Recommendation T.82, the sub-interval for the minimum value 0x0001 becomes 0x8000 (=HALF) by the renormalization in the conventional method. According to the present embodiment, the correction is applied to the lower 15 bits so as to have a range from 0x8000 through 0xFFFF, which enables to represent a value of probability with more rigid precision. In the same way, even if LSZ has a value other than the minimum value, it is possible to secure a proper range corresponding to the number of shifts for the renormalization.

Figure 3:
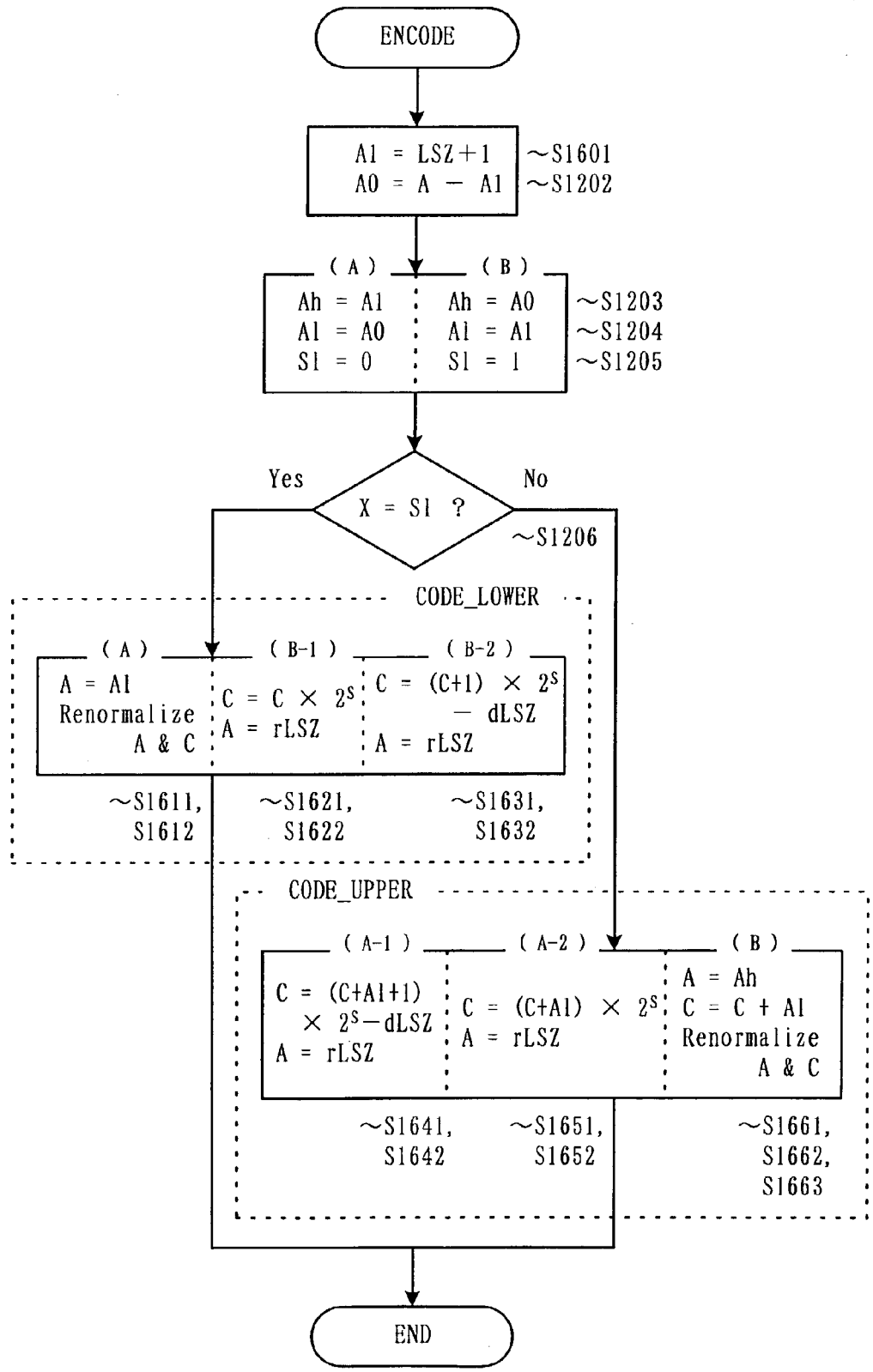
FIG. 3 shows an encoding procedure in which dLSZ is introduced.
Figure 4:
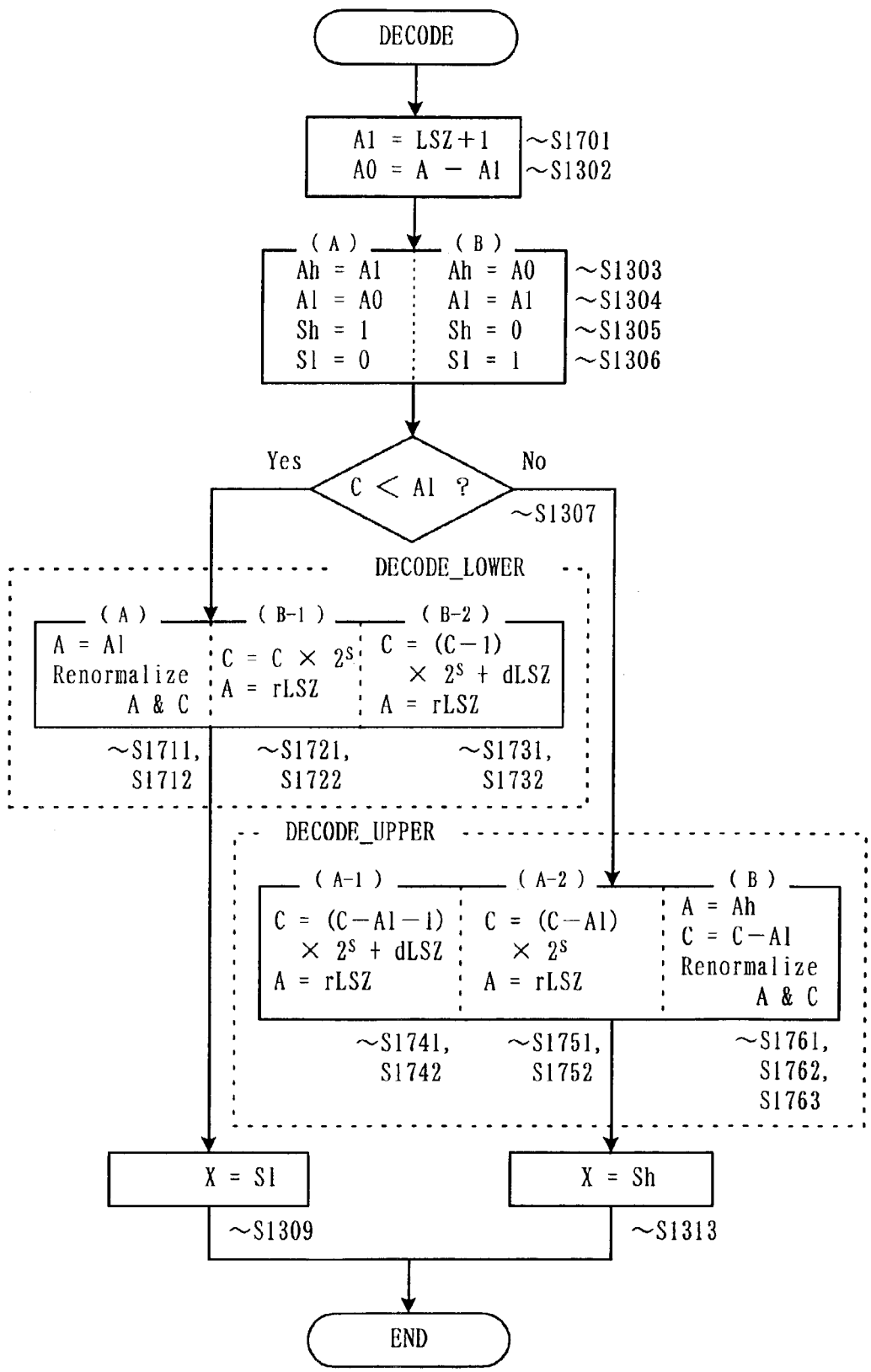
FIG. 4 shows a decoding procedure in which dLSZ is introduced.
Figure 27:
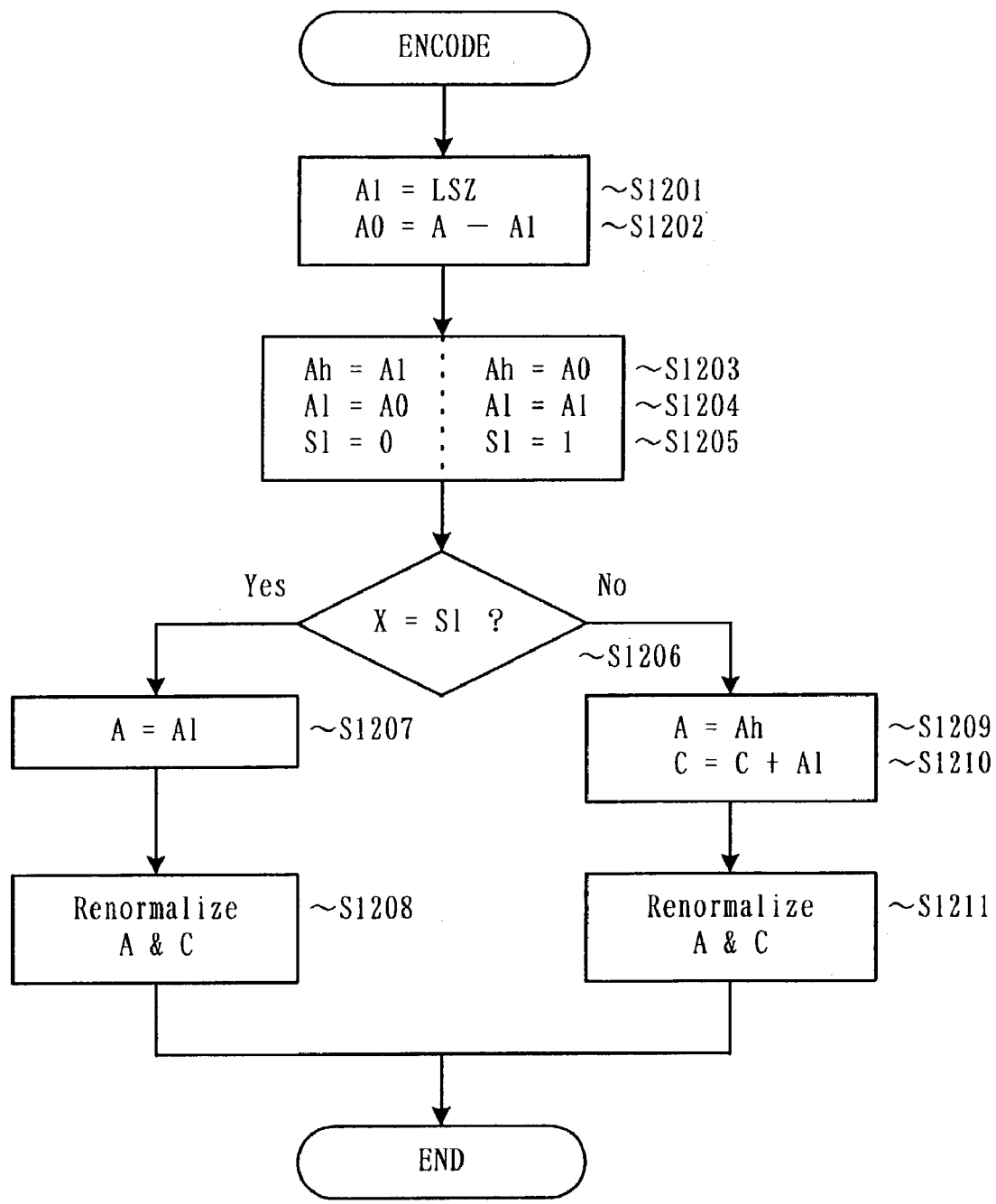
FIG. 27 shows a procedure of subtraction-based arithmetic coding.
Figure 28:
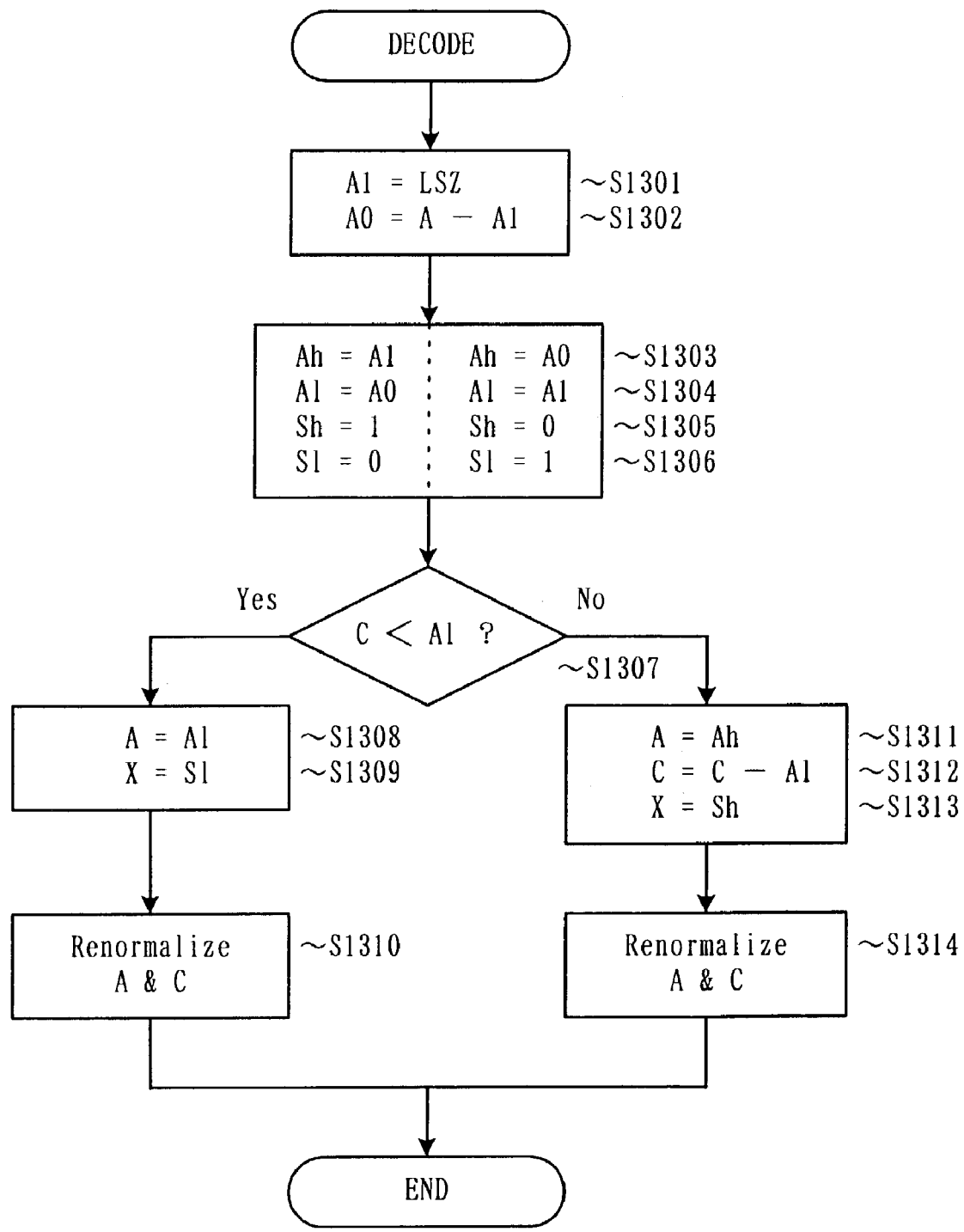
FIG. 28 shows a procedure of subtraction-based arithmetic decoding.
Figure 29:
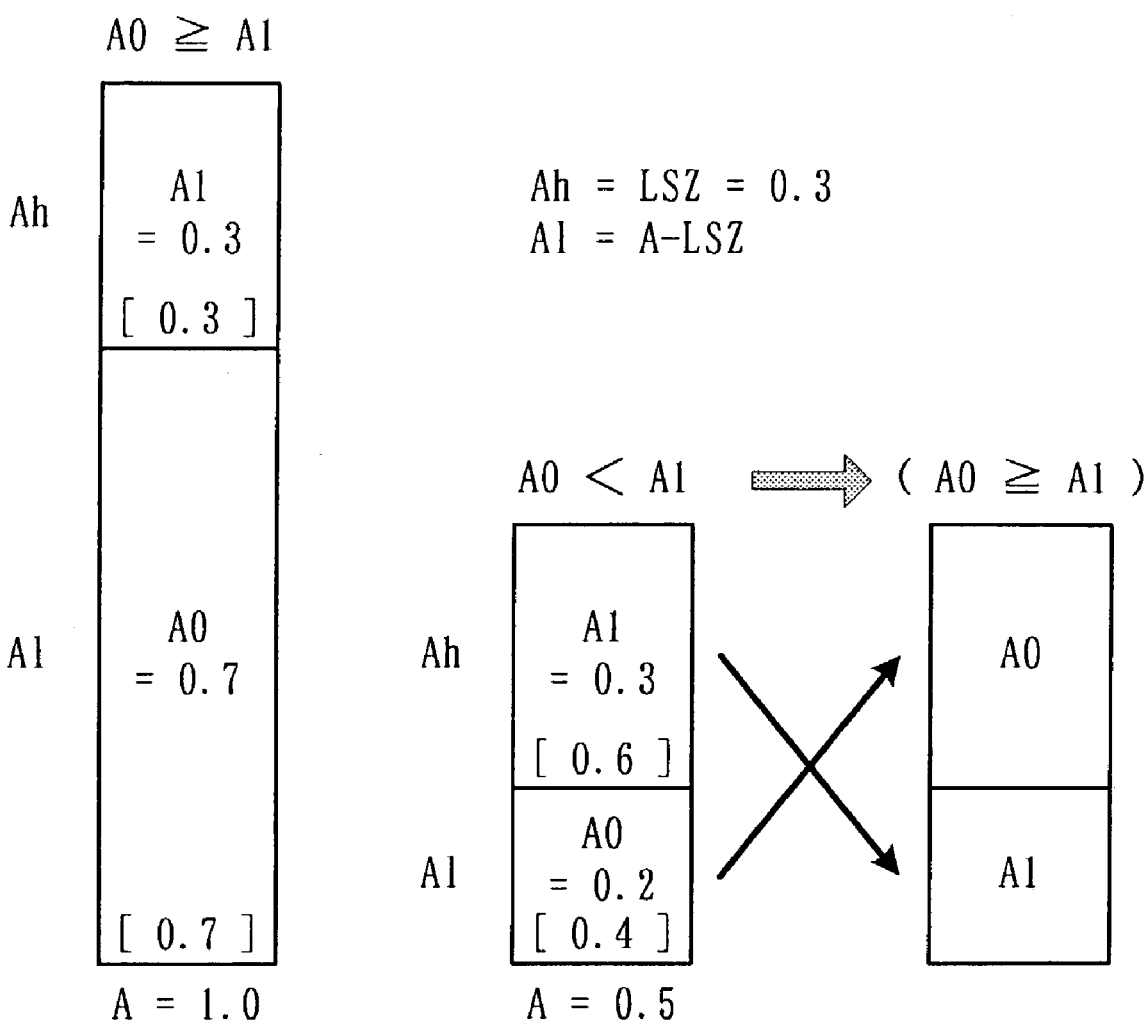
FIG. 29 shows a concept of "conditional MPS/LPS exchange"

FIGS. 3 and 4 show procedures of subtraction-based arithmetic coding and decoding shown in FIGS. 27 and 28, to which (A) and (B) of FIG. 2 is introduced.

The conventional arithmetic coding/decoding process as shown in the above Recommendation T.82 can be employed for the renormalization and the post processing.

At S1601 of the encoding process and S1701 of the decoding process, the LSZ is previously increased by one. If the LSZ is provided as a table, the table can contain values obtained by previously adding 1 to the LSZ.

When the interval is corrected by extending the interval using the LSZ table, the table can have "LSZ+1." Or when the encoding/decoding is performed without the LSZ table, for example, if only even numbers are selected on designing the LSZ, this encoding/decoding can be implemented without setting an adder. From S1203 through S1205 of the encoding process and S1303 through S1306 of the decoding process, an upper/lower location of the symbol is defined; when (A) of the left side is applied, a symbol 0 is placed at the lower sub-interval, and when (B) of the right side is applied, a symbol 1 is placed at the lower sub-interval. The subsequent process is performed in the same way as shown the above (A) and (B). The process indicated by (A-1), (A-2), (B-1), and (B-2) show respective processes according to the variation of location of the upper/lower sub-interval of a minute interval which is truncated at correction process. Only one of these processes is applied to each variation. The process which has been discussed here is to obtain a code as a sub-interval size to be updated and its lower limit value, and another equivalent operation process and representation can be applied.

Figure 30:
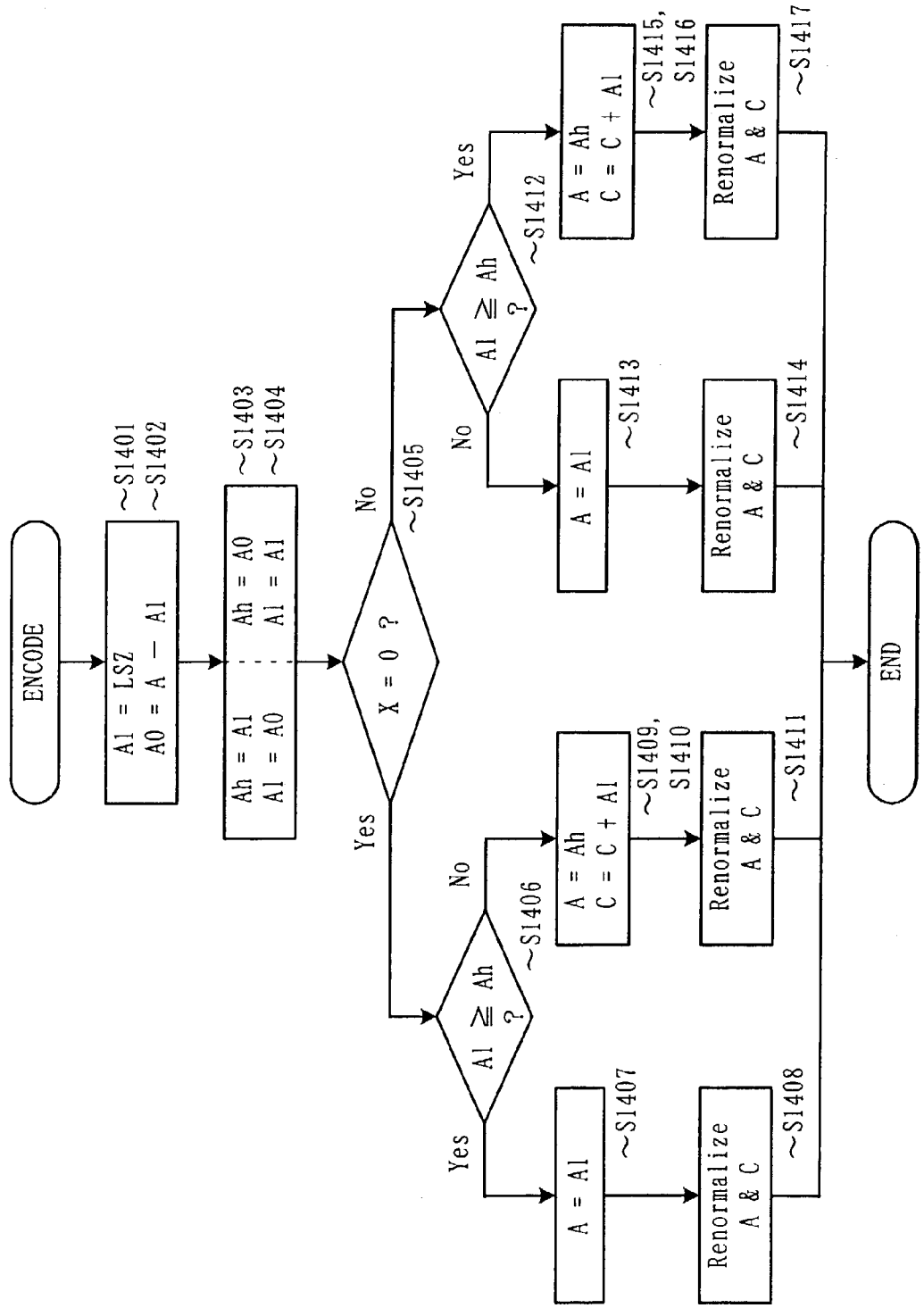
FIG. 30 shows a procedure of subtraction-based arithmetic coding with "conditional MPS/LPS exchange"
Figure 31:
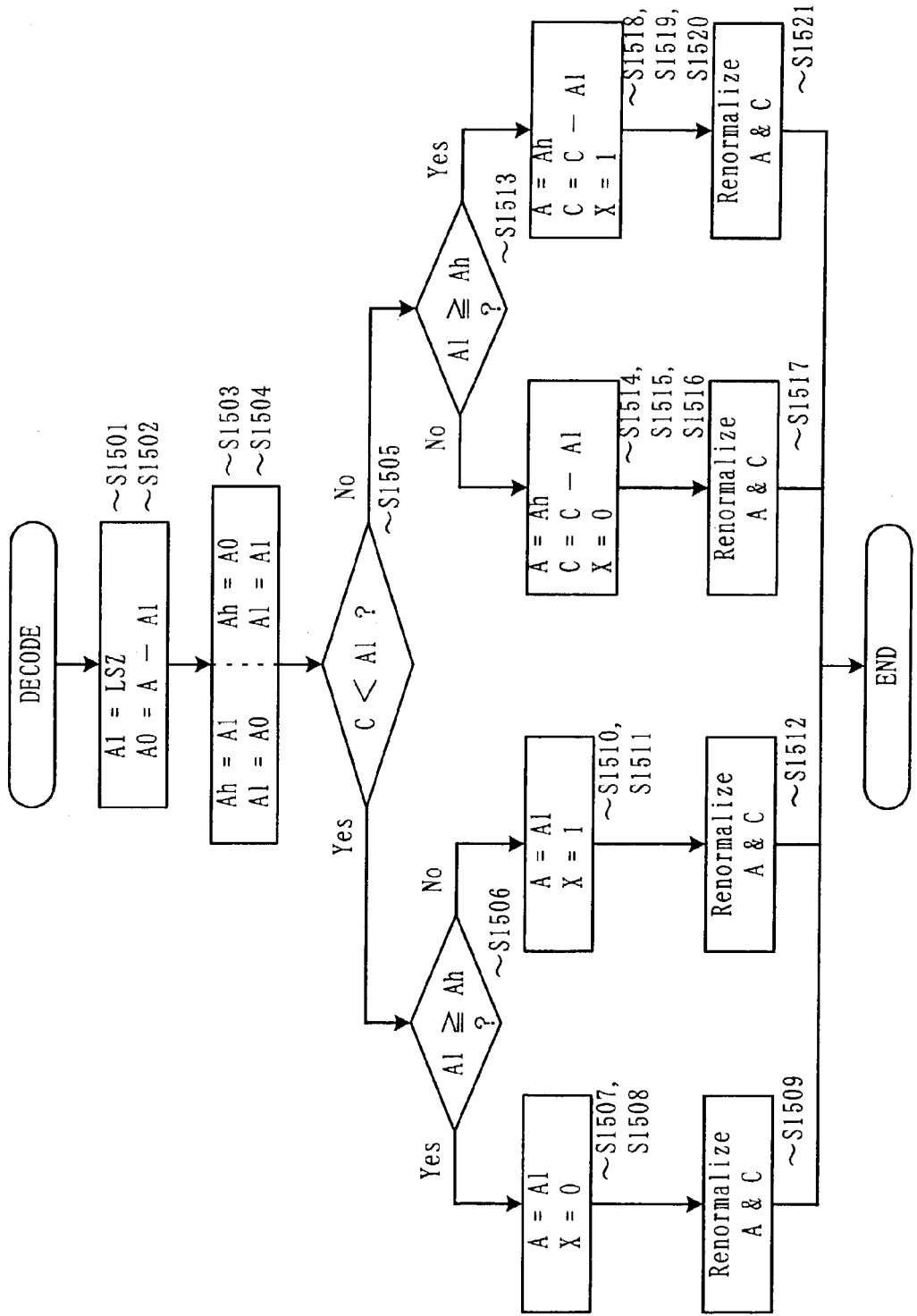
FIG. 31 shows a procedure of subtraction-based arithmetic decoding "conditional MPS/LPS exchange".

In blocks enclosed by broken lines in FIGS. 3 and 4, CODE_LOWER and DECODE_LOWER show encoding and decoding to the lower subinterval, and CODE_UPPER and DECODE_UPPER show encoding and decoding to the upper sub-interval. The same processing can be applied to these encoding and decoding processes as the encoding and decoding processes for "conditional MPS/LPS exchange," which will be explained later and shown in FIGS. 30 and 31.

Figure 5:
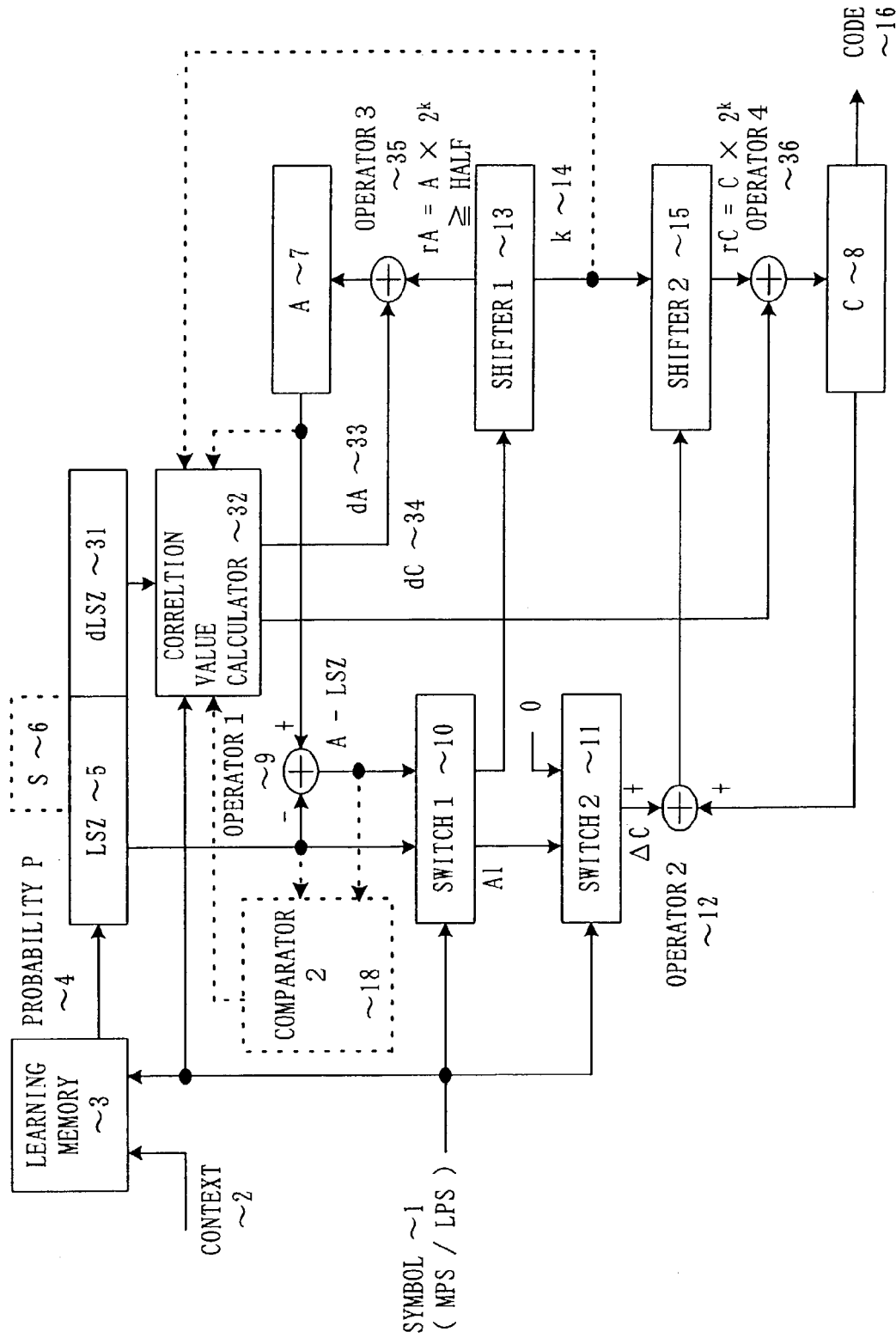
FIG. 5 shows a block diagram of encoding in which a correction is introduced.
Figure 6:
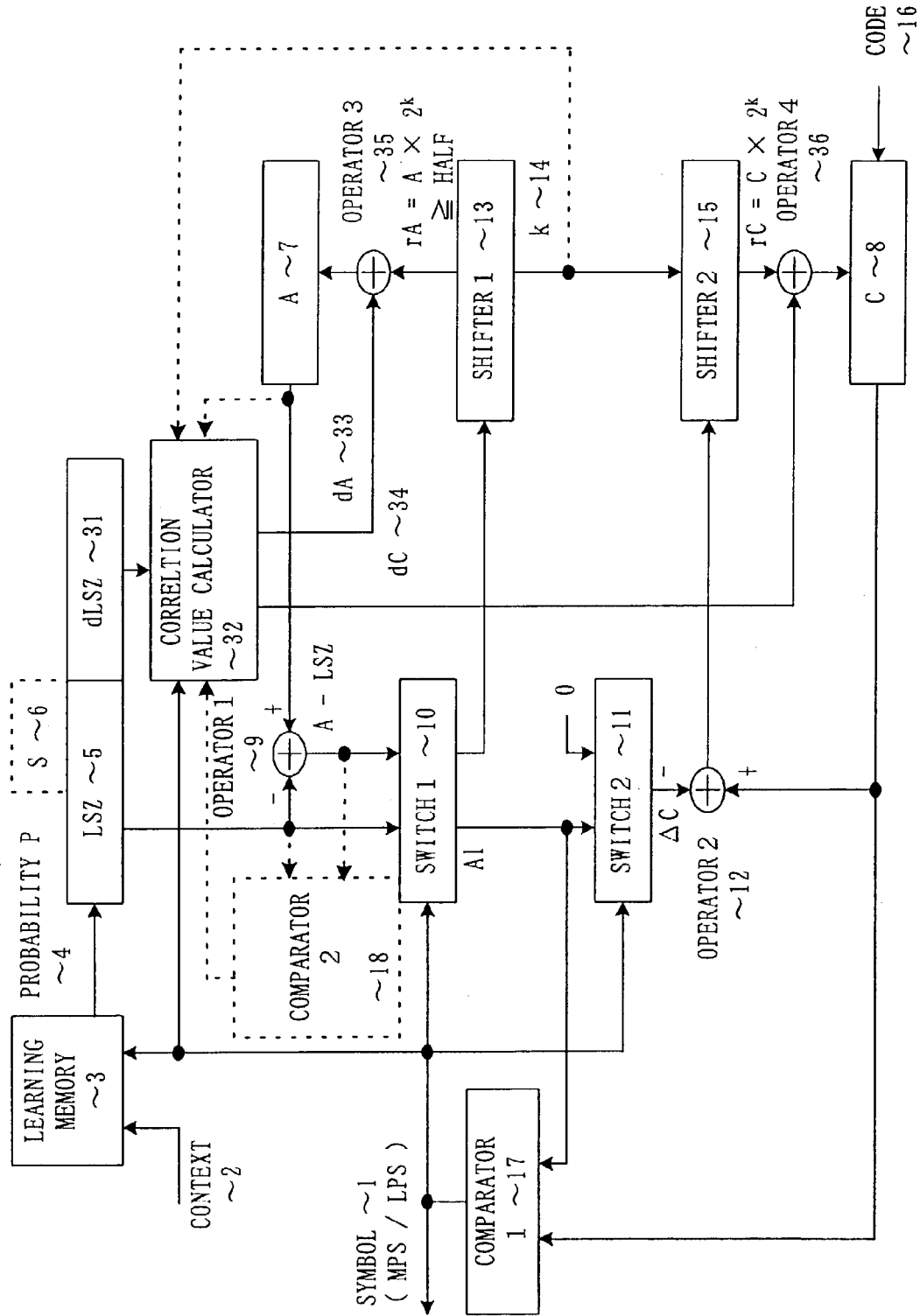
FIG. 6 shows a block diagram of decoding in which a correction is introduced.

FIG. 5 shows an example of a configuration of an encoding apparatus for implementing the encoding process shown in FIG. 3 (hereinafter, FIG. 5 is referred to as an "encoding block diagram"), and FIG. 6 shows an example of a configuration of a decoding apparatus for implementing the decoding process shown in FIG. 4 (hereinafter, FIG. 6 is referred to as a "decoding block diagram").

In the configurations of FIGS. 5 and 6, according to the present embodiment, explanation of processes indicated by arrows with broken lines are omitted such as: signal lines of the number of bits k14 of an extending shift for renormalizing the interval size A7 and the updated interval size; and input/output signal lines to/from a second comparator 18.and its related signals. These omitted processes will be incorporated and explained in the second embodiment.

FIG. 5 is a configuration diagram showing one example for implementing the arithmetic coding system and method which divides a set interval on a number line, selects the sub-interval corresponding to the occurring symbol, updates the set interval to the selected sub-interval, updates the interval size (A) and the interval limit value (C) with a limited precision based on the sub-interval, and encodes a coordinate within the interval.

First, functions implemented by the configuration of the figure will be explained referring to the block diagram, and then concrete operation will be discussed using FIG. 5.

In the following explanation, a configurational element such as an "operator 1" denoted in the figure will be mentioned as a "first operation unit."

The arithmetic coding system includes a probability learning unit, a sub-interval computing unit, a first renormalizing unit, a second renormalizing unit, a correction value computing unit, a interval correcting unit, and a interval limit value correcting unit.

The probability learning unit (probability learning step) learns a probability of symbol based on occurrence status of the symbol for the context, and stores learned occurrence probability of symbol 1 (LPS) in a storage area. In FIG. 5, the storage area is implemented by a learning memory 3. Here, the symbol already reflects a match/mismatch of data value between a data value (prediction value) which is more probable to occur for the context and a data value of concrete processing (encoding or decoding).

The sub-interval computing unit (sub-interval computing step) obtains the sub-interval size using the occurrence probability of the symbol stored at the probability learning unit and computes a sub-interval limit value corresponding to the sub-interval size. In FIG. 5, the sub-interval computing unit is implemented by an LSZ 5 and a dLSZ 31, a first operator 9, a second operator 12, a first switch 10, and a second switch 11.

The sub-interval size obtained by the sub-interval computing unit corresponds to a combination of the LSZ and the dLSZ.

The first switch 10 adds 1 (S1601 in FIG. 27, S1701 in FIG. 28) to the LSZ value which is input. Or the LSZ value can be a value to which 1 has been previously added.

In the present embodiment, the sub-interval size tables, which are shown by the LSZ 5 and the dLSZ 31, are used. The sub-interval size table holds plural sub-interval sizes, which respectively correspond to occurrence probabilities of plural symbols, and when the occurrence probability of symbol (the probability: 4 in FIG. 5) is input, the sub-interval size table outputs the sub-interval size (LSZ, dLSZ) corresponding to the input probability.

In case of introducing status transition, the memory manages and stores not the probability, but state numbers (STATE), and outputs the subinterval size (LSZ, dLSZ) correspondingly selected from the sub-interval size table using the state number as an index. Or the sub-interval size can be computed using the occurrence probability P of symbol, and using a product of A×P in case of inputting the probability and A and computing with more rigid precision, it is possible to obtain the corresponding sub-interval size (LSZ, dLSZ) in accordance with the precision shown in FIG. 1. This computing process should be performed prior to the processes of FIGS. 3 and 4.

The first renormalizing unit (first renormalizing step) renormalizes the sub-interval size so that the sub-interval size obtained at the subinterval computing unit can keep equal to or greater than a predetermined value. In FIG. 5, the sub-interval size which is implemented by a first shifter 13 and renormalized is noted as "rA". In the present embodiment, the renormalization is implemented using power of 2, however, the renormalization is not limited to this way. In case of renormalizing using a number other than power of 2, the shifter becomes a multiplier.

The second renormalizing unit (second renormalizing step) renormalizes the sub-interval limit value which is obtained at the subinterval computing unit using the same multiplication rate as one used at the first renormalizing unit. In FIG. 5, the sub-interval limit value which is obtained by the second shifter 15 and renormalized is noted as "rC".

The correction value computing unit (correction value computing step) computes a size correction value for correcting the sub-interval size and a limit correction value for correcting the sub-interval limit value. The correction value computing unit computes the size correction value and the limit correction value using the dLSZ. In FIG. 5, this computation is implemented by a correction value calculator 32, the size correction value is noted as dA, and the limit correction value is noted as dC. The correction value calculator 32 inputs the symbol 1 and the dLSZ 31 and outputs dA and dC.

The interval correcting unit (interval correcting step) corrects the sub-interval size renormalized at the first renormalizing unit using the size correction value computed at the correction value computing unit, and outputs the corrected sub-interval size. The output sub-interval size is updated as the interval size, and at next encoding step, used as the interval size reflexively. In FIG. 5, this operation is implemented by a third operator 35.

The interval limit value correcting unit (interval limit value correcting step) corrects the sub-interval limit value using the limit correction value computed at the correction value computing step, and outputs the corrected sub-interval limit value. The output sub-interval limit value is updated as the interval limit value, and at next encoding step, used as the interval limit value reflexively. In FIG. 5, this operation is implemented by a fourth operator 36.

If the multiplication rate for extension of the renormalization is power of 2, the renormalization can be performed by shifting process. Or, when, for example, the renormalized sub-interval size rA and the subinterval limit value rC is not corrected by the addition using the size correction value dA and the limit correction value dC through the third and the fourth operators, another implementation by taking dA and dC from the lowest order of rA and rC into new values, respectively, bit by bit. In this case, there is no need to include the third and the fourth operators, and the size correction value dA and the limit correction value dC can be directly input to the first and the second shifters.

Further, upon implementation, if the code is input/output by byte unit during the renormalization process, it is possible to divide the correction process into plural steps, for example, the correction process to have been performed before that point and the remaining correction process after that.

A "limited precision" corresponds to the integer part N bits shown in FIG. 1 in the present specification, and is defined by the user arbitrarily.

Further, a "managing precision" means the same as the "limited precision."

The limited precision used for computing the interval size (A) of the set interval is referred to as a "previous managing precision." And the limited precision used for computing the sub-interval size is referred to as a "current managing precision."

In FIG. 1, the limited precision corresponds to the upper N bits of P (corresponding to LSZ), and further corresponds to the previous managing precision.

Further, a "higher (greater) precision than the limited precision" means the upper (N+S) bits of P in FIG. 1, and corresponds to the current managing precision. By renormalizing the sub-interval size which is obtained using the current managing precision, the sub-interval size of N bits (rLSZ) is obtained. The "higher precision than the limited precision" becomes (2×N−1) bits at maximum. Namely, since the number of shifts (S) becomes its maximum (N−1) bits when LSZ=1[1 of the lowest bit is shifted to the highest bit: renormalization], the sub-interval size of N bits becomes N+(N−1)=(2×N−1), combining N bits of the precision of LSZ (in case of integer) and (N−1) bits [becomes N-bit precision when added to the above LSZ=1] of fractional bits of the dLSZ.

Further, "information of additional precision" is additional precision (S bits) to the lower bits than the limited precision in case of the limited precision (N bits), which corresponds to the dLSZ (or dLSZ'). The additional precision corresponds to a difference between the previous managing precision and the current managing precision.

The correction value computing unit (correction value computing step) computes the size correction value and the limit correction value using the additional precision, namely, the dLSZ.

In the following, a concrete operation will be explained referring to FIG. 5.

In the encoding block diagram, at the same time of inputting a symbol 1 to be encoded, a context 2 which categorizes an attribute of the symbol 1 is input to the learning memory 3. The learning memory 3 outputs a probability 4, the interval size LSZ 5, and the correction interval size dLSZ 31 corresponding to the probability 4. At this time, if necessary, the number of bits S of extending shift for the renormalization of the LSZ interval is referred.

Next, LSZ and "A-LSZ" computed by the first operating unit 9 are input to the first switch 10, and the sub-interval size corresponding to the symbol 1 (hereinafter, "the sub-interval size corresponding to the symbol 1" is also called as "the corresponding interval size") is output.

Then, the sub-interval Al which is to be placed at the lower part is input to the second switch 11, and a variation (ΔC) which is used for computing the lower limit value of the sub-interval corresponding to the symbol 1 and is updated from the code value C8 is output. The sub-interval limit value is computed by performing an operation of ΔC to the interval limit value.

The sub-interval size output from the first switch 10 is input to the first shifter 13. The first shifter 13 performs the renormalization by shifting the sub-interval size with k14 bits so as to exceed the size of HALF and outputs the sub-interval size (rA). Simultaneously, k14 is input to the second shifter 15. The second shifter 15 shifts the lower limit value (the sub-interval limit value) (rC) corresponding to the sub-interval size (rA) output from the second operator 12 with the same number of bits k14.

The correction value computing unit 32 inputs the symbol 1 and the dLSZ 31, and outputs the size correction value dA 33 for correcting the subinterval size (rA) which is output from the first shifter 13 and the limit correction value dC 34 for correcting the lower limit value (the sub-interval limit value) which is output from the second shifter 14.

The third operator 35 applies the size correction value dA 33 to the output value (the sub-interval size (rA)) of the first shifter 13, and updates the interval size A7 by outputting the applied value.

Further, the fourth operator 36 applies the limit correction value dC 34 to the output value (the lower limit value (the sub-interval limit value)) of the second shifter 15, and updates the code value C 8 by outputting the applied value.

The code C 8 outputs the code 16 by the number of bits which has been shifted by the renormalization.

In the following, the decoding system and method will be explained.

FIG. 6 is a configuration diagram showing one example for implementing the decoding system and method for decoding the symbol which divides the set interval on the number line, selects the sub-interval including the code value, and updates the interval size (A) and the interval limit value (C) with the limited precision.

The decoding system includes a probability learning unit, a subinterval computing unit, a first renormalizing unit, a second renormalizing unit, a correction value computing unit, a interval correcting unit, and a interval limit value correcting unit. Each of the configuration element is the same as ones explained in the encoding method. In FIG. 6, the elements having the same signs are the same as ones explained in FIG. 5, and the explanation is omitted here. Further, the correspondence between the above configuration elements and the elements in FIG. 6 is the same as ones described using FIG. 5. Between FIGS. 5 and 6, the connections among the configuration elements are different as shown in the figures. Different from FIG. 5, a first comparator 17 is added to FIG. 6, and the interval limit value (C) is input (FIG. 6, C 8). The first comparator 17 compares the code value C 8 and the sub-interval A1.

Next, the concrete operation will be explained referring to FIG. 6.

In the decoding block diagram, the context 2 which categorizes the attribute of the symbol 1 to be output is input to the learning memory 3. The learning memory 3 outputs the probability 4, and the interval size LSZ 5 corresponding to the probability 4, and the correction interval size dLSZ 31. At this time, if necessary, the number of bits S of extending shift for the renormalization of the LSZ interval is referred simultaneously.

Next, the code value C8 and the sub-interval Al which is placed at the lower part are input to the first comparator 17, and the first comparator 17 compares the code value C8 and the sub-interval Al. If the code value C8 is smaller than Al, the lower sub-interval corresponding symbol is determined, and if the code value C8 is equal to or greater than Al, the upper sub-interval corresponding symbol is determined as the decoded symbol 1.

LSZ and "A-ISZ" computed by the first operator 9 are input to the first switch 10, and the sub-interval size corresponding to the symbol 1 is output.

Then, the sub-interval Al which is placed at the lower part is input to the second switch 11, and a variation ($\Delta C$) between the lower limit value of the current interval A 7 and the updated lower limit value of the sub-interval corresponding to the symbol 1 is output.

The sub-interval size output from the first switch 10 is input to the first shifter 13. The first shifter 13 implements the renormalization by shifting the sub-interval size with k14 bits so as to exceed the size of HALF and output the sub-interval size (Ar). Simultaneously, k14 is input to the second shifter 15. The second shifter 15 shifts the code value output from the second operator 12 with the same number of bits k14.

The correction value calculator 33 inputs the symbol 1 and the dLSZ 31, and outputs the size correction value dA 33 for correcting the sub-interval size (rA) which is output from the first shifter 13 and the limit correction value dC34 for correcting the lower limit value (rC) which is output from the second shifter 14.

The third operator 35 applies the size correction value dA 33 to the output value (the sub-interval size (Ar)) of the first shifter 13, and updates the interval size A7 to the applied value.

Further, the fourth operator 36 applies the limit correction value dC 34 to the output value (the lower limit value (the sub-interval limit value) (rC)) of the second shifter 15, and updates the code value C 8 to the applied value.

The code C 8 inputs the code 16 by the number of bits which has been shifted by the renormalization.

The operators for the correction value and the renormalization value adds/subtracts the correction value to/from the renormalization value according to the location of the sub-interval and encoding/decoding. The correction value is computed based on CODE_LOWER, CODE_UPPER, DECODE_LOWER, and DECODE_UPPER shown in FIGS. 3 and 4, and the registers A and C obtain the computed results. The comparator 1 is placed only in the decoding side, compares the code C and the lower sub-interval size, selects the upper sub-interval including the coordinate of the code C and the lower sub-interval, and sets a symbol corresponding to the selected subinterval as a decoded symbol.

The following shows concrete examples of the size correction value (dA), the limit correction value (dC) computed by the correction value computing unit:

In case of updating the sub-interval which does not need to be corrected, both dA and dC are 0. In case of updating the sub-interval to be corrected, dC is 0 if the gray part to be truncated is located at lower dA is output regardless of upper/lower location of the sub-interval, and the value of dA can be 0 incidentally.

In case of updating to the LSZ sub-interval, the LSZ is less than 0.5 (namely, less than a half of the maximum value [1.0] of the whole interval), the renormalization is always implemented.

According to FIG. 5, the interval size is updated to (based on the occurring symbol and upper/lower location), Ah (or Al)$\times(2^k)$+dA ($\geq 2^{(N-1)}$; renormalization) and the interval limit value is updated to (C+$\Delta$C)$\times(2^k)$+dC (in case of the correction by addition)

In case of the lower sub-interval, $\Delta$C=0. In case of the interval which is not to be corrected, dA=0. Further, dC can be dC=0 according to the location of the minute sub-interval to be truncated.

The operators for the correction value and the renormalization value adds/subtracts the correction value to/from the renormalization value according to the location of the sub-interval and encoding/decoding. The correction value is computed based on CODE_LOWER, CODE_UPPER, DECODE_LOWER, and DECODE_UPPER shown in FIGS. 3 and 4, and the registers A and C obtain the computed results. The first comparator 17 is placed only in the decoding side, compares the code C and the lower subinterval size A1, selects the upper sub-interval including the coordinate of the code C and the lower sub-interval, and sets a symbol corresponding to the selected sub-interval as a decoded symbol.

Figure 7:
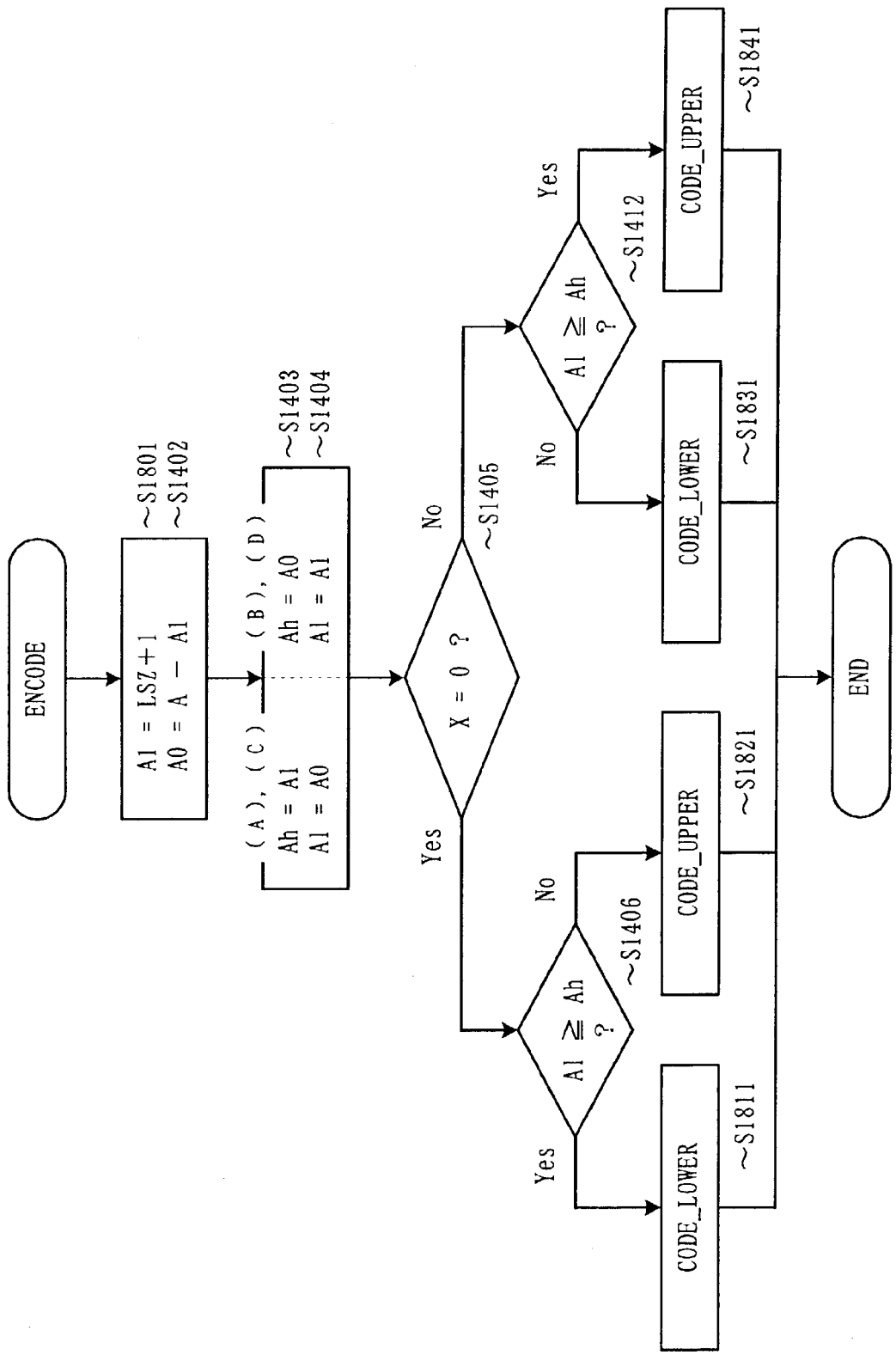
FIG. 7 shows an encoding procedure with "conditional MPS/LPS exchange" in which dLSZ is introduced.
Figure 8:
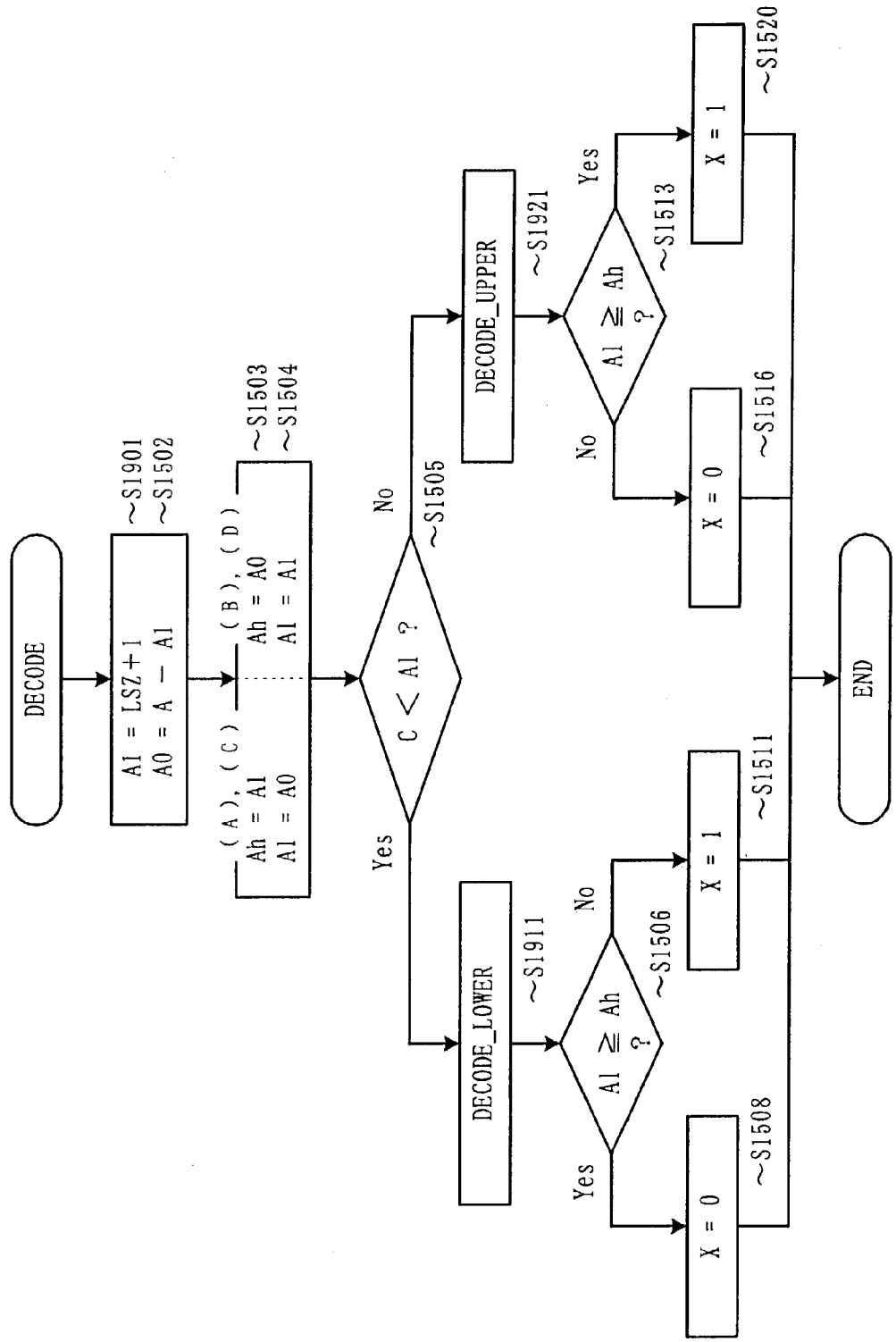
FIG. 8 shows a decoding procedure with "conditional MPS/LPS exchange" in which dLSZ is introduced.

Next, FIGS. 7 and 8 show procedures of encoding and decoding when "conditional MPS/LPS exchange" is applied.

Figure 9:
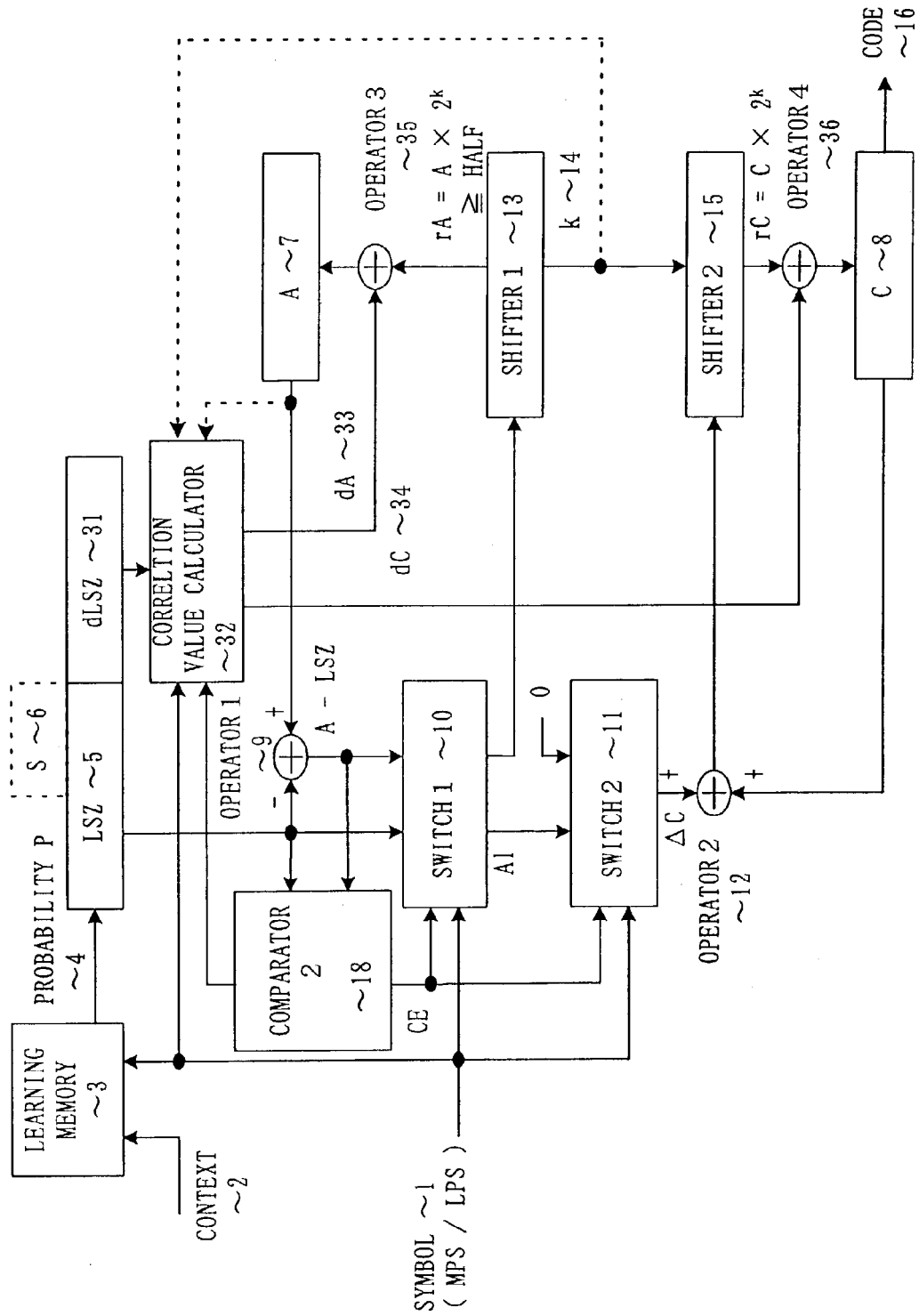
FIG. 9 shows a block diagram of encoding with "conditional MPS/LPS exchange" in which a correction is introduced.
Figure 10:
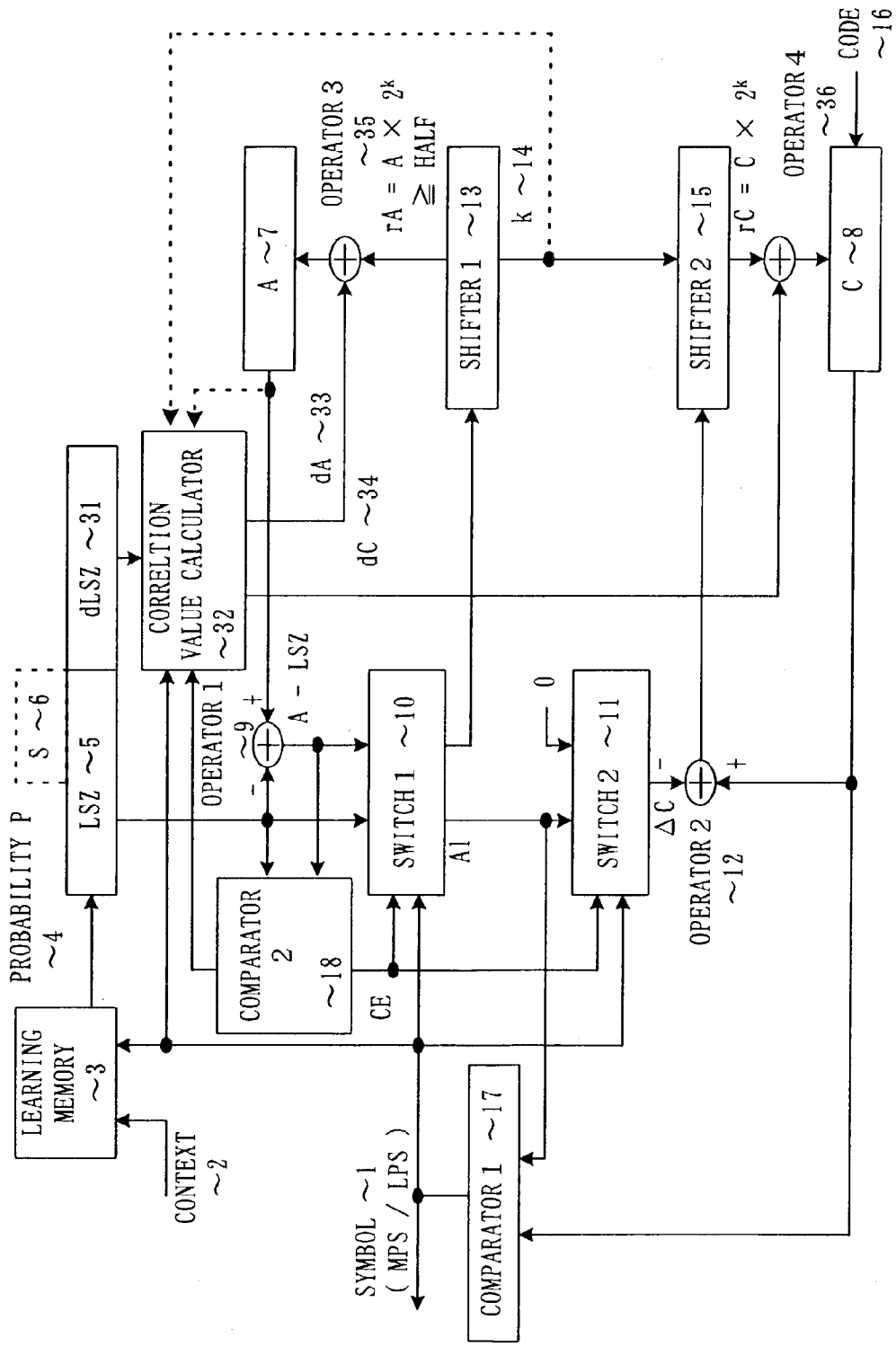
FIG. 10 shows a block diagram of decoding with "conditional MPS/LPS exchange" in which a correction is introduced.

FIGS. 9 and 10 show block diagrams showing implementation of the encoding process of FIG. 7 and the decoding process of FIG. 8.

In the configurations of these figures, the data signal lines from the interval size A7 and of the number of bits k14 of extended shift for the renormalization, the second comparator 18 and the input/output signal lines to/from the second comparator 18 are shown by broken lines and not used here.

The second comparator 18 is now added to the configurations of FIGS. 5 and 6 explained above. The second comparator 18 discriminates sizes of the upper sub-interval and the lower sub-interval, and the first and the second switches 10 and 11 determine update values by corresponding the larger sub-interval to the MPS and the smaller to the LPS. The correction value calculator computes the correction values based on CODE_LOWER, CODE_UPPER, DECODE_UPPER, and DECODE_UPPER shown in FIGS. 7 and 8, and the registers A and C obtain the computed result.

In the first embodiment, it is assumed that the LSZ is prepared in the sub-interval size table using the approximate probability value as the constant table (corresponding to the LSZ 5 and the dLSZ 6 shown in FIGS. 5 and 6), however, the LSZ can be obtained each time when required as a product of multiplication of the occurrence probability P and the interval size A with a limited precision. The constant table can previously prepare the number of bits S of extended shift. If the multiplication with the limited precision is performed, the value S corresponding to the product is provided at the same time. At this time, the multiplied value is prepared each time prior to the process shown in FIGS. 3 and 4.

Further, in the above explanation, when the sub-interval size is obtained by computing the product of the occurrence probability of symbol and the interval size (A), the sub-interval size is obtained from the interval size table using the occurrence probability of symbol. However, the computation is not limited to the above, and the sub-interval size can be obtained by any computation or searching method as long as the sub-interval size is obtained using the occurrence probability of symbol.

Further, the optimal value of the LSZ can be selected using the occurrence probability P, however, when the LSZ is provided as the constant table, an optimum judging unit can be located outside the LSZ, and an input can be data within a table which is usually called as a state and managed by an index. Generally, this method is applied to a case of the state transition, and is also adopted in the above Recommendation T.82.

When the sub-interval size is obtained using the state, the learning memory 3 shown in FIG. 5 outputs the state instead of the probability 4. The sub-interval table (combination of the LSZ 5 and the dLSZ 31 in FIG. 5) stores the sub-interval size (combination of the LSZ and the dLSZ) corresponding to the state. The state is a value to be determined based on the occurrence probability of symbol. Accordingly, if the sub-interval size is obtained using the state, the sub-interval computing unit obtains the subinterval size using (based on) the occurrence probability of symbol. Further, it can be said that the sub-interval size stored in the sub-interval table is related to the occurrence probability of symbol through the state.

Generally, in case of using the sub-interval table (LSZ table) which is previously prepared, the probability estimation is performed by the state transition, the occurrence probability of symbol for each state is predetermined, and the occurrence probability assigned to the state in which the symbol stays is applied to the encoding/decoding.

In this case, "state number" ("state") is input to the sub-interval table, and the LSZ and the dLSZ are selected accordingly.

In case of the probability estimation by the state transition, the state (number) to stay is updated according to the change of the probability. Generally, when the LPS occurs, the occurrence probability of LPS is (always) increased, and when the occurrence probability exceeds 0.5, the prediction value is inverted and the probability which is less than 0.5 is stored. When the MPS occurs, the state is not always transited. The state is transited when the interval size becomes less than 0.5 and the renormalization is implemented (the International Standard Recommendation T.82) or a predetermined number of MPSs occur, in which the number of MPSs is determined for each state (a counter for counting the number of occurrences is provided at each state or each context).

Further, in detail, the symbol is determined based on match (MPS)/mismatch (LPS) of "the data value" and "the prediction value".

However, the correction of the sub-interval size in relation to the present embodiment can be performed even if the extension of the size due to the renormalization is not implemented. Generally, the renormalization is always implemented when the smaller sub-interval is selected as the interval to be corrected.

In the foregoing explanation, the interval size is always corrected when the LSZ interval is selected for the interval A to be updated. Another condition can be applied using the number S of bits of extended shift for the renormalization, in which the correction is implemented if the number S is equal to or greater than a predetermined value, and the correction is not implemented if the number S is less than the predetermined value.

The constant parameters LSZ, S, rLSZ, and dLSZ shown in FIG. 1 have relationship as described above, if at least two parameters are given, the other parameters can be computed. Accordingly, the block diagrams explained above show only an example, and another configuration can be employed such that the LSZ and the dLSZ don't have direct values.

In the foregoing explanation, a condition for terminating the renormalization is set to $0.5 \leq A < 1.0$, and the condition can be $0.5 \leq A < 1.0$. At this time, the interval size A should not exceed 1.0 even if the correction is applied.

As has been discussed, according to the present embodiment, the encoding system and method which is the arithmetic coding system and method divides a interval on the number line, selects the sub-interval corresponding to the occurring symbol, manages/updates the interval size (A) and the interval limit value (C), and outputs a coordinate within the interval as a code, the encoding system and method may include:

a probability learning unit for learning the occurrence probability based on the occurrence status of the symbols;

a sub-interval size (LSZ) computing unit for obtaining the sub-interval size from the occurrence probability of symbol;

a first renormalizing unit (shifter 1) for renormalizing the interval size by multiplying powers of 2 so as to keep the updated sub-interval size equal to or greater than a predetermined value;

a second renormalizing unit (shifter 2) for renormalizing the interval limit value with the same extension rate as the first renormalizing unit;

a correction value computing unit (the correction value calculator) for computing the size to be corrected for the interval size and the interval limit value;

a interval correcting unit (operator 1) for correcting the renormalized interval size; and a interval limit value correcting unit (operator 2) for correcting the renormalized interval limit value together with the correction of the interval size by the interval correcting unit.

Further, according to the present embodiment, the decoding system and method which are the arithmetic decoding system and method divides the interval on the number line, selects the interval including the code value, manages/updates the interval size (A) and the interval limit value (C) with a limited precision, and decodes the code value into the symbol, the decoding system and method include:

a probability learning unit for learning the occurrence probability from the occurrence status of symbols;

a sub-interval size computing unit (LSZ) for obtaining the sub-interval size from the occurrence probability of symbol;

a first renormalizing unit (shifter 1) for renormalizing the updated subinterval size by multiplying powers of 2 to keep the sub-interval size equal to or greater than a predetermined value;

a second renormalizing unit (shifter 2) for renormalizing the interval limit value by extending with the same rate as the first renormalizing unit;

a correction value computing unit (correction value calculator) for computing the size to be corrected for the interval size and the interval limit value;

a interval correcting unit (operator 1) for correcting the renormalized interval size; and a interval limit value correcting unit (operator 2) for correcting the renormalized interval limit value together with the correction of the interval size by the interval correcting unit.

Further, the sub-interval size computing unit computes the subinterval size as a product of the whole interval size and the occurrence probability of the symbol, and the remaining interval size is defined as the other sub-interval size.

The sub-interval size computing unit computes the sub-interval size with a higher precision than the managing precision of the interval size as a product of the whole interval size and the occurrence probability of symbol, and the information of the additional precision is used for computing the correction value by the correction value computing unit (multiplication: corresponding [LSZ+] dLSZ).

The sub-interval size computing unit selects an optimal sub-interval size from candidates of the sub-interval size categorized based on the occurrence probability of symbol, and makes the remaining interval size the other sub-interval size.

The sub-interval size computing unit prepares candidates of the subinterval size categorized based on the occurrence probability of symbol with a higher precision than the managing precision of the interval size, and information of the additional precision is used for computing the correction value by the correction value computing unit ([LSZ+] dLSZ).

The sub-interval size computing unit computes the sub-interval size using the value of the occurrence probability of symbol which is smaller.

The correction value computing unit computes the renormalized interval size and the correction value of the interval limit value for the subinterval computed by the sub-interval size computing unit based on the probability of symbol.

Embodiment 2.

While the sub-interval A1 for the symbol 1 is extended and corrected in the first embodiment, the sub-interval A1 is reduced and corrected. The same correction can be implemented by introducing an LSZ' which is obtained from previously reflecting a reduction amount of the sub-interval A0 to the LSZ. At this time, another correction interval size is applied instead of the dLSZ which is the extended correction amount to the LSZ of the first embodiment. By using a reduced correction amount (dLSZ') from the LSZ', an operation load to the sub-interval A0 side (=A−LSZ') on applying the correction can be decreased, which facilitates the operation. The following shows its definition:

$$LSZ'=INT(P\times 2^N)+1(=LSZ+1)$$

$$dLSZ'=(LSZ'\times 2^S)-rLSZ$$

According to the second embodiment, the dLSZ' is a minute interval to be truncated.

Figure 11:
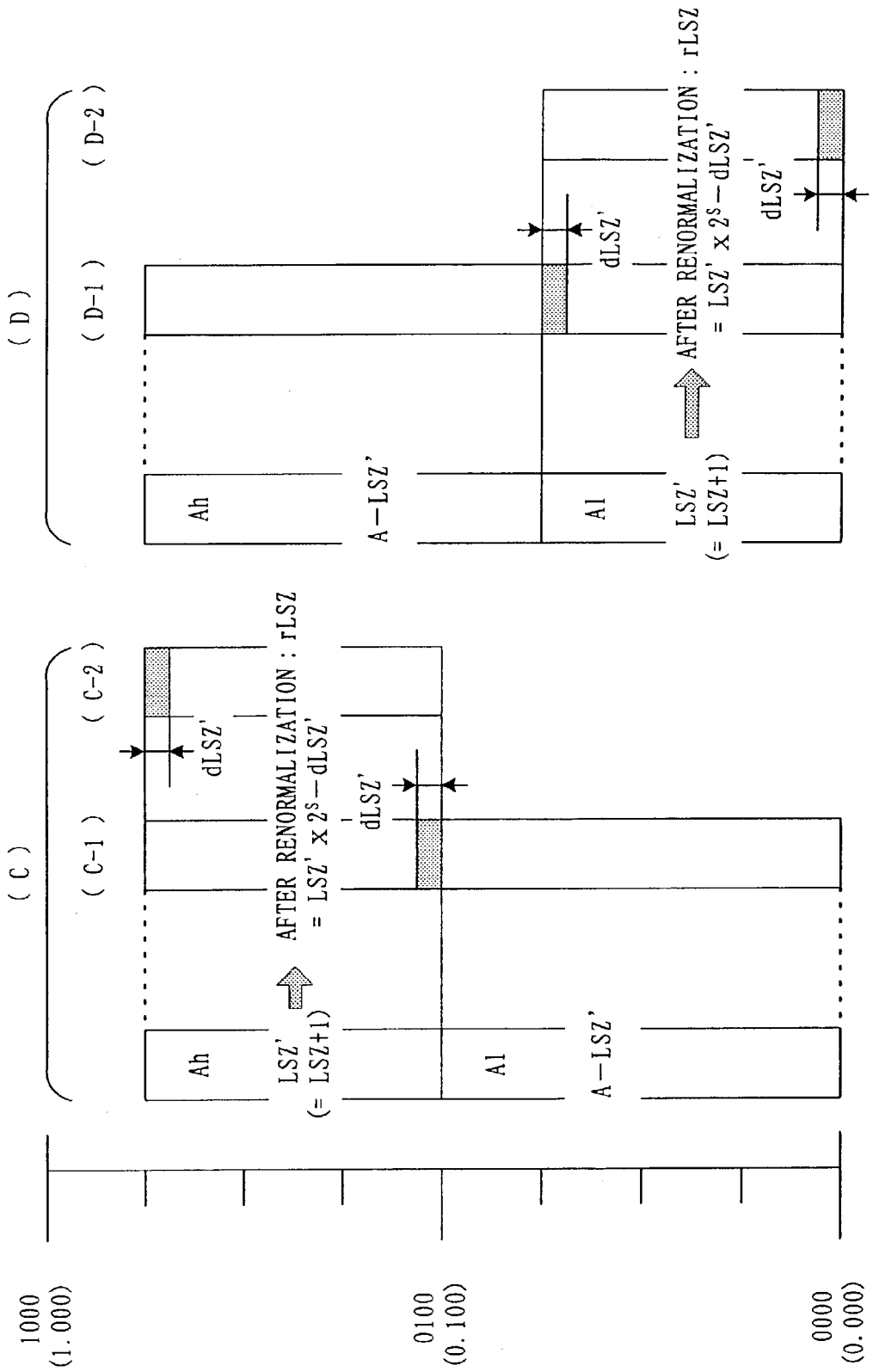
FIG. 11 shows a concept of encoding in which dLSZ' is introduced.

A concept of encoding applying this correction value dLSZ' is shown in FIG. 11.

Figure 12:
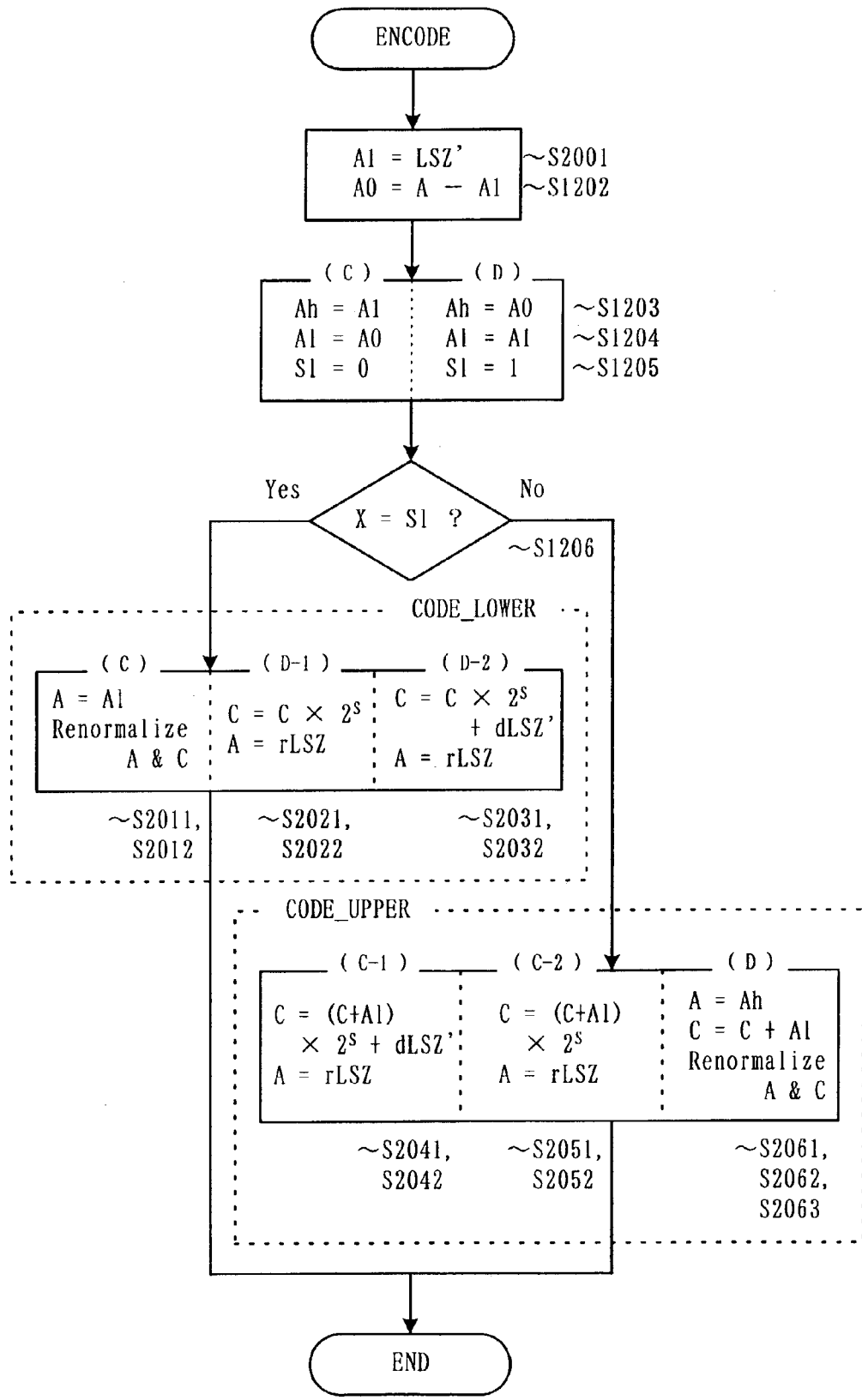
FIG. 12 shows an encoding procedure in which dLSZ' is introduced.
Figure 13:
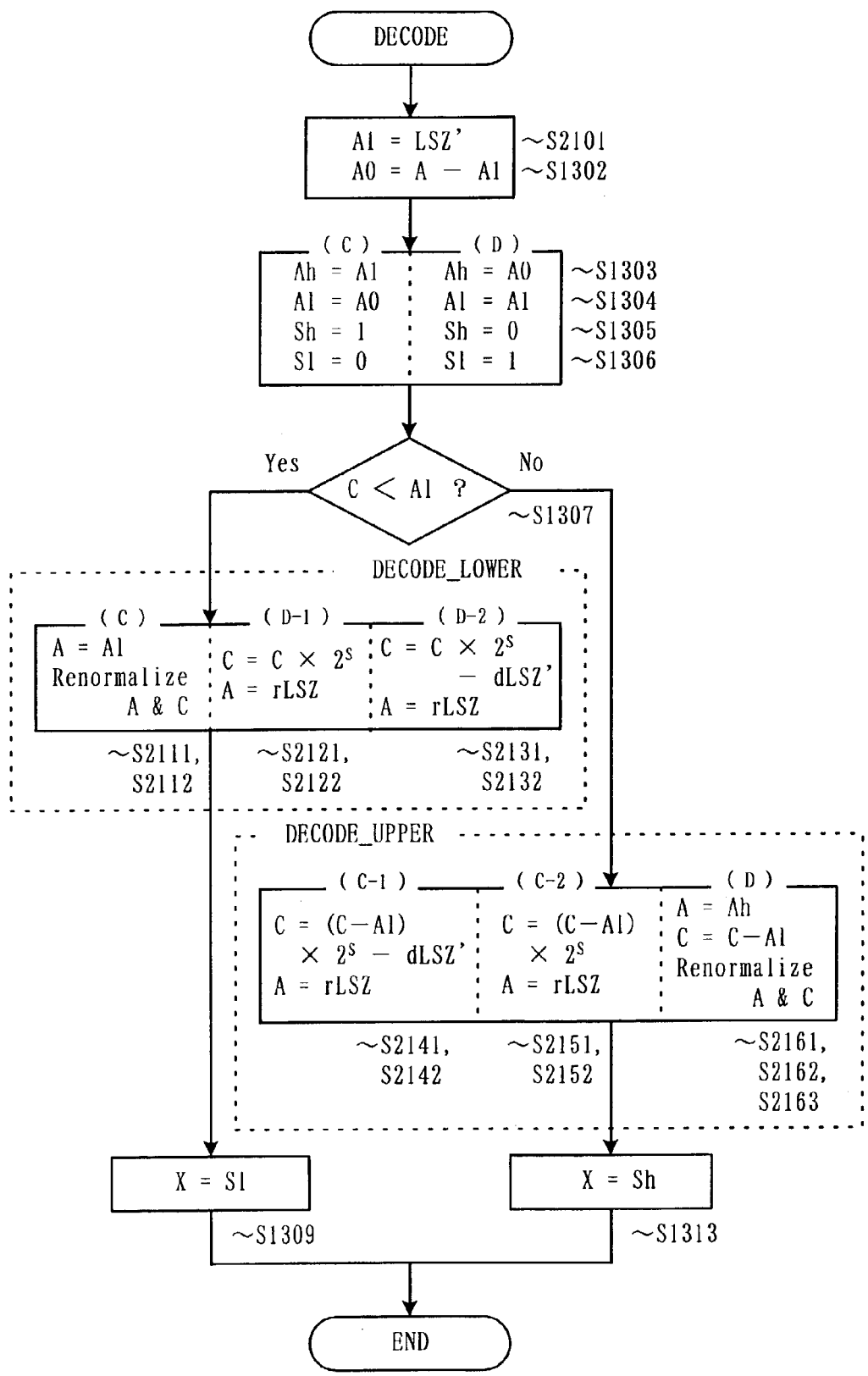
FIG. 13 shows a decoding procedure in which dLSZ' is introduced.

FIGS. 12 and 13 show procedures of the subtraction-based arithmetic coding/decoding shown in FIGS. 27 and 28, to which (C) or (D) in FIG. 11 is introduced.

At S2001 in the encoding procedure and at S2101 in the decoding procedure, LSZ' which is LSZ extended by 1 is previously made constant. From S1203 through S1205 and from S1303 through S1306, the upper/lower location symbol is defined, and in case of (C) in the left, symbol 0 is placed at the lower part, and in case of (D) in the right, symbol 1 is placed at the lower part, and subsequently, the same procedure as (C), (D) is followed. (C-1), (C-2), and (D-1), (D-2) show different procedures according to the upper/lower location of the minute interval which is truncated at correcting time. The procedures shown here is to obtain the code as the sub-interval size to be updated and its lower limit value, and it can be implemented by another equivalent operation procedure or representation.

In the processes enclosed with broken lines in the figures, CODE_LOWER and DECODE_LOWER show encoding and decoding to the lower sub-interval, and CODE_UPPER and DECODE_UPPER show encoding and decoding to the upper sub-interval.

The encoding procedure in FIG. 12 and the decoding procedure in FIG. 13 can be implemented by the block diagrams which have the same configurations as ones shown in FIGS. 5 and 6, except that the LSZ and the dLSZ which are not directly related to the explanation of the operation of figures, concrete values of computed corrected values, and the operation for correction (addition/subtraction) are different. Here, the data A, k, and the second comparator 18 which are shown by broken lines are not used. The LSZ and the dLSZ now become the LSZ' and the dLSZ', the correction value is similarly output by the correction value calculator, and computed through the processes CODE_LOWER, CODE_UPPER, DECODE_LOWER, and DECODE_UPPER shown in FIGS. 12 and 13, and the registers A and C obtain the result.

Further, the encoding and decoding procedures with "conditional MPS/LPS exchange" which has been explained in the first embodiment and shown in FIGS. 7 and 8 can be replaced by the processes CODE_LOWER, CODE_UPPER, DECODE_LOWER, and DECODE_UPPER shown in FIGS. 12 and 13 according to the second embodiment. The encoding procedure and the decoding procedure can be implemented by the block diagrams which have the same configurations as ones shown in FIGS. 9 and 10, except the LSZ and the dLSZ, concrete values of computed corrected values, and the operation for correction (addition/subtraction). Here, the data A, k, and the comparator 2 which are shown by broken lines are not used. The LSZ and the dLSZ now become the LSZ' and the dLSZ', the correction value is similarly output by the correction value calculator, computed through the processes CODE_LOWER, CODE_UPPER, DECODE_LOWER, and DECODE_UPPER shown in FIGS. 12 and 13, and the registers A and C obtain the result.

Embodiment 3.

The relation between the dLSZ of the first embodiment and the dLSZ' of the second embodiment can be represented as follows using the number S of bits of extended shift for the renormalization process of the LSZ which is the upper digits of the dLSZ. The effective precision of the dLSZ is also S bits.

$$dLSZ+dLSZ'=2^S$$

Here, as the LSZ becomes larger, namely, the more LSZ approaches to HALF, the smaller the number S of extended shifts becomes. On the other hand, since the interval having the size of (A-LSZ) (hereinafter, referred to as a non-LSZ interval) becomes small, the number of extended shifts should be increased for the renormalization. At this time, the minute interval which has been truncated in the first and the second embodiments, namely, (1−dLSZ) or the dLSZ' is applied as the correction amount to the lower bit which has become bit 0 due to the renormalization of the non-LSZ interval, and thus the effective precision can be utilized more, and the encoding efficiency is increased. The LSZ interval which has been corrected in the first and the second embodiments is not corrected here. If both subintervals are corrected, it becomes impossible to determine proper decoding before implementing the renormalization.

In principle, when the interval A is HALF at minimum, the non-LSZ interval size can be 1 if the LSZ interval size is maximum. Accordingly, the renormalization of the non-LSZ interval requires (N−1) bits for the number of extended shifts, which becomes greater than the number S of extended shifts at the renormalization of LSZ. Therefore, the effective precision which has been discussed in the first embodiment cannot be applied, so that it is preferable to refer to the occurrence probability P of symbol 1 with precision of N bits of fractional bit for LSZ and (N−1) bits of fraction for dLSZ. Of course, it is also possible to refer to the occurrence probability P of symbol 1 with precision of S bits for the dLSZ and more bits independently.

It is assumed the number of bits of extended shift for the renormalization of the LSZ interval and the non-LSZ interval are S and T, respectively. In general, the LSZ interval size is smaller than the non-LSZ interval size, and S≦T. Here, another case will be explained in which the LSZ interval is corrected in case of S≧T, and the non-LSZ interval is corrected in case of S<T, so that the correction is effectively made for the sub-interval, in which otherwise higher precision will be decreased. In encoding/decoding, since the sub-interval is always divided in the same way, it is possible to apply the above adaptive switching of the interval to be corrected.

Figure 14:
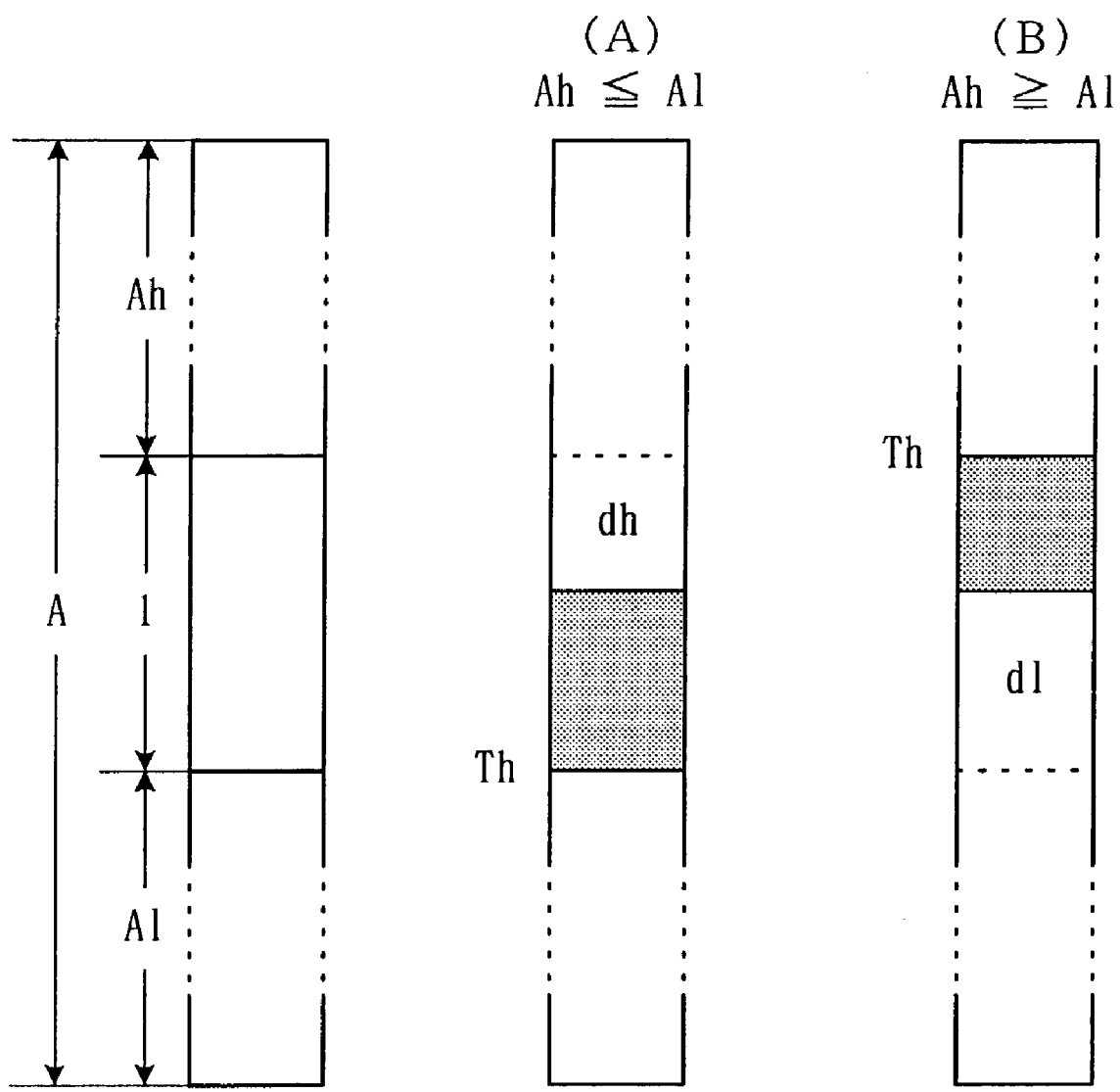
FIG. 14 shows an adaptive correction and a threshold value of subinterval.

FIG. 14 shows the adaptive correction and a sub-interval threshold value.

Since the interval of size 1 shown in FIG. 14 corresponds to $1\times2^S$ or $1\times2^T$ and is larger than the dLSZ or the dLSZ', a interval (gray part) which is removed from one interval and is not assigned to any symbol is truncated. In the figure, the upper sub-interval in case of (A) or the lower sub-interval in case of (B) is a smaller sub-interval, which is corrected by dh, dl, respectively, and Th is set as the limit value between the two sub-intervals. In the figure, although an equal sign is included in both (A) and (B) to show the relationship of sizes of Ah and Al, actually only one of them should include the equal sign. This discrimination between the two sub-intervals can be performed by comparing the numbers S and T of bits of extended shift for the renormalization. In such a case, it should be determined previously which interval has a priority in case of S=T; such that the LSZ interval should have a priority in case of S=T. It can be determined in another way, if S=T, the sub-interval of which the minute interval to be truncated is smaller should be selected, or on the contrary, the sub-interval of which the minute interval to be truncated is larger should be selected.

In principle, the correction can be applied to both the LSZ interval and the non-LSZ interval at the same time. However, it may cause a problem that the symbol cannot be determined with the precision of encoding which is kept at decoding time when both intervals are to be corrected. Therefore, only one of the two sub-intervals should be corrected. Here, if the correction is applied to both sub-intervals, in order to select a proper symbol for decoding, the precision should be increased up to the extent the correction could cover.

Figure 15:
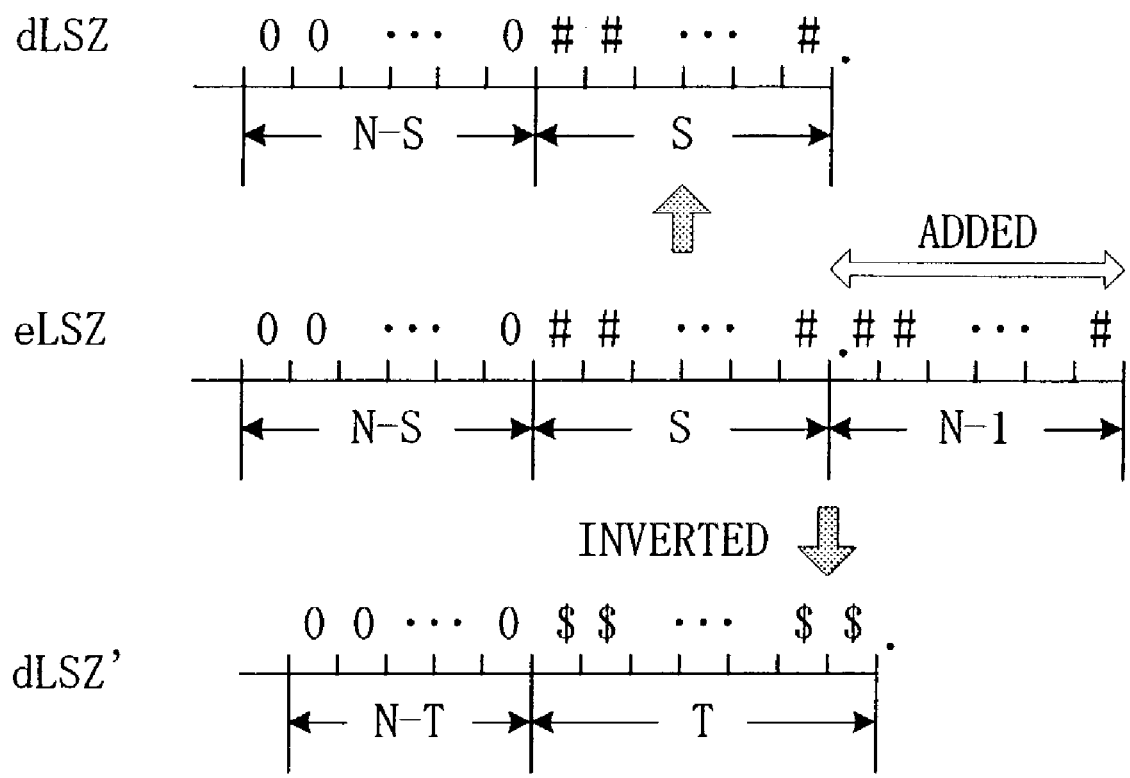
FIG. 15 shows a definition of eLSZ.

FIG. 15 shows a concept of eLSZ when the precision of the correction value dLSZ is increased.

The correction value dLSZ' for the non-LSZ interval manages the dLSZ with the maximum precision ($2^N-1$) (or $2^N$) bits since T value differs according to the interval size which is referred. The dLSZ' obtains the lower T bits by inverting each bit of the dLSZ. Assuming the upper N digits of the eLSZ with the same precision as the dLSZ is an integer, the following shows an arithmetic equation to obtain the correction value dLSZ and dLSZ'. In the figure, an exclusive OR (EOR) is applied to an inversion of the lower T bits, and the upper (N−T) bits are kept with the bit value 0.

$$dLSZ=INT(eLSZ)$$

$$dLSZ'=EOR(INT(eLSZ\times2^{T-S}),2^T-1)$$

where, EOR means an exclusive OR function.

When the precision of the eLSZ cannot be set up to the above maximum precision due to the configurational limitation, the above equation is applied assuming that there is the bit value 0 at missing lower digit. Here, it should be noted that the correction values dLSZ and dLSZ' are integers which have weights of S bits and T bits after the extended shift has been performed as the renormalization, and these correction values do not satisfy the first equation (dLSZ+dLSZ'=$2^S$) of the third embodiment. Further, when the S value and the T value which are the numbers of bits of extended shift for renormalizing each interval size are equal, the interval size can be effectively assigned without any truncation because the both values have the same precision for representation. However, the S value and the T value are usually different, it cannot be avoidable to generate the minute interval "e" to be truncated caused by the following error due to the cancellation of significant bits even if the two values combined together after matching their weights. Therefore, since the inversion precedes the subtraction in simplicity of implementation, an explanation will be made as an example in which the above inverted value is used including S=T.

$$dLSZ+dLSZ'+e=2^S$$

In the above equation, "e" shows an error.

The dLSZ and the dLSZ' are redefined as the correction values for the LSZ interval and the non-LSZ interval, respectively, and the number of shifts are different for the renormalization. If the precision for the value whose number of shifts are small is taken, the precision for the value whose number of shifts are large becomes ineffective, so that if the correction values are set so as to match the number of shifts, the error "e" occurs. For example, the number of extended shifts for the renormalization are assumed to be 4 and 1, respectively for the LSZ interval and the non-LSZ interval (and the LSZ is treated as an integer up to the lowest bit and shown in 4 digits, with binary points aligned), it is assumed the dLSZ is 0110, and the dLSZ' is 1.ooo. "o" of "1.ooo" shows 0 (zero) which is not taken in by the renormalization. Even if these two values are added, the result does not reach 1.0000 (or 1111 if the dLSZ' value is generated by the inversion). This 1.0000 corresponds to Sth power of 2. This displacement (error) is shown as "e". Accordingly, dLSZ=0.0110, dLSZ'=0.1ooo, and e=0.0010 (in case the sum is 1.0000).

Figure 16:
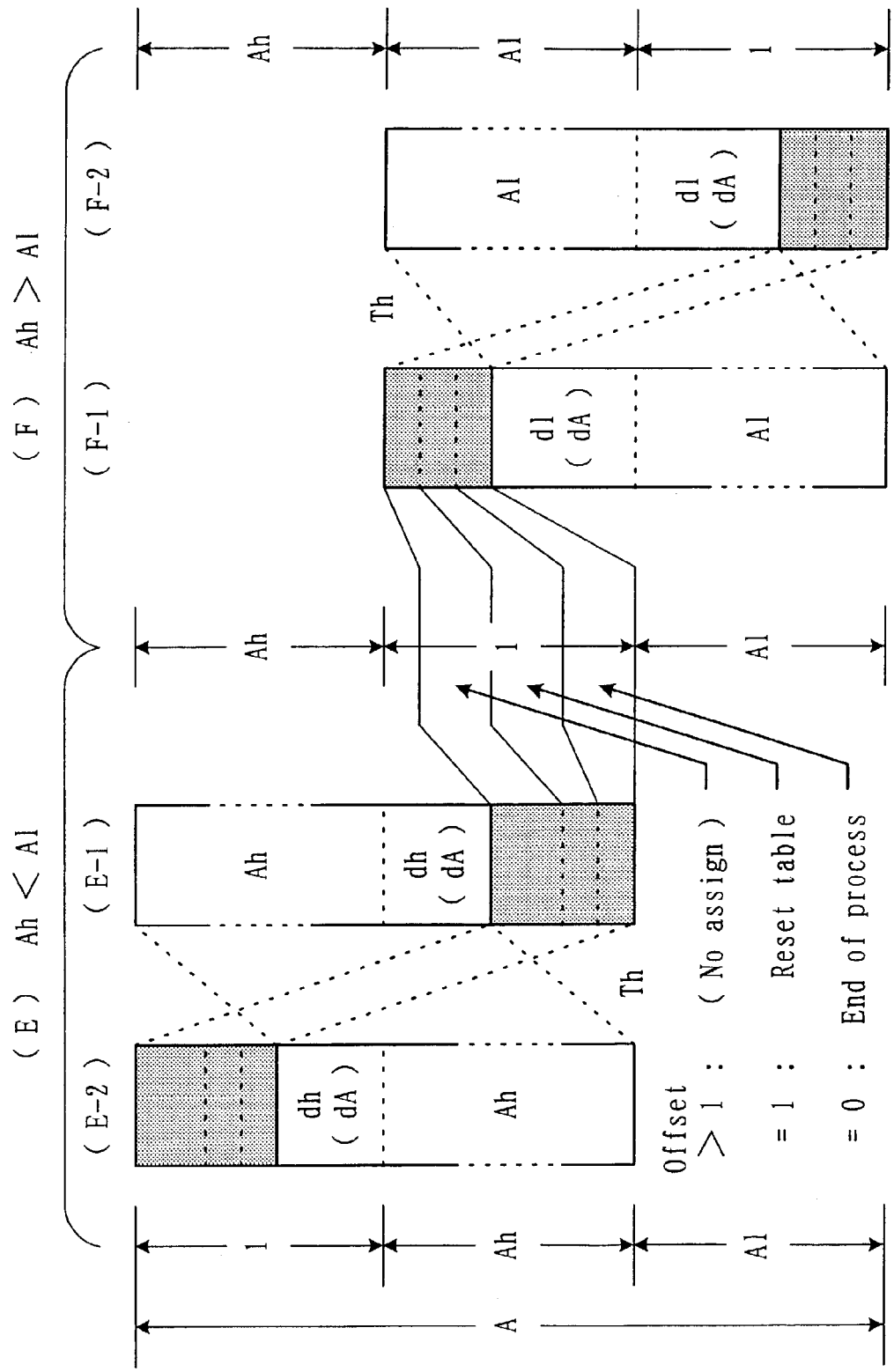
FIG. 16 shows a concept of an adaptive correction.

FIG. 16 shows a concept of the adaptive correction.

Figure 17:
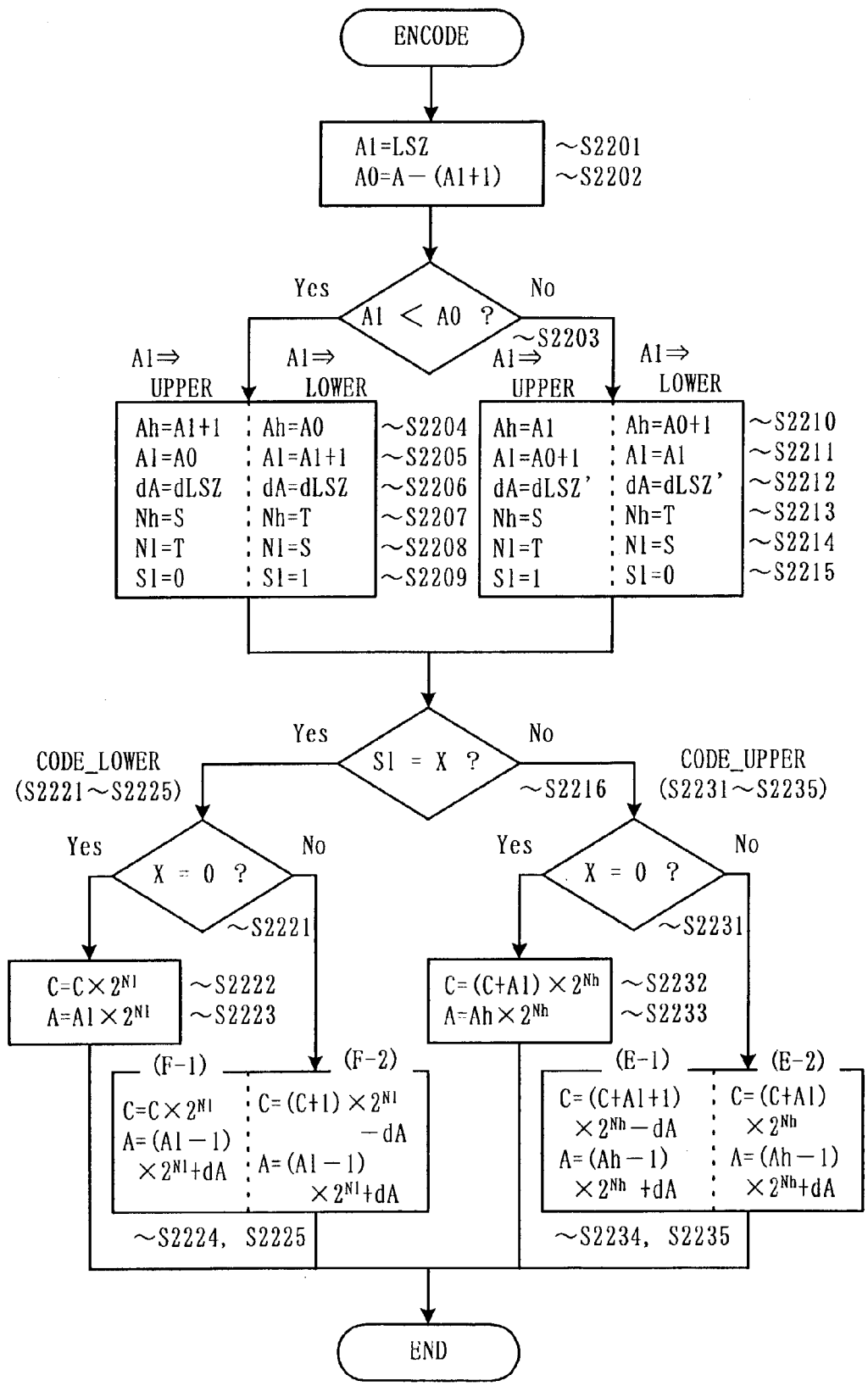
FIG. 17 shows an encoding procedure in which an adaptive correction is introduced.
Figure 18:
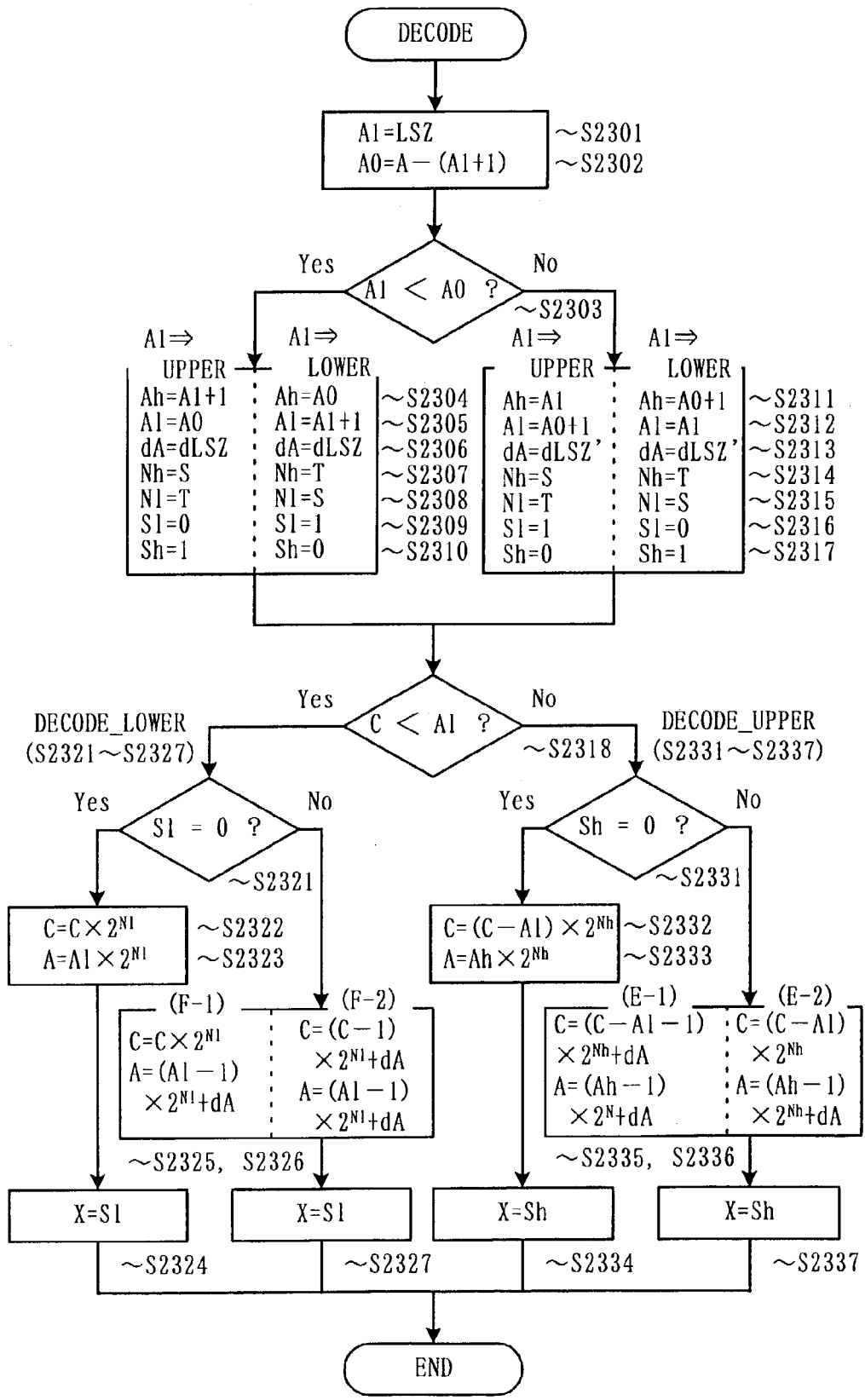
FIG. 18 shows a decoding procedure in which an adaptive correction is introduced.

FIGS. 17 and 18 show procedures for operations of (E) and (F) shown in FIG. 16 when the operations are introduced into subtraction-based arithmetic coding and decoding. In order to correct smaller sub-interval, "conditional MPS/LPS exchange," which is applied in the first and the second embodiments, is applied at the same time. Further, the following explains cases when the sub-interval to be corrected is the upper sub-interval and the lower sub-interval, and when the correction is applied to the upper part and the lower part.

At S2201 and S2202 in FIG. 17 and S2301 and S2302 in FIG. 18, cases are separated by the LSZ sub-interval (A1), the non-LSZ sub-interval (A0), and the interval of size 1 to be corrected, and through operations at S2204, S2205, S2210, and S2211 in case of encoding, and at S2304, S2305, S2311, and S2312 in case of decoding, the interval of size 1 is relocated at the upper or lower sub-interval which is smaller.

At the same time, the correction size dA, the number Nh and Nl of bits of shift for the renormalization for each sub-interval, and corresponding symbols Sh and Sl are set. Since the correction is applied to the smaller sub-interval, and is applied to the LPS due to "conditional MPS/LPS exchange," the correction size dA becomes the dLSZ in case of the LSZ subinterval, and the dLSZ' in case of the non-LSZ sub-interval. The number of bits of extended shift for the renormalization becomes Sl for the lower subinterval and Sh for the upper sub-interval, and the correction is made to the LPS at S2224, S2225 and S2234, S2235 in case of encoding, and at S2325, S2326 and S2335, S2336 in case of decoding.

In the above explanation, the correction is applied to smaller subinterval, however, regardless of the sub-interval size, for example, if there is little difference between the two sub-intervals, and Nh and Nl are equal, the correction can be made for the LSZ interval.

In the foregoing embodiments, the initialization process or the post processing during the encoding process or the decoding process can be performed normally.

As discussed above, the correction value computing unit computes the correction value for the renormalized interval size and the interval limit value for the smaller sub-interval which is computed by the sub-interval size computing unit.

The correction value computing unit has a feature to compute the correction value for the renormalized interval size and the interval limit value by reducing the interval size of the sub-interval to be corrected.

Further, the correction value computing unit has a feature to compute the correction value for the renormalized interval size and the interval limit value by extending the interval size of the sub-interval to be corrected.

Further, the correction value computing unit secures the minute interval which is not assigned to any of the sub-intervals and truncates the minute interval.

Embodiment 4.

In the foregoing explanation of normal processing according to the first, the second, and the third embodiments, a code value is not assigned to the minute interval which is truncated by the correction. Namely, in the first through third embodiments, the interval size (A) is divided into three Ah, Al, and the interval to be truncated, and the code value is set in either Ah or Al, so that the code value is never assigned to the interval to be truncated.

If the code value is set intentionally within the interval to be truncated in the encoding process, it is possible to detect such a code value within the interval to be truncated in the decoding process. This detection can be used for synchronizing an interrupt processing between the encoding process and the decoding process, for example, used for terminating the encoding process and the decoding process, initializing the variable table in the middle of the process.

Figure 19:
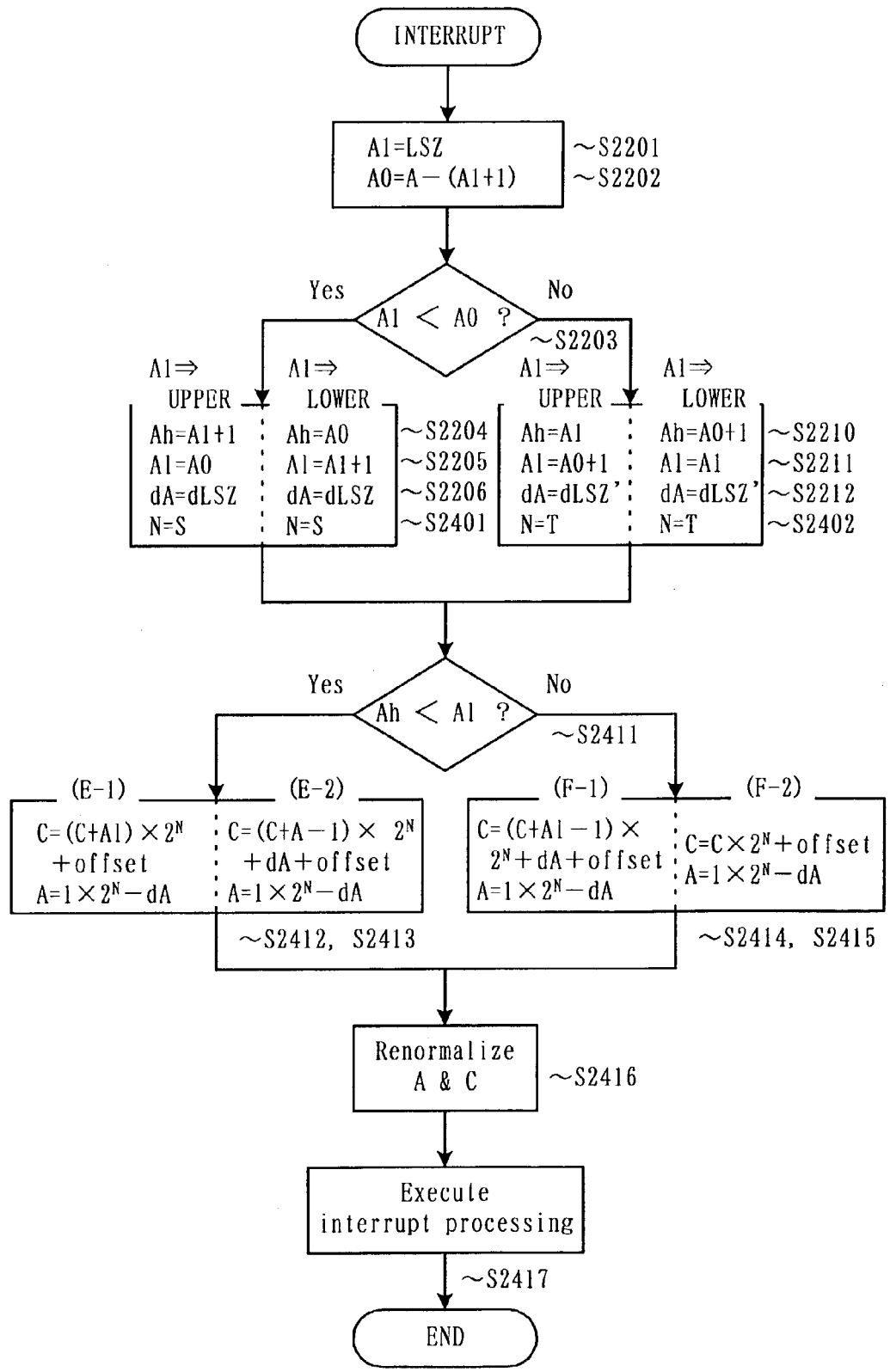
FIG. 19 shows encoding with an interrupt processing.

FIG. 19 is a flow diagram showing one example of an interrupt processing during the encoding process.

Implementation of the interrupt processing will be explained referring to FIG. 19 and comparing with FIG. 17 for the encoding process.

In FIG. 19, the operations at S2201 through S2206 and S2210 through S2212 are the same as the ones in FIG. 17. At S2401 and S2402, the number of bits S or T of extended shift for the renormalization of the interval to be corrected is set to N. At S2411, the smaller sub-interval is selected between Al and Ah. Here, "offset" is assumed to be 0 and the code value C is updated for the lower limit value of the interval to be truncated. After setting the interval size, the interval size A and the code value C are renormalized at S2416, and at S2417, the interrupt processing is performed.

On the other hand, in the decoding process, DECODE_LOWER of S2321 through S2327 and DECODE_UPPER of S2331 through S2337 in FIG. 18 will be explained as separate operations referring to FIGS. 20 and 21.

Figure 20:
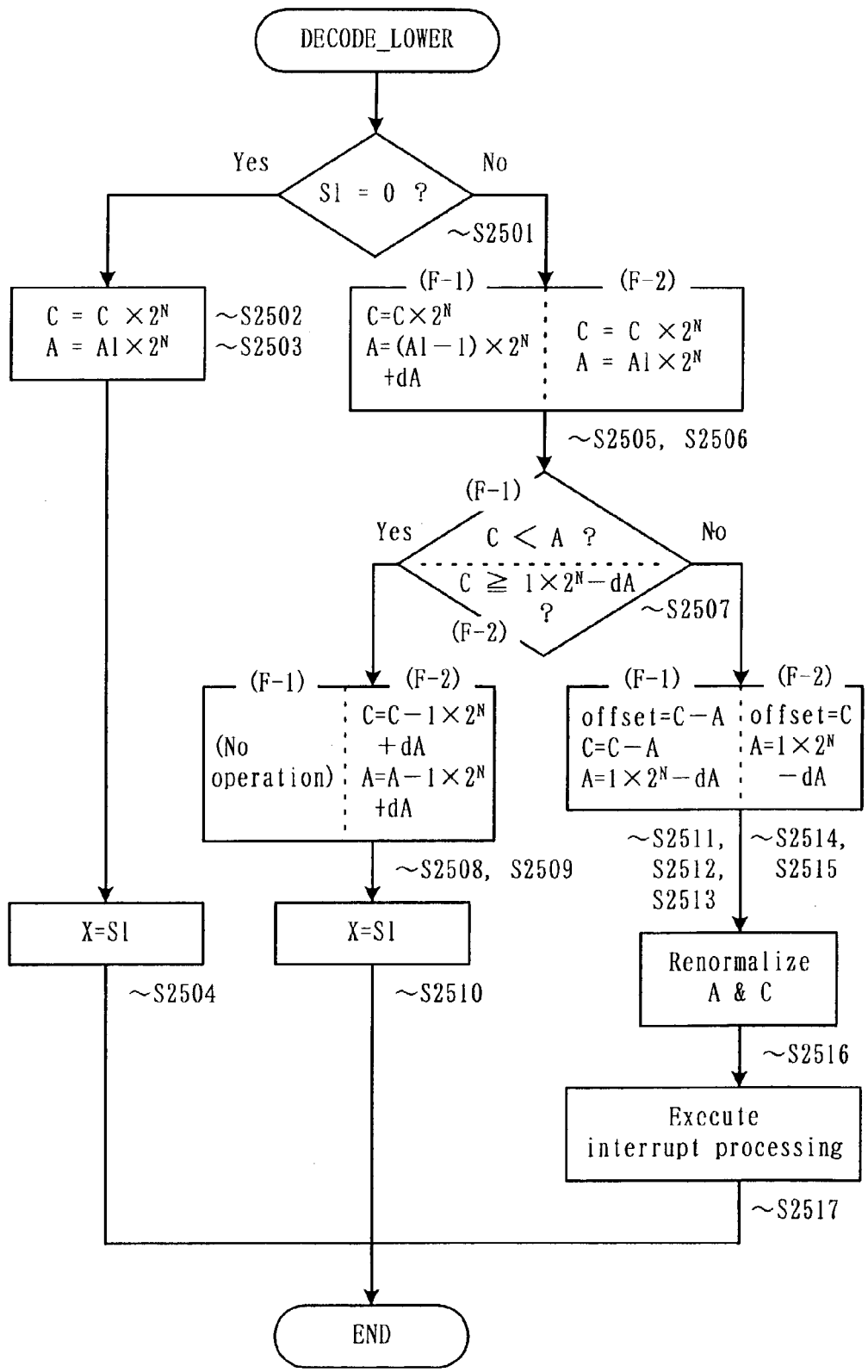
FIG. 20 shows DECODE_LOWER processing.

The operation of S2501 through S2510 in FIG. 20 corresponds to the operation of S2321 through S2327 in FIG. 18. The operation of S2601 through S2610 in FIG. 20 corresponds to the operation of S2331 through S2337 in FIG. 18. At steps S2511 through S2517 and S2611 through S2617, the interval A and the code value C are updated and renormalized, and the interrupt processing which is detected at S2507 and S2607 is performed.

In the above explanation, the interrupt processing is performed on the correction of the smaller interval between the LSZ sub-interval and the non-LSZ sub-interval, however, if the correction is applied only to the LSZ interval as the first and the second embodiments, the interrupt processing can be synchronized by setting the code value within the interval to be truncated.

As for the most general synchronizing operation, there are termination of inputting symbols, initialization/re-initialization/switch of the variable parameter tables, switch of the constant parameter tables, and so on. The timing for these operations is synchronized through the notification of the interrupt processing, which has been explained above.

The detection of the code value within the interval to be truncated can be used also for an error detection at a certain interval, scrambling the contents of data by intentionally inserting an ineffective symbol, and so on.

Figure 22:
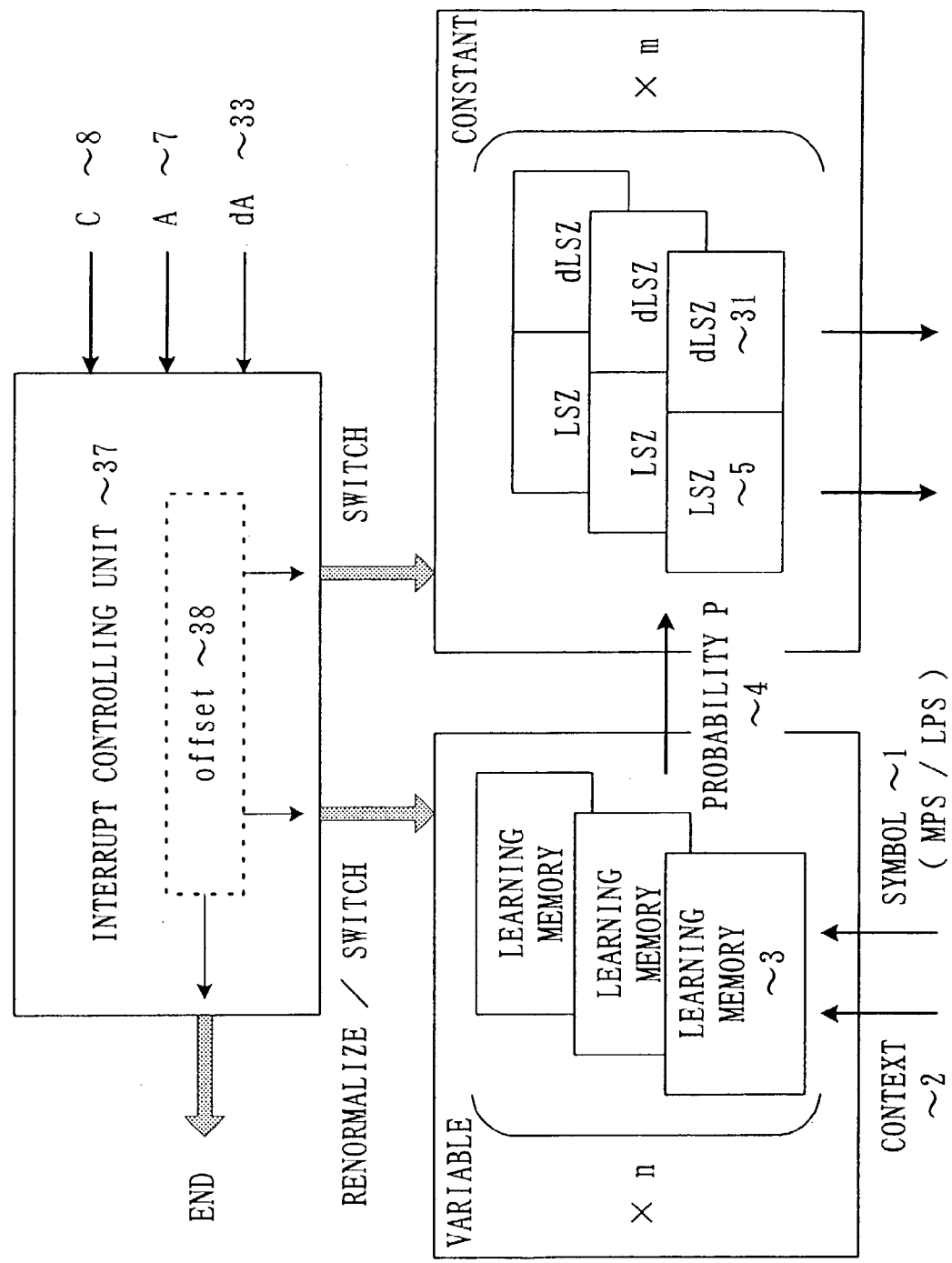
FIG. 22 shows interrupt control.
Figure 23:
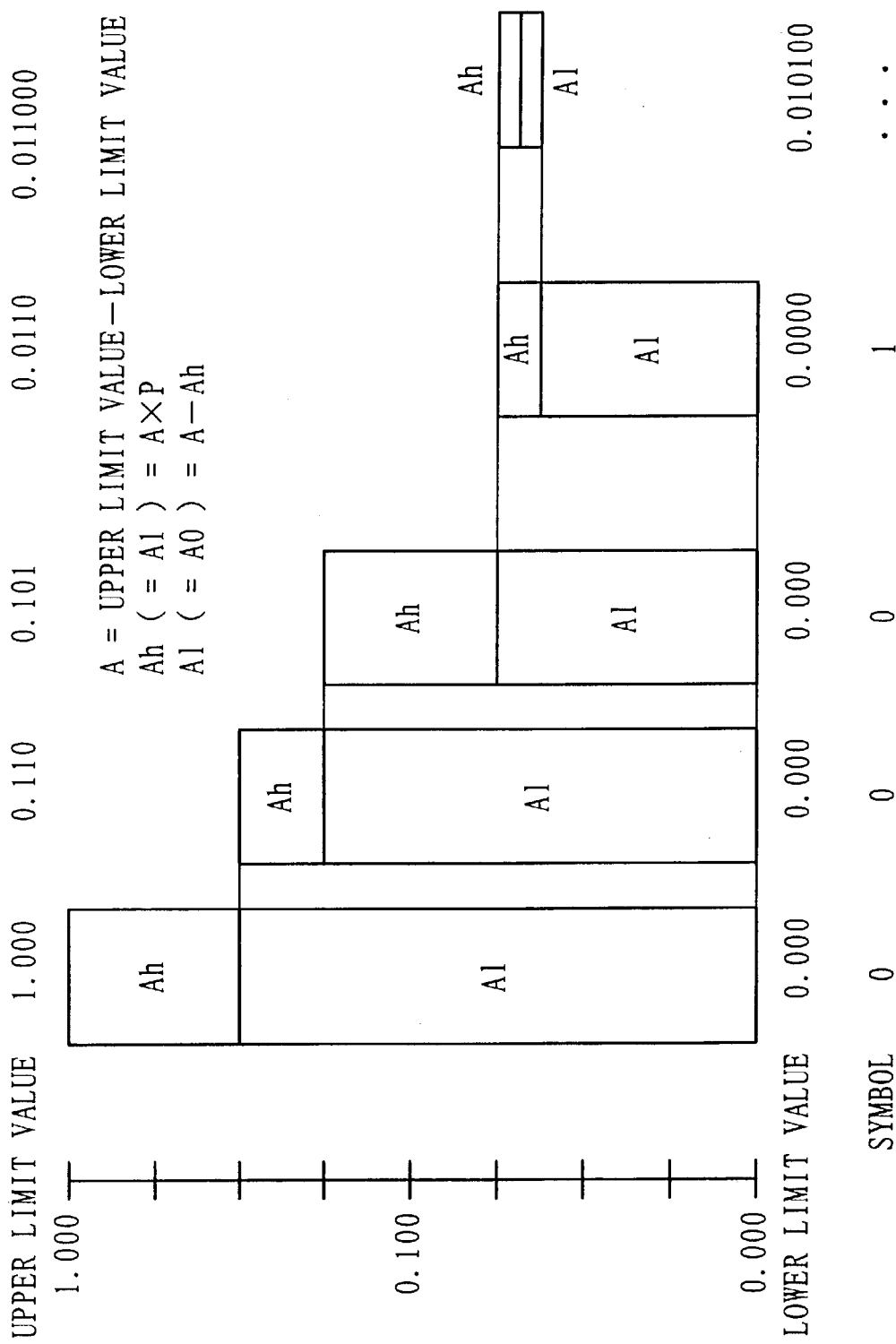
FIG. 23 shows a concept of interval division in multiplication-based arithmetic coding.
Figure 24:
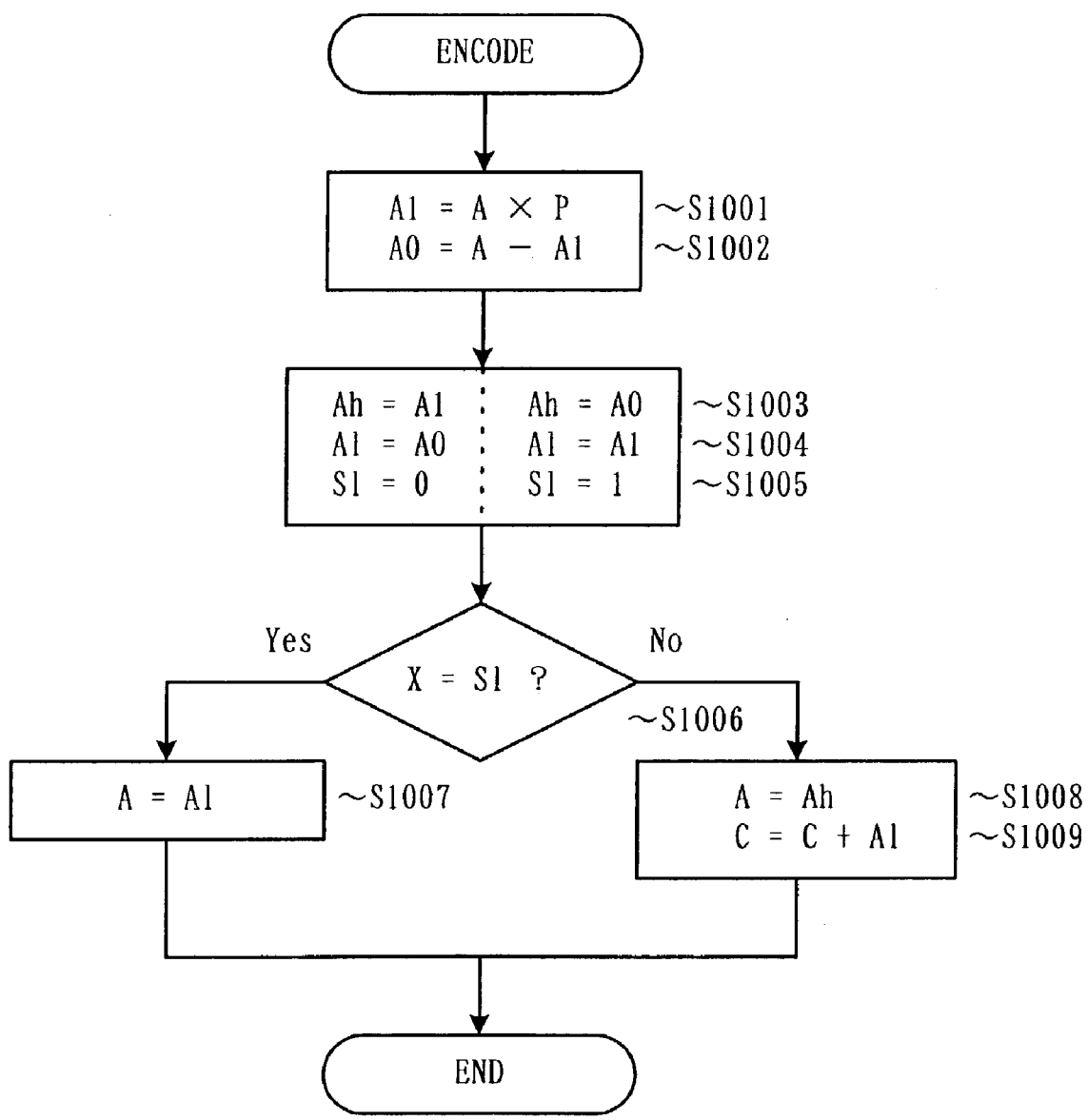
FIG. 24 shows a procedure of multiplication-based arithmetic coding.
Figure 25:
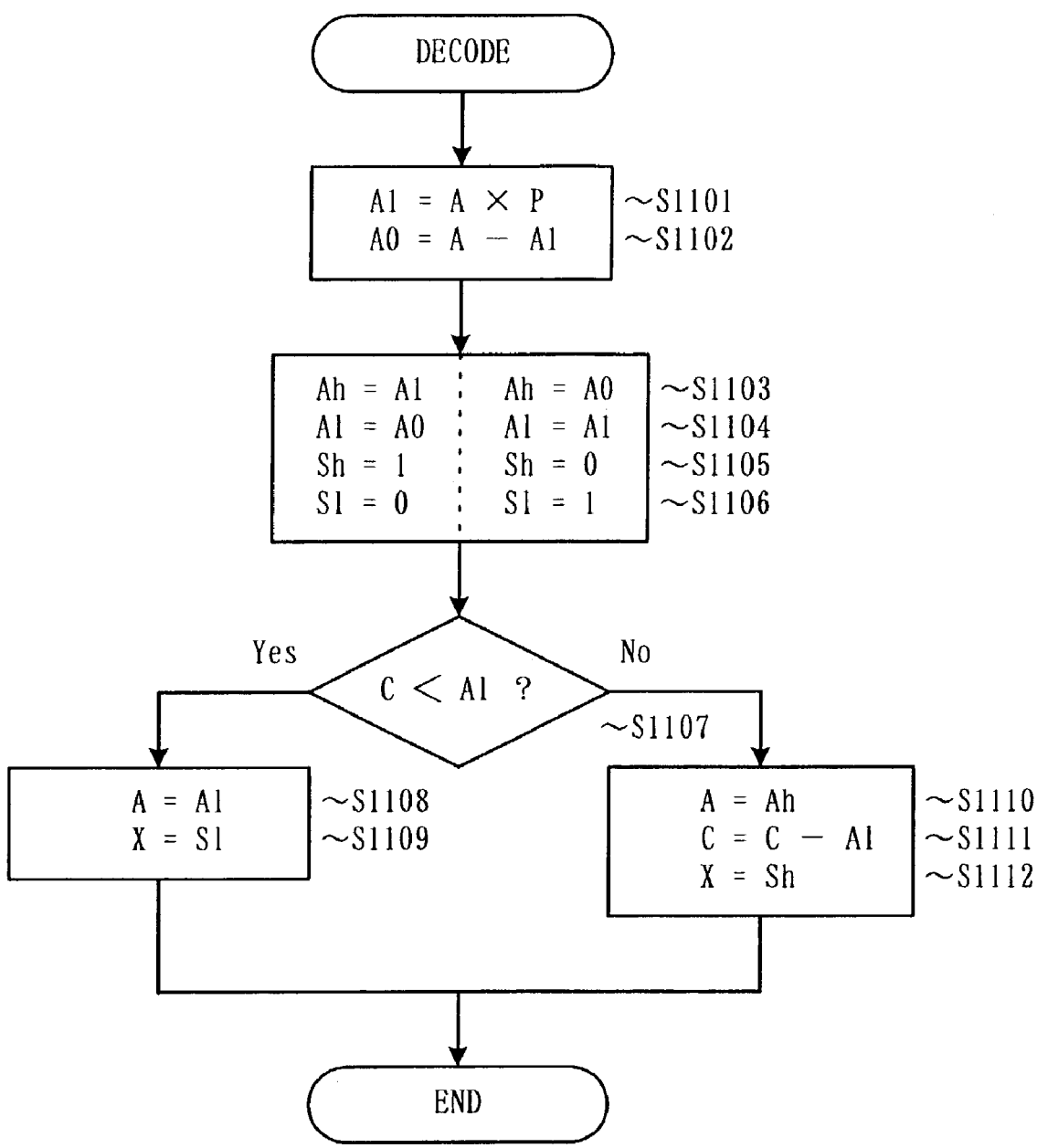
FIG. 25 shows a procedure of multiplication-based arithmetic decoding.
Figure 26:
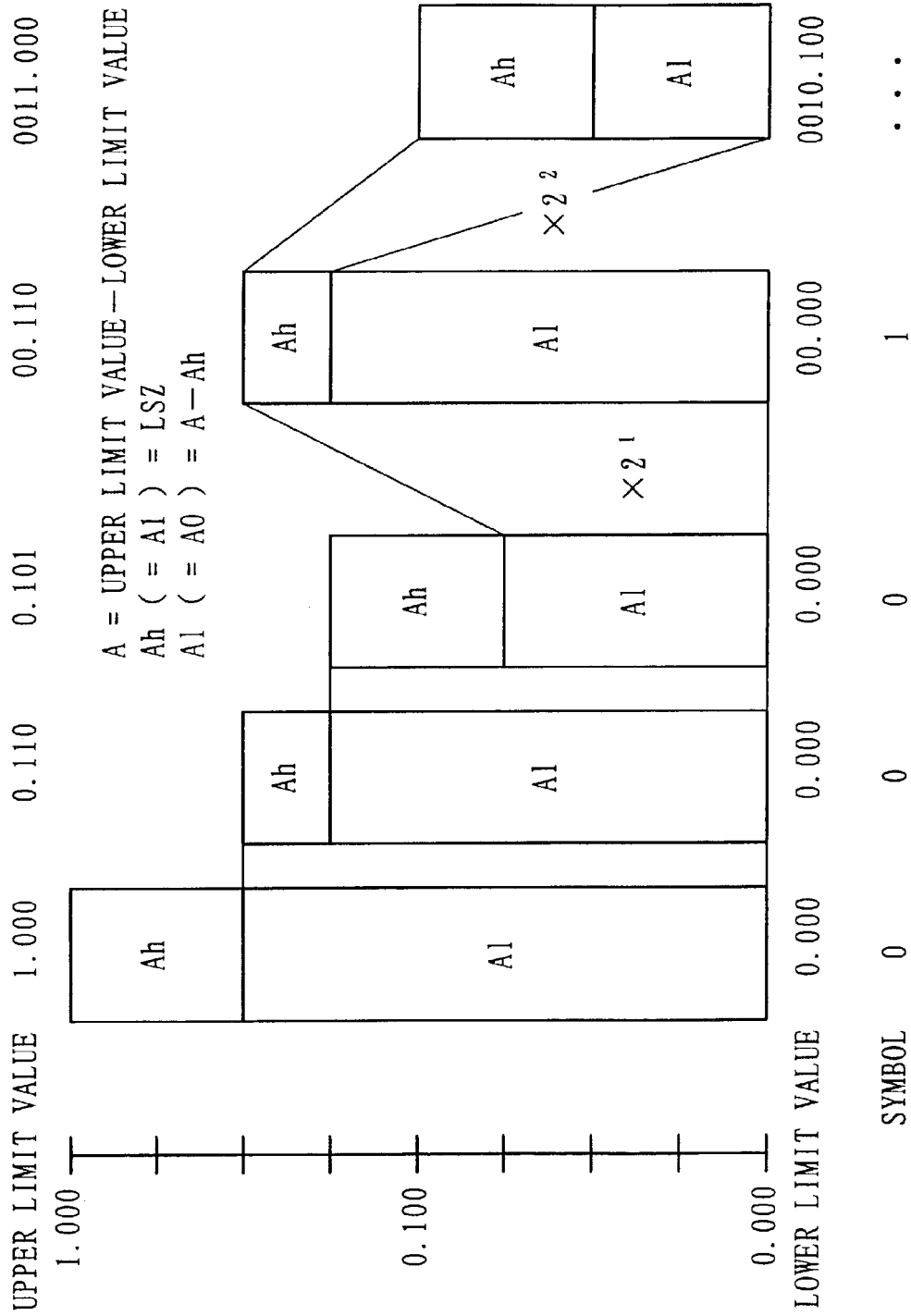
FIG. 26 shows a concept of interval division in subtraction-based arithmetic coding.

Further, after detection of the code value for synchronization, it is possible to add information for identifying the contents of the synchronized operation using subsequent some symbols. FIG. 22 shows a block diagram of the encoding/decoding process including an interrupt controlling unit 37 for controlling the learning memory, the LSZ, dLSZ tables shown in block diagrams of FIGS. 5, 6, 9, and 10.

FIG. 22 shows an example of interrupt controlling.

Here, "offset 38" shows a kind of the interrupt processing as an interrupt identifier within the interval to be truncated. The operation which requires to interrupt the current processing is, for example, an initialization or a switch of the variable parameters, a switch of the constant parameters, an error detection, a data scramble, a termination process, etc. Concretely, a switch of n number of the learning memories (variables), an initialization, a switch of m number of the LSZ, dLSZ tables (constants), termination of the process are notified by the interrupt. The "offset" values shown at S2412, S2414 in FIG. 19, S2511, S2514 in FIG. 20, and S2611, S2614 in FIG. 21 are used for "offset" in FIG. 22.

For example, the lower limit value of the gray part of the interval to be truncated in FIG. 16, which has been explained above, is defined as "offset" and notified, by which "0" means to terminate the process and "1" means to reset the tables. This definition is shared by both the encoding side and the decoding side as the identical information. "Offset" shown in FIG. 16 is used for selecting or switching one of multiple interrupt processing for the interrupt processing to be applied.

The "offset" described above is a kind of "number for the interrupt processing," however, if the gray part of the interval size (the size of the interval to be truncated) is large enough, multiple definitions can be assigned other than 1-to-1 correspondence. For example, the gray part of the sub-interval size can be divided equally into the number of the predefined interrupt processing such as: 0–3 means to terminate the process, 4–7 means to reset the tables (in case of ignoring [truncating] the offset lower 2 bits from the lower limit value of the gray part of the interval to the code value), and further, the gray part can be divided unequally.

When the code value is set within the interval to be truncated, the interval to be truncated can be treated as a normal interval and renormalized, and after the interrupt processing is performed, the encoding/decoding can be continued.

If there is no need to notify the kind of the interrupt processing, the code value can be a value within the specific interval, and the conventional final code value determination process can be applied. According to the conventional final code value determination process, a code value, which tails continuous bits 0 or 1 as long as possible, can be selected within the final interval. However, if it is required to discriminate one of multiple synchronous processing using the offset value within the interval to be truncated, the code value should be determined and output with its exact code value at terminating the encoding process so that the offset value would not change.

Another example of encoding and decoding processes will be explained, in which the code value is set within the interval to be truncated to notify the synchronous timing using the interrupt.

In the encoding process, as shown in INTERRUPT procedure of FIG. 19, the code value is updated to the lower limit value of the upper subinterval or the lower sub-interval including the interval to be truncated, renormalized, and then the code value is set to the lower limit value of the interval to be truncated, and the offset value is added to the code value to show a kind of the interrupt processing, if necessary. The code value should not exceed the upper limit value of the interval to be truncated when the offset value is added, however, if it is previously anticipated that to add the offset value results in exceeding the upper limit value, the correction value should be set small. When the number of shifts for the renormalization is N and the maximum value of the offset is w, the correction value is set previously to be equal to or less than the maximum value of the correction value ($2^N-w$). In case of using the offset value, the final code value should be output with its exact value without converting the value to the coordinate within other interval as explained before.

Figure 21:
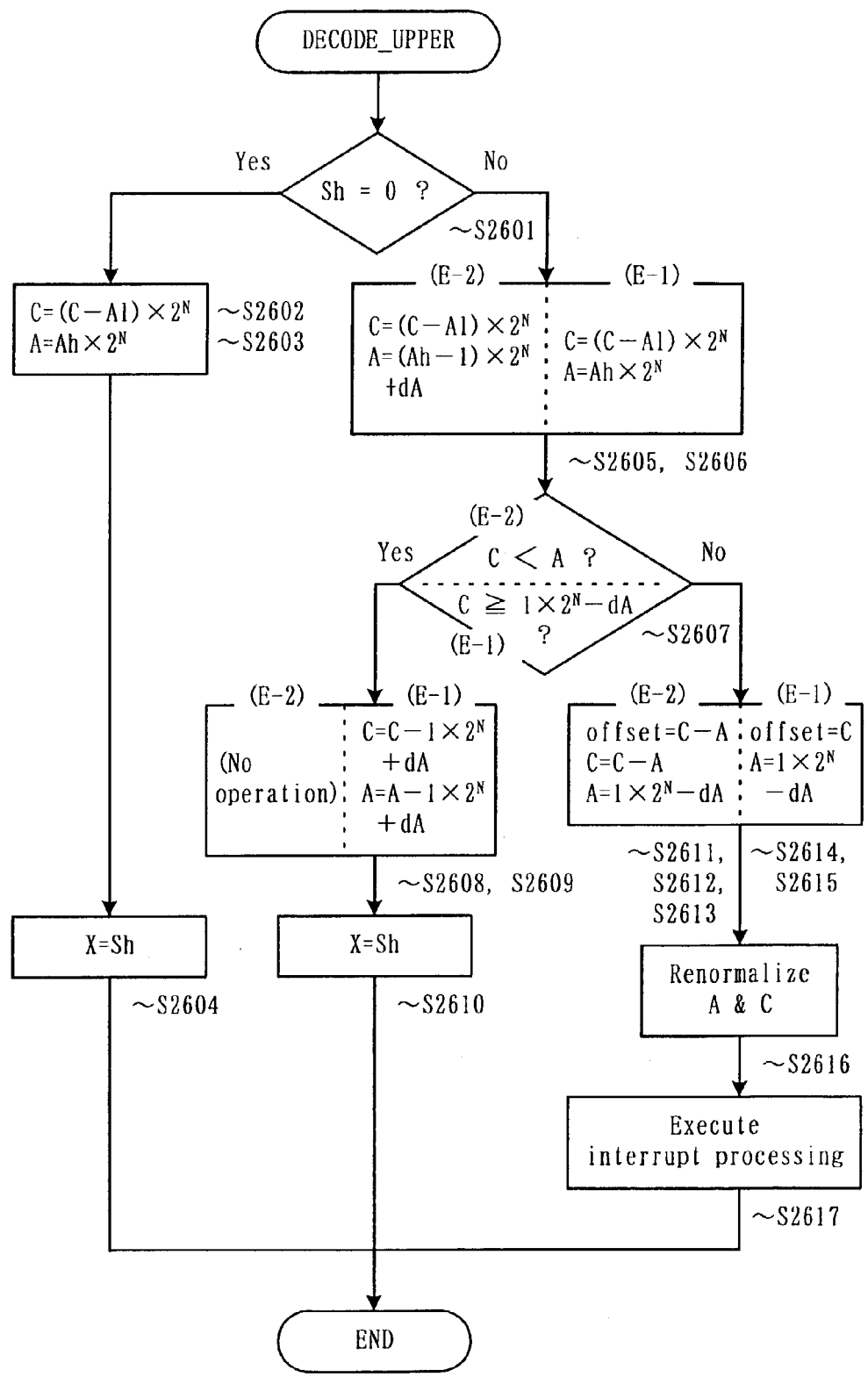
FIG. 21 shows DECODE_UPPER processing.

In the decoding process, as shown in DECODE procedure in FIG. 18, DECODE_LOWER procedure in FIG. 20, and DECODE_UPPER procedure in FIG. 21, the interval size A is updated to indication of the code value between the upper sub-interval or the lower sub-interval including the interval to be truncated, renormalized, and the interval size A to which the correction value is added and the code value C are compared. It is discriminated as notification of the interrupt when the code value is smaller than the interval size to be truncated if the correction is applied to the lower part in the interval and when the code value is larger than the interval size to which the correction is applied if the correction is applied to the upper part, and the displacement from the lower limit value of the interval to be truncated becomes the offset. When the interrupt is not required and the normal decoding is performed, the interval size to be truncated is subtracted from the interval size, and at the same time, the interval size to be truncated is also subtracted from the code value if the correction is applied to the lower part in the interval, and if the correction is applied to the upper part, to change the code value is unnecessary.

The kind of interrupt does not need to be notified by the offset if the number N of shifts for the renormalization is small, since it is difficult to have enough size of the interval to be truncated. In such a case, for example, only notification of the fact that the interrupt processing is required is transferred, and subsequently, bits of enough number to specify the kind of interrupt processing are plugged into the code, or notified by encoding bit by bit. In case of encoding the value showing the kind of interrupt, the normal encoding can be done, or the value can be encoded, for example, based on the LSZ interval which is representative value of the probability ½ and its non-LSZ interval, and based on two A/2 intervals after equally dividing the interval A. In another way, the combined notification method can be applied judging from the number N of shifts for the renormalization; that is, the value showing the kind of interrupt processing is encoded only when enough size of the predetermined offset value cannot be secured within the interval to be truncated, and if enough size can be secured within the interval to be truncated, the kind of interrupt processing is notified using the offset value.

As has been described, according to the present invention, in the subtraction-based arithmetic coding and the subtraction-based arithmetic decoding, the encoding efficiency is increased by compensating the representing precision (effective precision) of the probability, which is truncated when the constant assigned as one sub-interval size is renormalized. The concept of this precision compensation is explained above, however, the foregoing encoding procedure and the decoding procedure are one of examples, another equivalent operation procedure/representation can be employed to update the interval and the code, and the foregoing description does not essentially relate to the present invention. Further, carry control or borrow control which is usually performed in the arithmetic coding and the arithmetic decoding belongs to an implementation problem, and such problem does not essentially relate to the present invention.

In the above description of the present invention, the binary arithmetic code is used for the correction process after the renormalization, however, the multiple value arithmetic code can be also used.

Further, according to the present invention, the termination of decoding can be notified by setting the code value within the minute interval to which the code is never assigned and is truncated after the correction for compensating the precision in the normal encoding/decoding.

In the foregoing explanation, various kinds of processing can be performed by synchronizing between the encoding process and the decoding process using the interrupt. The present embodiment can be applied to implementation of various notification of information such as termination of the code which has been notified by a marker segment inserted within the code according to the conventional arithmetic coding. For example, in the conventional method of the International Standard Encoding Recommendation T.82, a marker segment of 2 bytes (and its concrete information, if necessary) should be inserted to show the kind of notification. According to the present embodiment, additional data amount required for the interrupt processing can be less than 2 bytes to show the kind of notification, and further, there may be a case that the concrete information can be also included and notified at the same time. Further, if the marker segment becomes unnecessary, additional control becomes also unnecessary such as inserting a bit or byte so as to prevent the generation of the same value of the code with the marker segment. There is a possibility to employ a bit insertion (bit stuffing) as a notification of existence of carry-over to the upper digit which the code has been already output by the operation for the encoding process. However, the purpose of this bit insertion control to notify the existence of carry-over should be considered separately from the purpose of the insertion control to secure the marker segment. As another example of the interrupt according to the present embodiment, it is possible to notify that the carry-over to the upper digit occurs using the interrupt processing.

Embodiment 5.

The above encoding apparatus/decoding apparatus and the encoding method/decoding method can be implemented by a program which is executed by a general-purpose computer. Further, such program can be stored in a storage medium which is readable to the computer. The program stored in the storage medium is loaded into the computer and executed by the CPU (Central Processing Unit).

The above program makes the computer to execute the following operation. Hereinafter, a program for encoding a symbol is referred to as an encoding program, a program for decoding into a symbol is referred to as a decoding program, and the encoding and decoding programs will be explained.

The encoding program defines a interval size (A) and a limit value of interval (C), divides a set interval on a number line into sub-intervals, selects one of the sub-intervals corresponding to an occurred symbol, and updates the set interval by the selected sub-interval. The program further performs an encoding process by updating the interval size (A) and the limit value (C) with a limited precision based on the selected sub-interval to encode a coordinate within the sub-interval, whenever the symbol is encoded, namely, at each completion (end) of the encoding process of the symbol, the program makes the computer to perform a correction process to correct the interval size (A) and the limit value (C).

Further, the encoding program makes the computer perform the following processes:
(1) a probability learning process for learning an occurrence probability of symbol based on the occurrence status of symbol, and storing the learned occurrence probability in the storage area;
(2) a sub-interval computing process for obtaining a sub-interval size using the occurrence probability of the symbol leaned by the probability learning process and for computing a sub-interval limit value corresponding to the sub-interval size;
(3) a first renormalizing process for renormalizing the sub-interval size so as to keep the sub-interval size obtained by the sub-interval size computing process equal to or greater than a predetermined value;
(4) a second renormalizing process for renormalizing the sub-interval limit value using the same multiplication rate as one used in the first renormalizing process;
(5) a correction value computing process for computing a size correction value for correcting the sub-interval size and a limit correction value for correcting the sub-interval limit value;
(6) a interval correcting process for correcting the sub-interval size renormalized at the first renormalizing process using the size correction value computed at the correction value computing process and outputting the corrected sub-interval size as a interval size; and
(7) a interval limit value correcting process for correcting the subinterval limit value renormalized at the second renormalizing process using the limit correction value computed at the correction value computing process and outputting the corrected sub-interval limit value as the interval limit value.

The decoding program defines a interval size (A) and a interval limit value (C), divides a set interval set on a number line, selects a sub-interval including a code value, updates the interval size (A) and the interval limit value (C) with a limited precision to decode into a symbol. In the decoding process, whenever the code value is decoded into a symbol, namely, at each completion (finishing) of decoding the code value into the symbol, the program makes the computer perform a correction process for correcting the interval size (A) and the interval limit value (C).

Further, the decoding program makes the computer perform the following concrete processes:
(1) a sub-interval computing process for obtaining a sub-interval size using the occurrence probability of the symbol stored at the probability learning process and computing the sub-interval limit value corresponding to the sub-interval size;
(2) a first renormalizing process for renormalizing the sub-interval size so as to keep the sub-interval size computed at the interval computing process equal to or greater than a predetermined value;
(3) a second renormalizing process for renormalizing the sub-interval limit value using the same multiplication rate as one used in the first renormalizing process;
(4) a correction value computing process for computing a size correction value for correcting the sub-interval size and a limit correction value for correcting the sub-interval limit value;
(5) a interval correcting process for correcting the sub-interval size renormalized at the first renormalizing process using the size correction value computed at the correction value computing process and for outputting the corrected sub-interval size as the interval size;
(6) a interval correcting process for correcting the sub-interval size renormalized at the first renormalizing process using the size correction value computed at the correction value computing process and for outputting the corrected sub-interval size as the interval size; and
(7) a interval limit value correcting process for correcting the subinterval limit value renormalized at the second renormalizing process using the limit correction value computed at the correction value computing process and for outputting the corrected sub-interval limit value as the interval limit value.

Further, by performing the above processes within the encoding apparatus/decoding apparatus, executing the encoding method/decoding method, or making the computer execute the encoding program/decoding program, the code data is generated with the interval size and the interval limit value corrected whenever the symbol is encoded/decoded.

As for the implementation of the functions of apparatuses in relation to the present embodiment, it is not limited to implementation by programs for the functions according to the first through fourth embodiments, and another implementation can be performed: implementation by combining hardware in which a part of the functions of the apparatus is implemented by the program and software; and implementation by combining a system LSI incorporating all or a part of the functions into the CPU and middleware including library software for controlling the functions in the system LSI and the other functions.

Embodiment 6.

Utilization of the code data handled in the encoding apparatus/decoding apparatus and the encoding method/decoding method can be applied to transmission of the data or the storage of the data. Further, the application to the data transmission can be done regardless of the transmission channel of wireless/wired, the transmission system such as analog/digital, modulated/demodulated, or multiplexed, the transmission rate, the connection protocol, or the interface. Further, the application to the data storage can be done regardless of the form such as a semiconductor, a storage medium, a chip, a card, or a disk which is read only or rewritable, the mounting form such as fixed, movable, or removable, the recording system such as electric, magnetic, or optical, the recording density, or the storage capacity.

In the encoding apparatus, method and the decoding apparatus, method according to the present invention, the correction value is computed, and the interval size is corrected using the computed correction value, which enables to provide the encoding/decoding with a high precision.

Further, the sub-interval size is computed using the occurrence probability of symbol and the interval size, which enables to sequentially compute the sub-interval size and to obtain the sub-interval size corresponding to the interval size.

Further, the correction value is computed using the additional precision, which enables to provide the encoding/decoding with a high precision.

Further, by using the sub-interval table, the optimal sub-interval size can be obtained based on the occurrence probability of symbol out of plural candidates of the sub-interval size.

Further, by computing the sub-interval size using the smaller value between the occurrence probabilities of symbol, the sub-interval size can be obtained with reflecting the smaller value of the occurrence probability of symbol.

By computing the correction value using the sub-interval size, the correction value adaptive to the sub-interval size which has obtained during the encoding/decoding process.

By computing the correction value using the smaller value between the obtained sub-interval sizes, the small interval can be corrected, which enables to provide the encoding/decoding with a higher precision.

Further, according to the first embodiment, the correction value is computed so as to reduce the sub-interval size, and by reducing the subinterval size, the precision of the encoding/decoding can be increased.

Further, according to the first embodiment, the correction value is computed so as to extend the sub-interval size, and by extending the subinterval size, the precision of the encoding/decoding can be increased.

By setting the minute interval which is not included in the subinterval, the minute correction can be performed.

By utilizing the minute interval for the interrupt notification, the synchronization can be taken in the encoding/decoding process.

As for the interrupt processing, it is possible to notify a termination processing, an instruction to initialize the variable parameters, an instruction to switch the variable parameters, an instruction to switch the constant parameters, an instruction to detect error, etc.

It is possible to identify multiple interrupt processing by the minute interval.

Having thus described several particular embodiments of the present invention, various alterations, modifications, and improvements will readily occur to those skilled in the art. Such alterations, modifications, and improvements are intended to be part of this disclosure, and are intended to be within the spirit and scope of the present invention. Accordingly, the foregoing description is by way of example only, and is not intended to be limiting. The present invention is limited only as defined in the following claims and the equivalents thereto.

What is claimed is:

1. An encoding apparatus for storing an interval size and an interval limit value, dividing an interval set on a number line, selecting a sub-interval corresponding to an occurring symbol, updating the interval to the sub-interval selected, and based on the sub-interval selected, updating the interval size and the interval limit value with a limited precision, and encoding a coordinate within the interval, comprising:
   a probability learning unit for learning occurrence probability of a symbol and storing an occurrence probability of the symbol learned in a storage area;
   a sub-interval computing unit for obtaining a sub-interval size using the occurrence probability of the symbol stored at the probability learning unit, and for computing a sub-interval limit value corresponding to the sub-interval size;
   a first renormalizing unit for renormalizing the sub-interval size so that the sub-interval size obtained at the sub-interval computing unit is equal to or greater than a predetermined value;
   a second renormalizing unit for renormalizina the sub-interval limit value with a same expansion rate as one used at the first renormalizing unit;
   a correction value computing unit for computing a size correction value which corrects the sub-interval size and a limit correction value which corrects the sub-interval limit value;
   an interval correcting unit for correcting the sub-interval size renormalized at the first renormalizing unit using the size correction value computed at the correction value computing unit and outputting the sub-interval size corrected as the interval size; and
   an interval limit value correcting unit for correcting the sub-interval limit value renormalized at the second renormalizing unit using the limit correction value computed at the correction value computing unit and outputting the sub-interval limit value corrected as the interval limit value; and
   wherein the interval size and the interval limit value are corrected whenever the symbol is encoded;
   wherein the limited precision used for computing the interval size of the set interval is defined as a previous managing precision and the limited precision used for computing the sub-interval size is defined as a current managing precision,
   wherein the sub-interval computing unit sets the current managing precision higher than the previous managing precision and obtains the sub-interval size by computing a product of the interval size of the set interval and the occurrence probability of the symbol based on the current managing precision set, and
   wherein the correction value computing unit computes a difference between the previous managing precision and the current managing precision as an additional precision and computes the size correction value and the limit correction value based on the additional precision computed.

2. An encoding apparatus for storing an interval size and an interval limit value, dividing an interval set on a number line, selecting a sub-interval corresponding to an occurring symbol, updating the interval to the sub-interval selected, and based on the sub-interval selected, updating the interval size and the interval limit value with a limited precision, and encoding a coordinate within the interval, comprising:
   a probability learning unit for learning occurrence probability of a symbol and storing an occurrence probability of the symbol learned in a storage area;
   a sub-interval computing unit for obtaining a sub-interval size using the occurrence probability of the symbol stored at the probability learning unit, and for computing a sub-interval limit value corresponding to the sub-interval size;

a first renormalizing unit for renormalizing the sub-interval size so that the sub-interval size obtained at the sub-interval computing unit is ecual to or greater than a predetermined value;

a second renormalizing unit for renormalizing the sub-interval limit value with a same expansion rate as one used at the first renormalizing unit;

a correction value computing unit for computing a size correction value which corrects the sub-interval size and a limit correction value which corrects the sub-interval limit value;

an interval correcting unit for correcting the sub-interval size renormalized at the first renormalizing unit using the size correction value computed at the correction value computing unit and outputting the sub-interval size corrected as the interval size; and an interval limit value correcting unit for correcting the sub-interval limit value renormalized at the second renormalizing unit using the limit correction value computed at the correction value computing unit and outputting the sub-interval limit value corrected as the interval limit value; and wherein the interval size and the interval limit value are corrected whenever the symbol is encoded;

wherein the limited precision used for computing the interval size of the set interval is defined as a previous managing precision and the limited precision used for computing the sub-interval size is defined as a current managing precision;

the encoding apparatus further comprising a sub-interval table for holding plural sub-interval sizes computed with the current managing precision which is set higher than the previous managing precision with relating to plural occurrence probabilities of the symbol;

wherein the sub-interval computing unit selects the sub-interval size from the sub-interval size table based on the occurrence probability of the symbol; and wherein the correction value computing unit computes a difference between the current managing precision and the previous managing precision as an additional precision and computes the size correction value and the limit correction value using the additional precision computed.

3. An encoding apparatus for storing an interval size and an interval limit value, dividing an interval set on a number line, selecting a sub-interval corresponding to an occurring symbol, updating the interval to the sub-interval selected, and based on the sub-interval selected, updating the interval size and the interval limit value with a limited precision, and encoding a coordinate within the interval, comprising:

a probability learning unit for learning occurrence probability of a symbol and storing an occurrence probability of the symbol learned in a storage area;

a sub-interval computing unit for obtaining a sub-interval size using the occurrence probability of the symbol stored at the probability learning unit, and for computing a sub-interval limit value corresponding to the sub-interval size;

a first renormalizing unit for renormalizing the sub-interval size so that the sub-interval size obtained at the sub-interval computing unit is ecual to or greater than a predetermined value;

a second renormalizing unit for renormalizing the sub-interval limit value with a same expansion rate as one used at the first renormalizing unit;

a correction value computing unit for computing a size correction value which corrects the sub-interval size and a limit correction value which corrects the sub-interval limit value;

an interval correcting unit for correcting the sub-interval size renormalized at the first renormalizing unit using the size correction value computed at the correction value computing unit and outputting the sub-interval size corrected as the interval size; and an interval limit value correcting unit for correcting the sub-interval limit value renormalized at the second renormalizing unit using the limit correction value computed at the correction value computing unit and outputting the sub-interval limit value corrected as the interval limit value; and wherein the interval size and the interval limit value are corrected whenever the symbol is wherein the sub-interval computing unit defines the sub-interval size as a first sub-interval size, computes a difference between the interval size of the set interval and the first sub-interval size as a second sub-interval size, and notifies of the sub-interval size which is smaller between the first sub-interval size and the second sub-interval size; and wherein the correction value computing unit inputs the sub-interval size notified by the sub-interval computing unit and a value of the symbol, and computes the size correction value and the limit correction value to correct the sub-interval limit value using the sub-interval size and the value of the symbol.

4. An encoding apparatus for storing an interval size and an interval limit value, dividing an interval set on a number line, selecting a sub-interval corresponding to an occurring symbol, updating the interval to the sub-interval selected, and based on the sub-interval selected, updating the interval size and the interval limit value with a limited precision, and encoding a coordinate within the interval, comprising:

a probability learning unit for learning occurrence probability of a symbol and storing an occurrence probability of the symbol learned in a storage area;

a sub-interval computing unit for obtaining a sub-interval size using the occurrence probability of the symbol stored at the probability learning unit, and for computing a sub-interval limit value corresponding to the sub-interval size;

a first renormalizing unit for renormalizing the sub-interval size so that the sub-interval size obtained at the sub-interval computing unit is equal to or greater than a predetermined value;

a second renormalizing unit for renormalizing the sub-interval limit value with a same expansion rate as one used at the first renormalizing unit;

a correction value computing unit for computing a size correction value which corrects the sub-interval size and a limit correction value which corrects the sub-interval limit value;

an interval correcting unit for correcting the sub-interval size renormalized at the first renormalizing unit using the size correction value computed at the correction value computing unit and outputting the sub-interval size corrected as the interval size; and an interval limit value correcting unit for correcting the sub-interval limit value renormalized at the second renormalizing unit using the limit correction value computed at the correction value computing unit and outputting the sub-interval limit value corrected as the interval limit value; and wherein the interval size and the interval limit value are corrected whenever the symbol is encoded;

wherein the sub-interval computing unit divides the interval size into at least two sub-interval sizes; and wherein the correction value computing unit secures a minute interval which is not assigned to any of the at least two sub-intervals, and truncates the minute interval secured.

5. The encoding apparatus of claim 4, wherein the minute interval is assigned a code value and used for notifying of a synchronous timing for an interrupt processing.

6. The encoding apparatus of claim 4, wherein the minute interval is assigned a code value forcibly, used for notifying of a synchronous timing for an interrupt processing, and used for identifying plural interrupt processing by an offset of the code value.

7. An decoding apparatus for storing an interval size and an interval limit value, dividing an interval set on a number line, selecting a sub-interval including a code value, updating the interval size and the interval limit value with a limited precision, and decoding the code value into a symbol, comprising:

a probability learning unit for learning an occurrence probability of a symbol decoded from a code value and storing the occurrence probability of the symbol learned in a storage area;

a sub-interval computing unit for obtaining a sub-interval size using the occurrence probability of the symbol stored at the probability learning unit, and for computing a sub-interval limit value corresponding to the sub-interval size;

a first renormalizing unit for renormalizing the sub-interval size so that the sub-interval size obtained at the sub-interval computing unit is equal to or greater than a predetermined value;

a second renormalizing unit for renormalizing the sub-interval limit value with a same expansion rate as one used at the first renormalizing unit;

a correction value computing unit for computing a size correction value which corrects the sub-interval size and a limit correction value which corrects the sub-interval limit value;

an interval correcting unit for correcting the sub-interval size renormalized at the first renormalizing unit using the size correction value computed at the correction value computing unit and outputting the sub-interval size corrected as the interval size; and an interval limit value correcting unit for correcting the sub-interval limit value renormalized at the second renormalizing unit using the limit correction value computed at the correction value computing unit and outputting the sub-interval limit value corrected as the interval limit value; and wherein the interval size and the interval limit value are corrected whenever the code value is decoded;

wherein the limited precision used for computing the interval size of the set interval is defined as a previous managing precision and the limited precision used for computing the sub-interval size is defined as a current managing precision;

wherein the sub-interval computing unit sets the current managing precision higher than the previous managing precision and obtains the sub-interval size by computing a product of the interval size of the set interval and the occurrence probability of the symbol based on the current managing precision set; and wherein the correction value computing unit computes a difference between the previous managing precision and the current managing precision as an additional precision and computes the size correction value and the limit correction value based on the additional precision computed.

8. A decoding apparatuse for storing an interval size and an interval limit value, dividing an interval set on a number line, selecting a sub-interval including a code value, updating the interval size and the interval limit value with a limited precision, and decoding the code value into a symbol, comprising:

a probability learning unit for learning an occurrence probability of a symbol decoded from a code value and storing the occurrence probability of the symbol learned in a storage area;

a sub-interval computing unit for obtaining a sub-interval size using the occurrence probability of the symbol stored at the probability learning unit, and for computing a sub-interval limit value corresponding to the sub-interval size;

a first renormalizing unit for renormalizing the sub-interval size so that the sub-interval size obtained at the sub-interval computing unit is equal to or greater than a predetermined value;

a second renormalizing unit for renormalizing the sub-interval limit value with a same expansion rate as one used at the first renormalizing unit;

a correction value computing unit for computing a size correction value which corrects the sub-interval size and a limit correction value which corrects the sub-interval limit value;

an interval correcting unit for correcting the sub-interval size renormalized at the first renormalizing unit using the size correction value computed at the correction value computing unit and outputting the sub-interval size corrected as the interval size; and an interval limit value correcting unit for correcting the sub-interval limit value renormalized at the second renormalizing unit using the limit correction value computed at the correction value computing unit and outputting the sub-interval limit value corrected as the interval limit value; and wherein the interval size and the interval limit value are corrected whenever the code value is decoded;

wherein the limited precision used for computing the interval size of the set interval is defined as a previous managing precision and the limited precision used for computing the sub-interval size is defined as a current managing precision;

the decoding apparatus further comprising a sub-interval table for holding plural sub-interval sizes computed with the current managing precision which is set higher than the previous managing precision with relating to plural occurrence probabilities of the symbol;

wherein the sub-interval computing unit selects the sub-interval size from the sub-interval size table based on the occurrence probability of the symbol; and wherein the correction value computing unit computes a difference between the current managing precision and the previous managing precision as an additional precision and computes the size correction value and the limit correction value using the additional precision computed.

9. A decoding apparatus for storing an interval size and an interval limit value, dividing an interval set on a number line, selecting a sub-interval including a code value, updating the interval size and the interval limit value with a limited precision, and decoding the code value into a symbol, comprising:
- a probability learning unit for learning an occurrence probability of a symbol decoded from a code value and storing the occurrence probability of the symbol learned in a storage area;
- a sub-interval computing unit for obtaining a sub-interval size using the occurrence probability of the symbol stored at the probability learning unit, and for computing a sub-interval limit value corresponding to the sub-interval size;
- a first renormalizing unit for renormalizing the sub-interval size so that the sub-interval size obtained at the sub-interval computing unit is eciual to or greater than a predetermined value;
- a second renormalizing unit for renormalizing the sub-interval limit value with a same expansion rate as one used at the first renormalizing unit;
- a correction value computing unit for computing a size correction value which corrects the sub-interval size and a limit correction value which corrects the sub-interval limit value;
- an interval correcting unit for correcting the sub-interval size renormalized at the first renormalizing unit using the size correction value computed at the correction value computing unit and outputting the sub-interval size corrected as the interval size; and
- an interval limit value correcting unit for correcting the sub-interval limit value renormalized at the second renormalizing unit using the limit correction value computed at the correction value computing unit and outputting the sub-interval limit value corrected as the interval limit value; and
- wherein the interval size and the interval limit value are corrected whenever the code value is decoded;
- wherein the sub-interval computing unit defines the sub-interval size as a first sub-interval size, computes a difference between the interval size of the set interval and the first sub-interval size as a second sub-interval size, and notifies of the sub-interval size which is smaller between the first sub-interval size and the second sub-interval size; and
- wherein the correction value computing unit inputs the sub-interval size notified by the sub-interval computing unit and a value of the symbol, and computes the size correction value and the limit correction value to correct the sub-interval limit value using the sub-interval size and the value of the symbol.

10. A decoding apparatuse for storing an interval size and an interval limit value, dividing an interval set on a number line, selecting a sub-interval including a code value, updating the interval size and the interval limit value with a limited precision, and decoding the code value into a symbol, comprising:
- a probability learning unit for learning an occurrence probability of a symbol decoded from a code value and storing the occurrence probability of the symbol learned in a storage area;
- a sub-interval computing unit for obtaining a sub-interval size using the occurrence probability of the symbol stored at the probability learning unit, and for computing a sub-interval limit value corresponding to the sub-interval size;
- a first renormalizing unit for renormalizing the sub-interval size so that the sub-interval size obtained at the sub-interval computing unit is eciual to or greater than a predetermined value;
- a second renormalizing unit for renormalizing the sub-interval limit value with a same expansion rate as one used at the first renormalizing unit;
- a correction value computing unit for computing a size correction value which corrects the sub-interval size and a limit correction value which corrects the sub-interval limit value;
- an interval correcting unit for correcting the sub-interval size renormalized at the first renormalizing unit using the size correction value computed at the correction value computing unit and outputting the sub-interval size corrected as the interval size; and
- an interval limit value correcting unit for correcting the sub-interval limit value renormalized at the second renormalizing unit using the limit correction value computed at the correction value computing unit and outputting the sub-interval limit value corrected as the interval limit value; and
- wherein the interval size and the interval limit value are corrected whenever the code value is decoded;
- wherein the sub-interval computing unit divides the interval size into at least two sub-interval sizes; and
- wherein the correction value computing unit secures a minute interval which is not assigned to any of the at least two sub-intervals and truncates the minute interval secured.

11. The decoding apparatus of claim 10, wherein the minute interval is assigned a code value and used for notifying of a synchronous timing for an interrupt processing.

12. The decoding apparatus of claim 10, wherein the minute interval is assigned a code value forcibly, used for notifying of a synchronous timing for an interrupt processing, and used for identifying plural interrupt processing by an offset of the code value.

* * * * *